(12) United States Patent
Jacobson et al.

(10) Patent No.: US 10,190,792 B2
(45) Date of Patent: Jan. 29, 2019

(54) THREE-DIMENSIONAL BUILDING MANAGEMENT SYSTEM VISUALIZATION

(71) Applicant: Crestron Electronics, Inc., Rockleigh, NJ (US)

(72) Inventors: Doug Jacobson, Oradell, NJ (US); Michael Martinez, Stony Point, NY (US); Boris Rabkin, Fort Lee, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 478 days.

(21) Appl. No.: 15/139,769

(22) Filed: Apr. 27, 2016

(65) Prior Publication Data

US 2017/0314803 A1    Nov. 2, 2017

Related U.S. Application Data

(63) Continuation of application No. 15/139,742, filed on Apr. 27, 2016, which is a continuation of application No. 15/139,706, filed on Apr. 27, 2016.

(51) Int. Cl.
*G06F 3/048* (2013.01)
*F24F 11/30* (2018.01)
(Continued)

(52) U.S. Cl.
CPC .............. *F24F 11/30* (2018.01); *F24F 11/52* (2018.01); *G05B 15/02* (2013.01); *G06F 3/048* (2013.01);
(Continued)

(58) Field of Classification Search
CPC ........ G06F 3/0484; G06T 15/00; G06Q 10/20
(Continued)

(56) References Cited

U.S. PATENT DOCUMENTS 5,061,916 A   10/1991  French et al.
5,086,385 A    2/1992  Launey et al.
(Continued)

OTHER PUBLICATIONS

Yoosef Asen, Building Information Modeling Based Integration and Visualization for Facilities Management, Concordia University, Jun. 2012, available at spectrum.library.concordia.ca/974104/1/Asen_MASc_F2012.pdf.
(Continued)

*Primary Examiner* — Andrey Belousov
(74) *Attorney, Agent, or Firm* — Crestron Electronics, Inc

(57) ABSTRACT

Systems, methods, and modes for rendering a three-dimensional building management system visualization of a building. The method and system components may be configured for storing geometry elements defining three-dimensional geometrical representation of a building's structure, storing spatial elements defining three-dimensional representation of spaces in the building, wherein the geometry elements are mapped to spatial elements, wherein the spatial elements are associated with respective space nodes that identify the spaces located within the building, and wherein the space nodes are associated with respective electronic devices installed within the spaces in the building. The method and system components may be further configured for receiving a selection of a status-attribute view from a list of status-attribute views, storing coloring logic defining color codes for status levels for each status-attribute view, receiving status information of at least one electronic device, applying colors to spatial elements associated with respective space nodes based on the received status information and coloring logic, and rendering a three dimensional building visualization of the building for the selected status-attribute view via a user interface.

38 Claims, 25 Drawing Sheets

(51) Int. Cl.
*F24F 11/52* (2018.01)
*G05B 15/02* (2006.01)
*G06F 3/0481* (2013.01)
*G06F 3/0482* (2013.01)
*G06F 3/0484* (2013.01)
*G06F 17/30* (2006.01)
*H04L 12/28* (2006.01)
*G06T 19/00* (2011.01)

(52) U.S. Cl.
CPC ........ *G06F 3/0482* (2013.01); *G06F 3/04815* (2013.01); *G06F 3/04842* (2013.01); *G06F 3/04847* (2013.01); *G06F 17/30572* (2013.01); *G06T 19/00* (2013.01); *G06T 19/003* (2013.01); *H04L 12/281* (2013.01); *H04L 12/2809* (2013.01); *H04L 12/2816* (2013.01); *G05B 2219/25011* (2013.01); *G05B 2219/2642* (2013.01); *G06T 2200/24* (2013.01)

(58) Field of Classification Search
USPC ..... 703/1; 705/305; 715/738, 757, 848, 850, 715/852, 853
See application file for complete search history.

(56) References Cited

U.S. PATENT DOCUMENTS

| | | | |
|---|---|---|---|
| 5,297,252 A | 3/1994 | Becker | |
| 6,118,230 A | 9/2000 | Fleischmann | |
| 6,157,943 A | 12/2000 | Meyer | |
| 6,756,998 B1 | 6/2004 | Bilger | |
| 6,792,319 B1 | 9/2004 | Bilger | |
| 6,909,921 B1 | 6/2005 | Bilger | |
| 6,912,429 B1 | 6/2005 | Bilger | |
| 7,567,844 B2 | 7/2009 | Thomas et al. | |
| 8,909,380 B2 | 12/2014 | Golding et al. | |
| 9,055,627 B2 | 6/2015 | Madonna et al. | |
| 9,891,791 B1* | 2/2018 | Khan | G06F 3/0484 |
| 2009/0307255 A1* | 12/2009 | Park | G06Q 10/10 |
| 2011/0047370 A1 | 2/2011 | Nagel et al. | |
| 2012/0323382 A1 | 12/2012 | Kamel et al. | |
| 2014/0089209 A1* | 3/2014 | Akcamete | G06Q 10/20 705/305 |
| 2014/0365181 A1* | 12/2014 | Cockburn | G06T 15/00 703/1 |

OTHER PUBLICATIONS

Viren Samdadia, Integration of 3 Dimensional Parametric Building Model with Geographic Information Systems in Educational Facilities Planning and Management, Worcester Polytechnic Institute, available at www.wpi.edu/Pubs/ETD/Available/etd-0608104-113001/unrestricted/samdadia.pdf.

buildingSMART, Industry Foundation Classes IFC4 Official Release, 5.4.3.45 IfcSpace, available at www.buildingsmart-tech.org/ifc/IFC4/final/html/schema/ifcproductextension/lexical/ifcspace.htm.

IFC Tools Project, APSTEX, available at www.ifctoolsproject.com/info.html.

* cited by examiner

THREE-DIMENSIONAL BUILDING MANAGEMENT SYSTEM VISUALIZATION

BACKGROUND OF THE INVENTION

Technical Field

Aspects of the embodiments relate to building management systems, and more specifically to systems, methods, and modes for rendering three-dimensional building visualization for commissioning, monitoring, and control of a building management system.

Background Art

Building management and automation is ever evolving to provide consumers with convenient and simple monitoring and control of various mechanical and electrical equipment within a building through building management systems (BMS), also known as building automation systems (BAS), and energy management systems (EMS). Building management systems provide comfort, convenience, simplicity and security, as well as lower energy costs. They generally utilize a network of sensor and control devices distributed throughout a residential or commercial building to control and provide information of the mechanical and electrical equipment within the building. The system can monitor and control heating, ventilation and air conditioning (HVAC), lighting, shading, security, appliances, door locks, and audiovisual (AV) equipment, among others, for every room in each facility.

Building management systems are implemented in buildings of varying degree of complexity. In large scale buildings there may be thousands of devices dispersed in hundreds of rooms. Building management systems utilize complicated software that displays dashboards, graphs, organization-trees, and grids of data representing building status to system users, such as building managers. Users can utilize this data to control devices on-demand, change scheduled events, as well as to change climate set points, lighting scenes, and shade levels for occupied and vacated states in one or more rooms. Often the presentation of this data may be confusing, difficult to interpret, and not intuitive to usefully inform the building manager of the building status. The standard grid view does not provide the user a visual sense of the correlation status among rooms that are neighboring or on the same floor. For example, building managers spend a considerable amount of time scheduling automated events of a building. Scheduling of events involves programming the behavior of each controllable device within a building for a particular period of time. For instance, fixtures in a commercial building are scheduled to operate differently during work hours and after work hours. The software to set up those schedules can be very confusing. Consequently, scheduling of events becomes a tedious process and prone to errors due to vast amount of data entry and inability to conveniently perceive and review the scheduled events.

The commissioning process of control systems is likewise a long and complicated process. This is especially true for lighting control systems in larger installations such as commercial facilities. Typically, after an installer has installed lights, shades, keypads, sensors, etc., throughout a facility, programmers can commission the system by associating devices together in groups, associating controllable devices with control points, setting presets and scenes and building rules. While there are some current solutions to simplify the commissioning process, these are inadequate. Any improvements that reduce cost, time, and mistakes is beneficial to users.

There is therefore a need for a system that intuitively displays vast amount of data in an easily interpretable way via a three-dimensional model. Viewing the building status in a three-dimensional model will not only show status of individual rooms, but users will be able to easily apprehend the status of the neighboring rooms, floors, and the entire building.

A number of discussions and attempts were made in developing a building management system that is visualized via a three-dimensional model. However, many such systems have not been fully enabled, implemented, or realized. This is largely due to the vast amount of data that needs to be interpreted and rendered. Such tools attempt to visually display vast amount of building modeling data, which may be complex, confusing, and difficult to interpret by users. Moreover, to handle the data, such systems generally require the end users to purchase proprietary software and hardware, which may be expensive and impractical. On the other hand, existing tools that allow rendering of a three-dimensional model through a browser still suffer from many setbacks. Importing and processing large three-dimensional model data files via such tools is time consuming, causing system latencies and freezing of the browser.

Accordingly, a need has arisen for rendering three-dimensional building visualization via a browser for commissioning, monitoring, and control of a building management system.

SUMMARY OF THE INVENTION

It is an object of the embodiments to substantially solve at least the problems and/or disadvantages discussed above, and to provide at least one or more of the advantages described below.

It is therefore a general aspect of the embodiments to provide systems, methods, and modes for rendering a three-dimensional building visualization for commissioning, monitoring, and control of a building management system.

It is also an aspect of the embodiments to provide systems, methods, and modes for rendering three-dimensional building visualization via a browser.

It is also an aspect of the embodiments to provide systems, methods, and modes for monitoring of a building management system via a three-dimensional building visualization that intuitively displays the building status via a three-dimensional model in an easily interpretable way.

It is further an object of the embodiments to provide systems, methods, and modes for commissioning of a building management system via a three-dimensional building visualization, which is more time and cost effective and which provide more effective means for system testing and troubleshooting.

It is also an object of the embodiments to provide systems, methods, and modes for scheduling automated events of a building and simulating the scheduled events via a three-dimensional building model.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

DISCLOSURE OF INVENTION

According to one aspect of the embodiments, a method is provided for rendering a three-dimensional building management system visualization of a building, the method comprising: (i) storing geometry elements and spatial elements, wherein the geometry elements define three-dimensional geometrical representation of a building's structure, wherein the spatial elements define three-dimensional representation of spaces in the building, wherein the geometry elements are mapped to spatial elements, wherein the spatial elements are associated with respective space nodes that identify the spaces located within the building, wherein the space nodes are associated with respective electronic devices installed within the spaces in the building; (ii) receiving a selection of a status-attribute view from a list of status-attribute views; (iii) storing logic for each status-attribute view, wherein the logic defines one or more object properties each corresponding to a status level and configured for modifying an appearance of a spatial element; (iv) receiving status information of at least one electronic device; (v) filtering the received status information to select a subset of status information that corresponds to the selected status-attribute view; (vi) determining status levels of respective space nodes based on the subset of status information; (vii) determining object properties that apply to the determined status levels using the logic; (viii) applying the determined object properties to respective spatial elements associated with the space nodes; and (ix) rendering a three dimensional building visualization of the building for the selected status-attribute view via a user interface.

According to some aspects of the embodiments, the user interface comprises a legend configured for defining for the user the status levels indicated by the rendered object properties. According to some aspects of the embodiments, the database is configured for storing a geometry data file comprising the geometry elements and a separate spatial data file comprising the spatial elements; and wherein the at least one processor is configured for selectively recalling the geometry data file and the spatial data file from the database.

According to some aspects of the embodiments, the one or more object properties may comprise at least one of the spatial element's fill, volume, face, outline, shadow, color, pattern, pattern color, transparency, outline thickness, outline pattern, or any combinations thereof. According so some aspects of the embodiments, a default object property may be applied to spatial elements for which status information of associated nodes is unknown, unavailable, or inapplicable. According so some aspects of the embodiments, the logic of at least one status-attribute view comprises a first object property that indicates a first status-attribute and a second object property that indicates a second status-attribute.

According to some aspects of the embodiments, the status information may comprise real-time status information received from the at least one electronic device. According to another aspect of the embodiments, the status information comprises historic status information received from a database. The user interface may comprise a time input field configured for allowing a user to select a time, wherein the historic status information is timestamped such that it can be recalled using the selected time. The selected time may comprise at least one of a particular date, a particular time, a date range, a time range, a time period, a day, a portion of a day, a week, a month, a year, or the like. According to some aspects of the embodiments, when the user chooses to review historic information for a time period, the status level is determined by determining average status levels of the space nodes occurring within the selected time period. According to another aspects of the embodiments, when the user chooses to review historic information for a time period, the method further comprising: displaying an animation of a historic state of the building that shows status levels of the space nodes throughout the selected time period.

According to some aspects of the embodiments, the list of status-attribute views may comprise an error alerts status-attribute view configured for indicating spaces with electronic devices reporting errors, wherein the error alerts status-attribute view comprises logic including a table that correlates colors to the type of error alerts and organizes error alerts by severity. According to another aspect of the embodiments, the list of status-attribute views comprises an online status-attribute view configured for indicating online status of electronic devices. According to another aspect of the embodiments, the list of status-attribute views comprises a help requests status-attribute view configured for indicating status of one or more help requests. According to another aspect of the embodiments, the list of status-attribute views comprises an occupancy status-attribute view configured for indicating occupancy status of the spaces in the building, wherein the occupancy status-attribute view comprises logic including a first object property indicating that a space is occupied, and a second object property indicating that a space is vacant. According to another aspect of the embodiments, the list of status-attribute views comprises a reserved spaces status-attribute view configured for indicating whether a space is reserved. The reserved spaces status-attribute view may comprise logic including a first object property indicating that a space is reserved, and a second object property indicating that a space is vacant. The reserved spaces status-attribute view logic may further comprise a third object property indicating that a space is unreserved and occupied, and a fourth object property indicating that a space is reserved and vacant.

According to another aspect of the embodiments, the list of status-attribute views comprises an electronic device on status-attribute view comprising logic including a first object property indicating that an electronic device is turned on and a second object property indicating that an electronic device is off. The electronic device on status-attribute view logic may further comprise a third object property configured for indicating that an electronic device in a occupied space is on, and a fourth object property configured for indicating that an electronic device in a vacant space is on. According to another aspect of the embodiments, the list of status-attribute views comprises an electronic device usage status-attribute view comprising logic including object properties indicating a duration the electronic device has been turned on. According to another aspect of the embodiments, list of status-attribute views may comprise a daylight level status-attribute view comprising logic including a color gradient configured for indicating a daylight level of a space. According to another aspect of the embodiments, the list of status-attribute views may comprise a daylight harvesting status-attribute view comprising logic including a color gradient configured for indicating how much energy is saved in a space due to daylight harvesting.

According to another aspect of the embodiments, the list of status-attribute views may comprise a light level status-attribute view comprising logic including a light level color gradient indicating in which spaces lights are turned on and an intensity of the turned on lights. The status information may comprise light level values of lighting loads associated with the space nodes, wherein the status level is determined for each space node by calculating a weighted light level average using the received light level values, wherein each position on the light level color gradient corresponds to a particular color and a percentage value, wherein the object property is determined by determining a color in the light level color gradient corresponding to the calculated weighted light level average. The light level color gradient may comprise a gradient of a single hue or color with luminosity or brightness ranging from dark to bright to indicate a light level percentage in a space.

According to another aspect of the embodiments, the list of status-attribute views may comprise a space utilization status-attribute view comprising logic including a color gradient configured for indicating a length of time a space is utilized. For each space node the status level is determined by: storing count of minutes a plurality of spaces in the building are utilized; and determining a percentage a space is utilized by comparing a utilization minutes count of the space to a total utilization minutes count of the plurality of spaces in the building.

According to some aspects of the embodiments, the method further comprises: creating at least one programmed scheduled event for the at least one electronic device comprising programming rules; receiving a selection of a fast forward view configured for providing a simulation of a programmed operational state of the building; wherein the received status information comprises the programming rules; wherein the determined status levels comprise programmed operational states of the space nodes. According to some aspects of the embodiments, the list of status-attribute views comprises a conflict status-attribute view configured for indicating any conflicts or errors in the programming rules of a space. According to some aspects of the embodiments, at least one object property in the fast forward view may be configured for displaying expected occupancy of a space during a selected period of time based on occupancy pattern recognition. According to some aspects of the embodiments, the user interface may comprise a time input field configured for allowing a user to select a time period, wherein the method further comprising: displaying an animation of a programmed operational state of at least one space node throughout the selected time period. According to some aspects of the embodiments, during the displayed animation the three dimensional building visualization may be re-rendered when a programmed operational state of the building changes by changing the object properties of the respective spatial elements. According to some aspects of the embodiments, the user interface may comprise a draggable time slider configured for allowing the user to navigate to a programmed operational state of the building during a particular time within the selected time period. The user interface may further comprise a previous time period selection which upon being selected configured to display an animation of a programmed operational state of at least one space node throughout a time period immediately preceding the selected time period. Additionally, the user interface may comprise a next time period selection which upon being selected configured to display an animation of a programmed operational state of at least one space node throughout a time period immediately succeeding the selected time period.

According to another aspect of the embodiments, a method is provided for rendering a three-dimensional building management system visualization of a building, the method comprising: (i) storing geometry elements and spatial elements, wherein the geometry elements define three-dimensional geometrical representation of a building's structure, wherein the spatial elements define three-dimensional representation of spaces in the building, wherein the geometry elements are mapped to spatial elements, wherein the spatial elements are associated with respective space nodes that identify the spaces located within the building, wherein the space nodes are associated with respective electronic devices installed within the spaces in the building; (ii) receiving a selection of a status-attribute view from a list of status-attribute views; (iii) storing coloring logic defining color codes for status levels for each status-attribute view in the list of status-attribute views; (iv) receiving status information of at least one electronic device; (v) applying colors to spatial elements associated with respective space nodes based on the received status information and coloring logic; and (vi) rendering a three dimensional building visualization of the building for the selected status-attribute view via a user interface.

According to another aspect of the embodiments, a method is provided for rendering a three-dimensional building management system visualization of a building, the method comprising: (i) storing geometry elements and spatial elements, wherein the geometry elements define three-dimensional geometrical representation of a building's structure, wherein the spatial elements define three-dimensional representation of spaces in the building, wherein the geometry elements are mapped to spatial elements, wherein the spatial elements are associated with respective space nodes that identify the spaces located within the building, wherein the space nodes are associated with respective electronic devices installed within the spaces in the building; (ii) creating at least one programmed scheduled event for at least one electronic device comprising programming rules; (iii) receiving a selection of a status-attribute view from a list of status-attribute views; (iv) storing logic for each status-attribute view, wherein the logic defines one or more object properties each corresponding to a status levels and configured for modifying an appearance of a spatial element; (v) filtering through the programming rules to select a subset of programming rules that correspond to the selected status-attribute view; (vi) determining programmed operational states of the space nodes based on the subset of programming rules; (vii) determining object properties that apply to the determined programmed operational states using the logic; (viii) applying the determined object properties to respective spatial elements associated with the space nodes; and (ix) rendering a three dimensional building visualization of the building for the selected status-attribute view via a user interface.

According to another aspect of the embodiments, a system is provided for rendering a three-dimensional building management system visualization of a building. The system comprises a database configured for storing geometry elements and spatial elements, wherein the geometry elements define three-dimensional geometrical representation of a building's structure, wherein the spatial elements define three-dimensional representation of spaces in the building, wherein the geometry elements are mapped to spatial elements, wherein the spatial elements are associated with respective space nodes that identify the spaces located within the building, wherein the space nodes are associated with respective electronic devices installed within the spaces in the building. The system further comprises at least one processor in communication with the one or more electronic devices comprising a memory encoding one or more processor-executable instructions, which when executed by the at least one processor, cause acts to be performed comprising: (i) receiving a selection of a status-attribute view from a list of status-attribute views; (ii) storing logic for each status-attribute view, wherein the logic defines one or more object properties each corresponding to a status levels and configured for modifying an appearance of a spatial element; (iii) receiving status information of at least one electronic device; (iv) filtering the received status information to select a subset of status information that corresponds to the selected status-attribute view; (v) determining status levels of respective space nodes based on the subset of status information; (vi) determining object properties that apply to the determined status level using the logic; (vii) applying the determined object properties to respective spatial elements associated with the space nodes; and (viii) rendering a three dimensional building visualization of the building for the selected status-attribute view via a user interface.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

BRIEF DESCRIPTION OF THE SEVERAL VIEWS OF THE DRAWING

Figure 1:
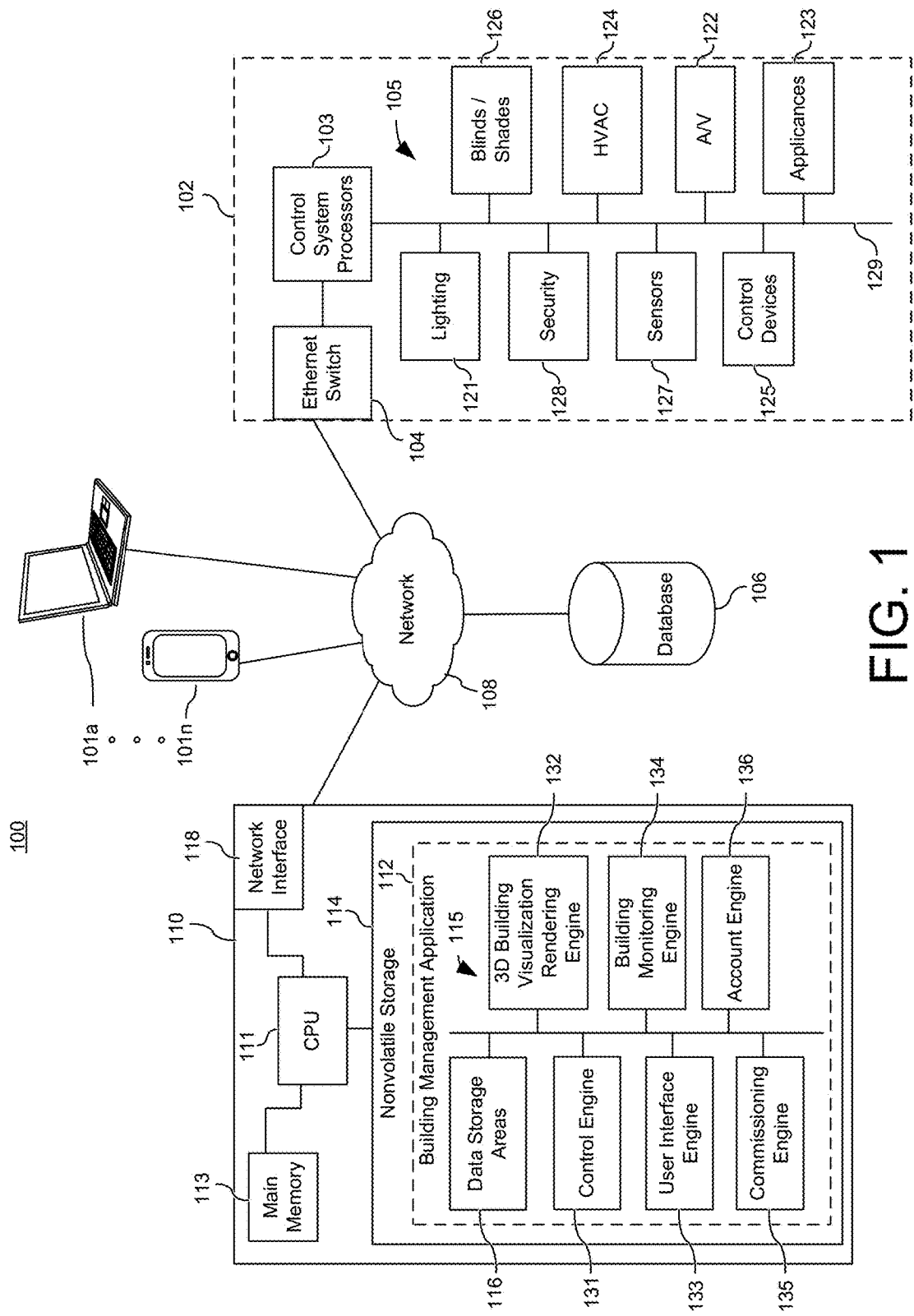
Figure 2:
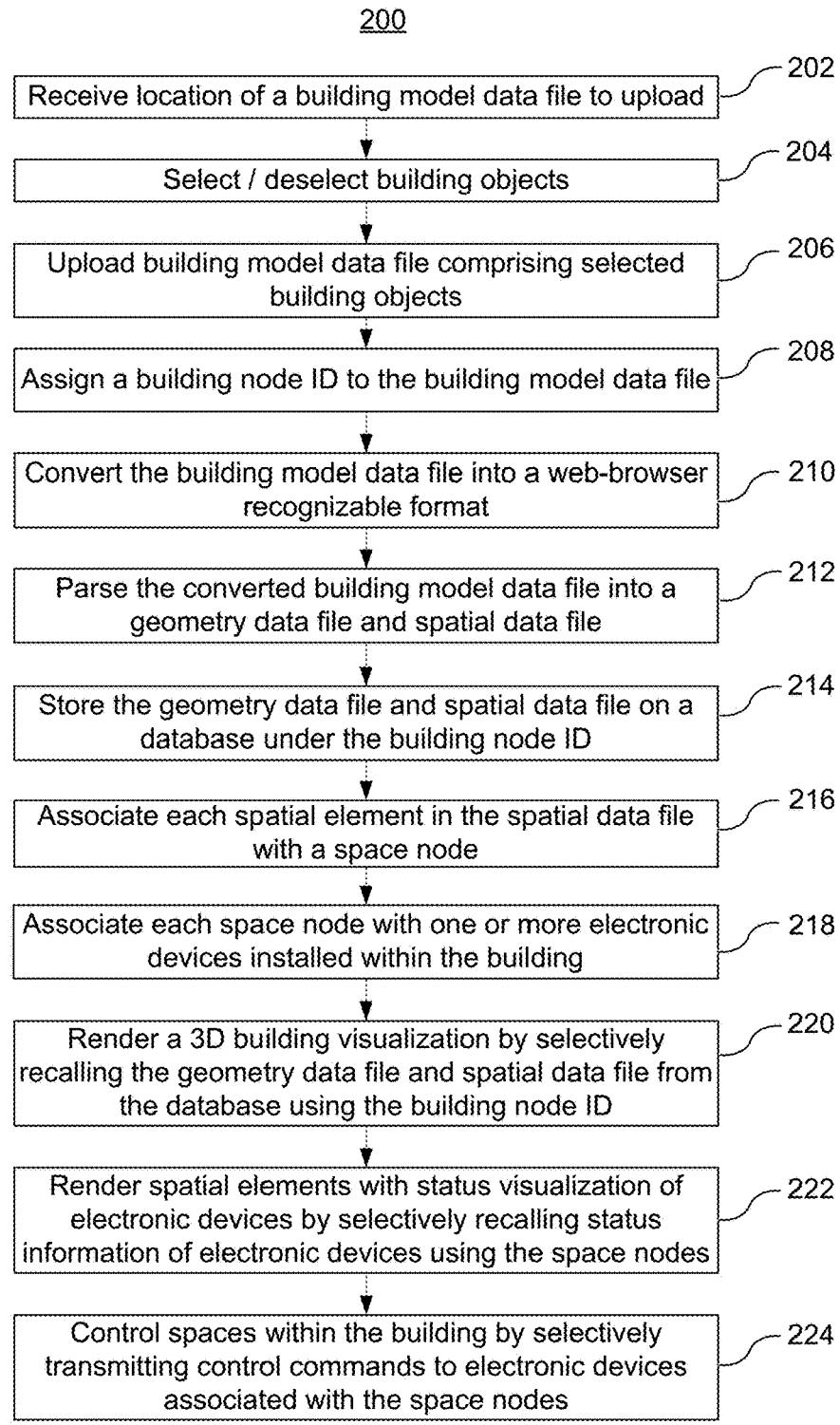
Figure 3:
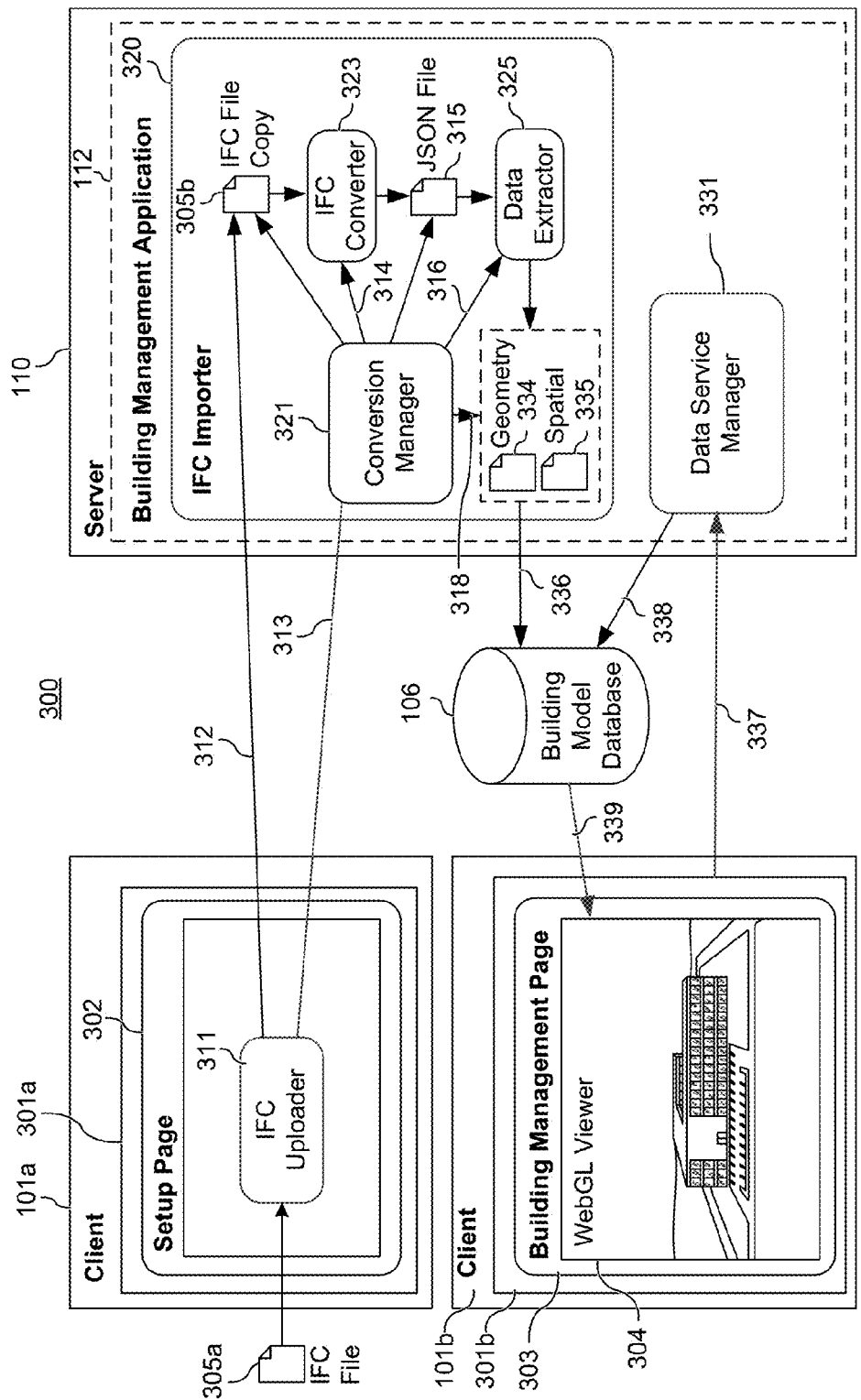
Figure 4:
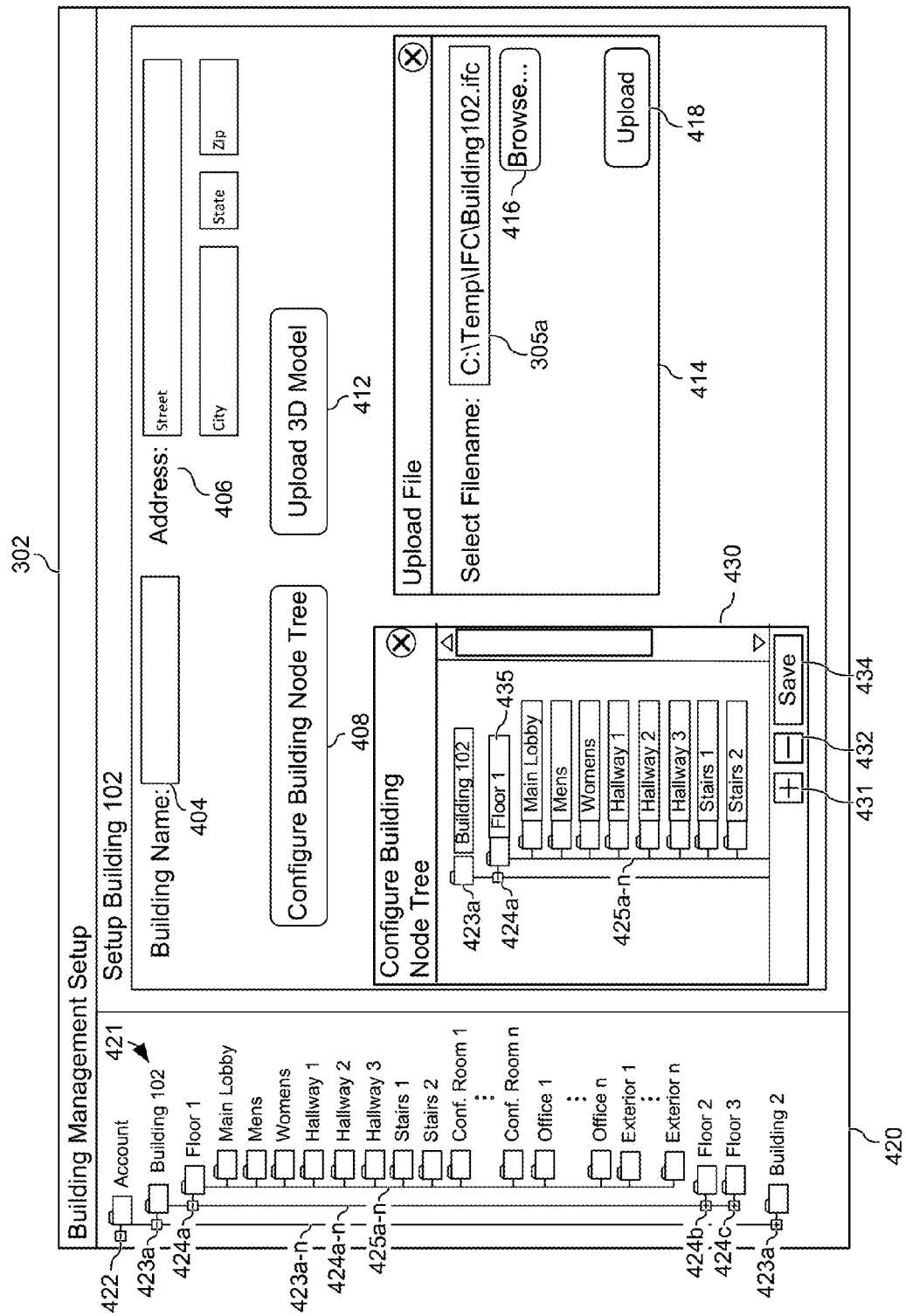
Figure 5:
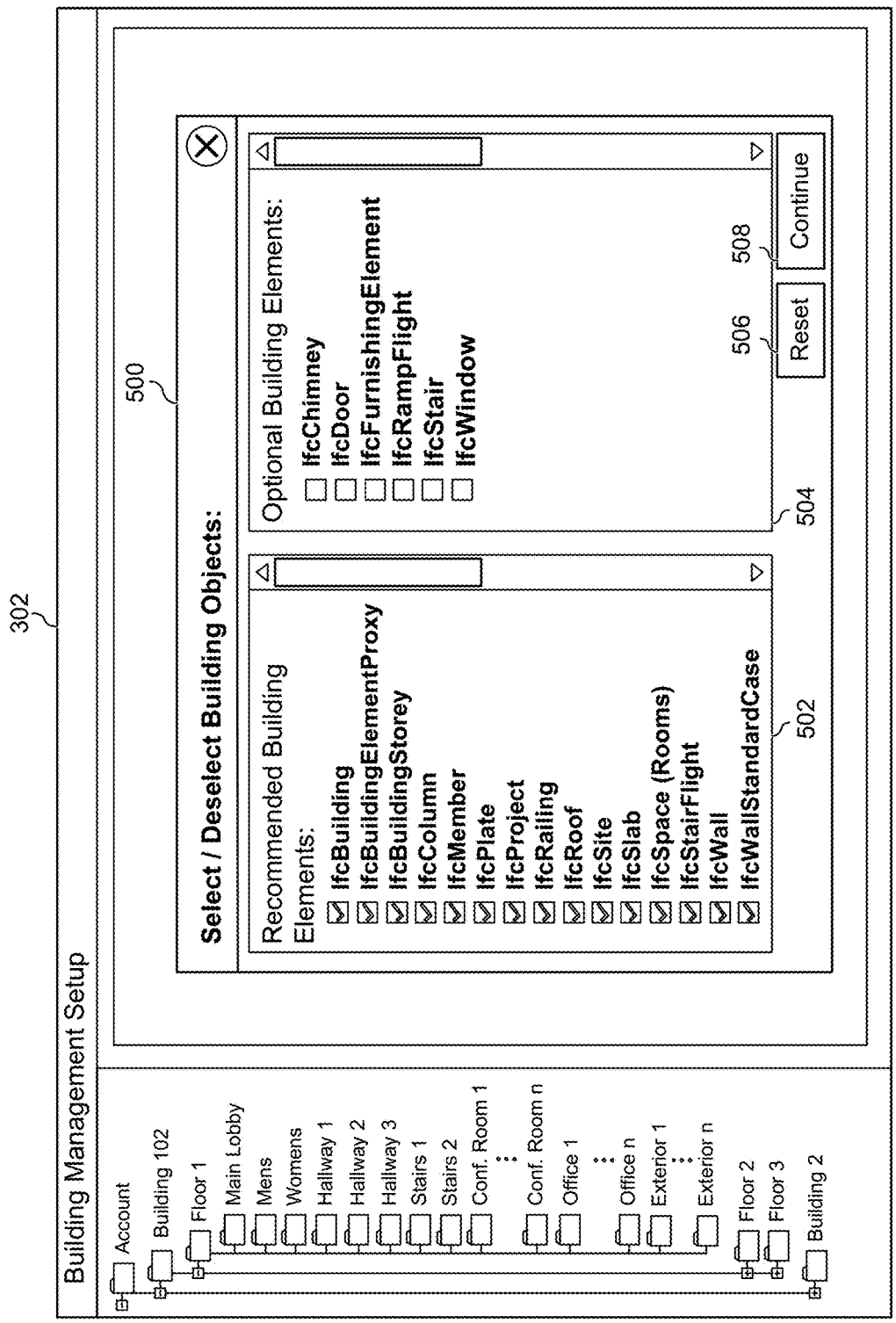
Figure 6:
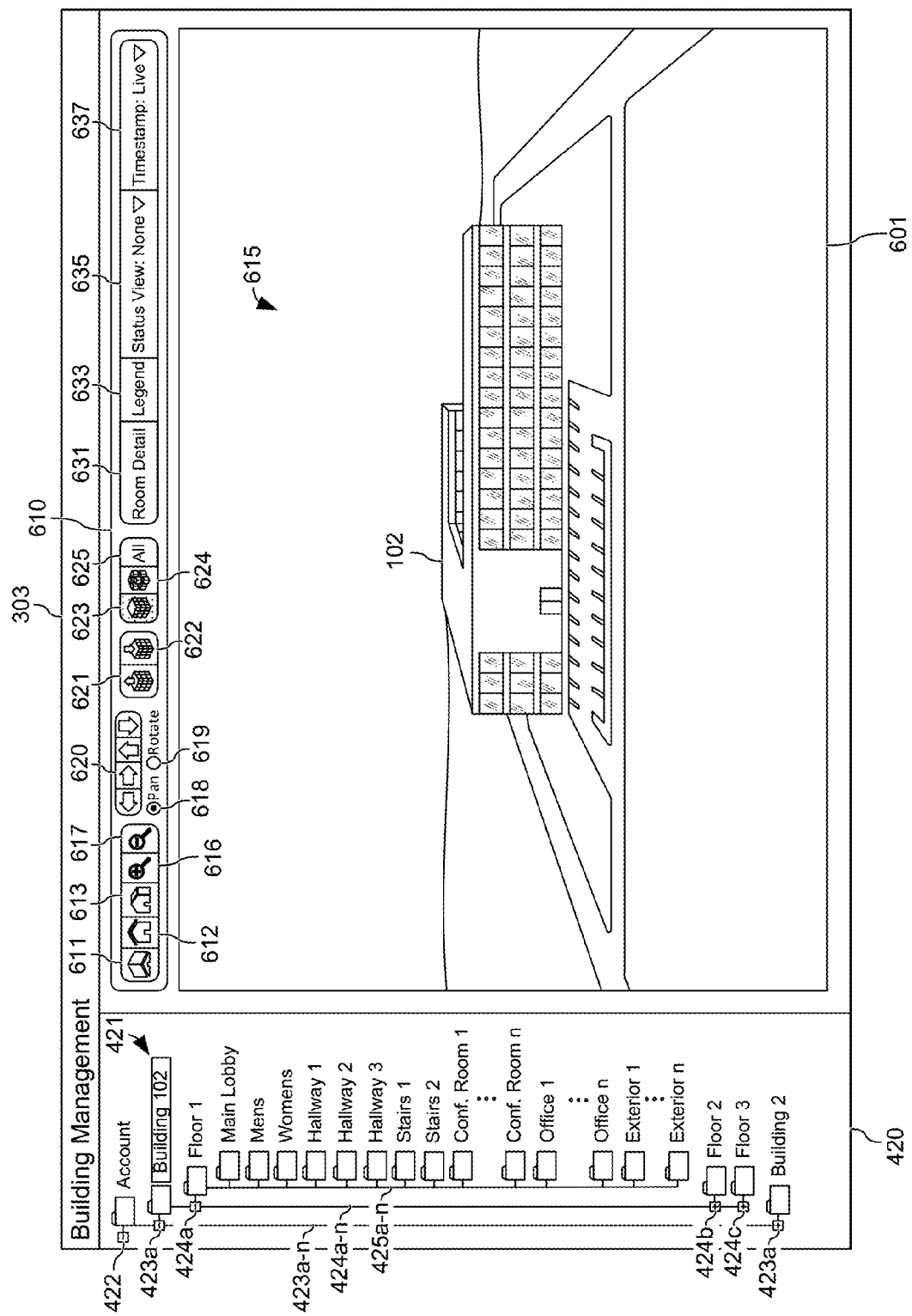
Figure 7:
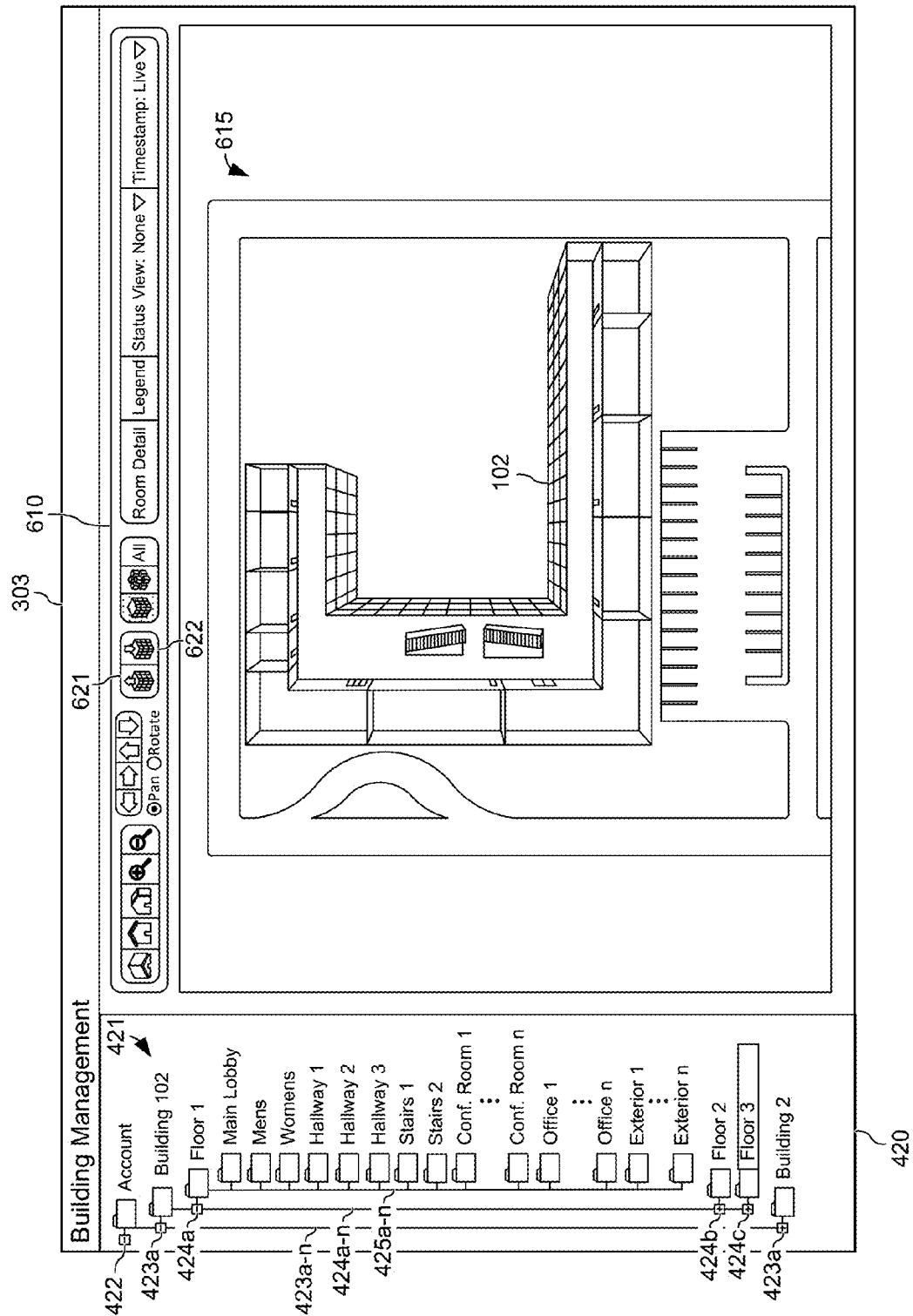
Figure 8:
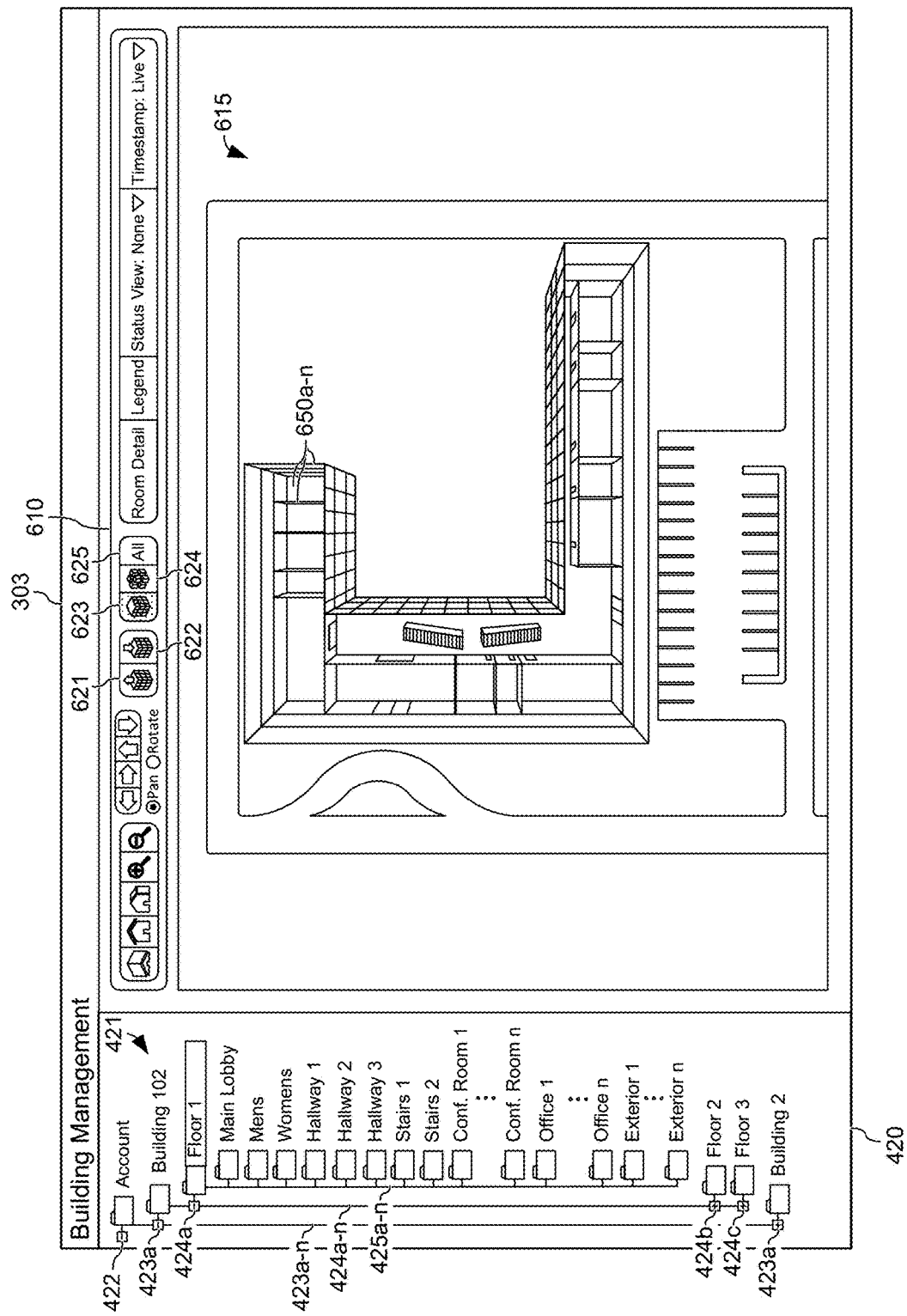
Figure 9:
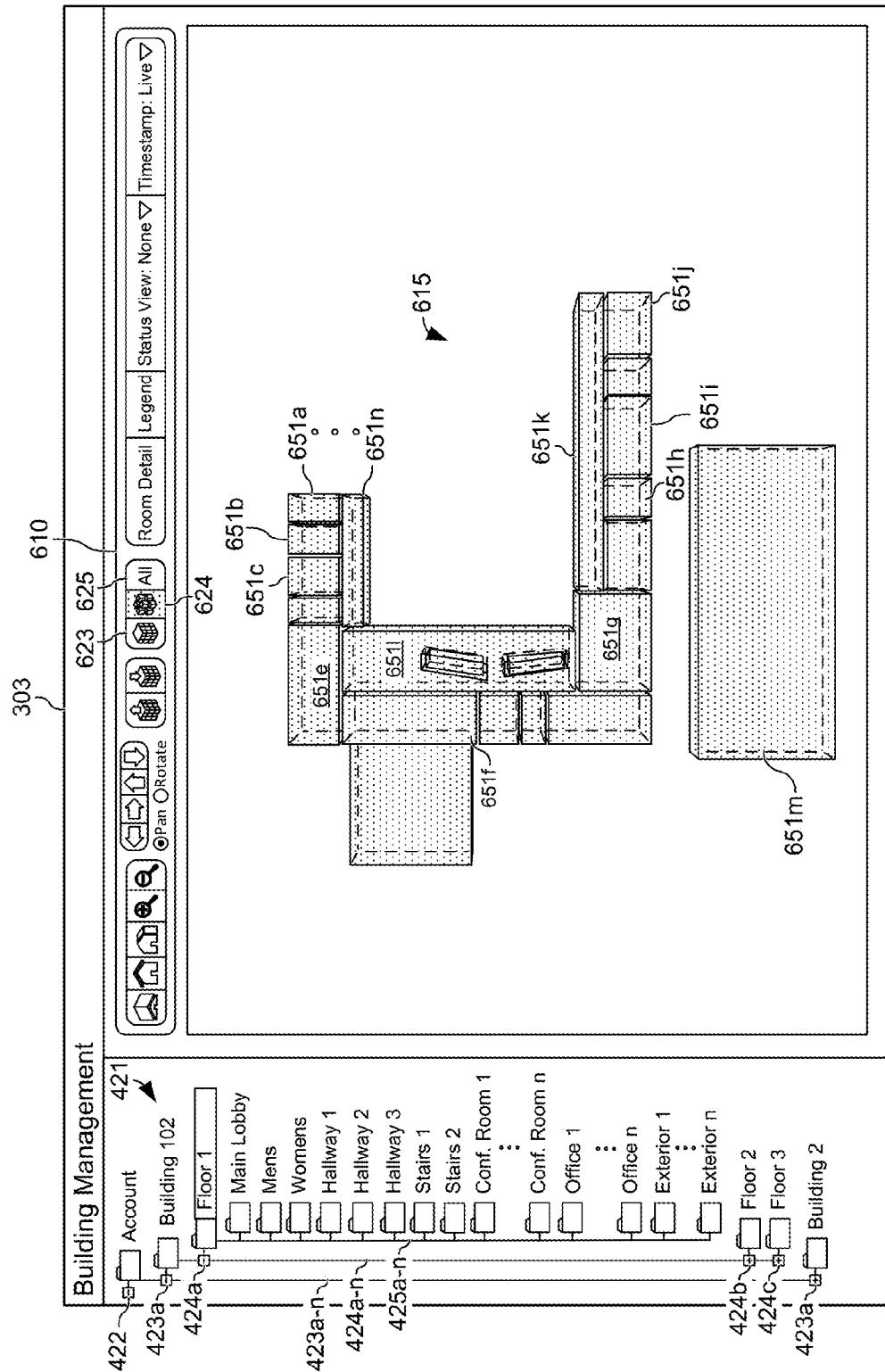
Figure 10:
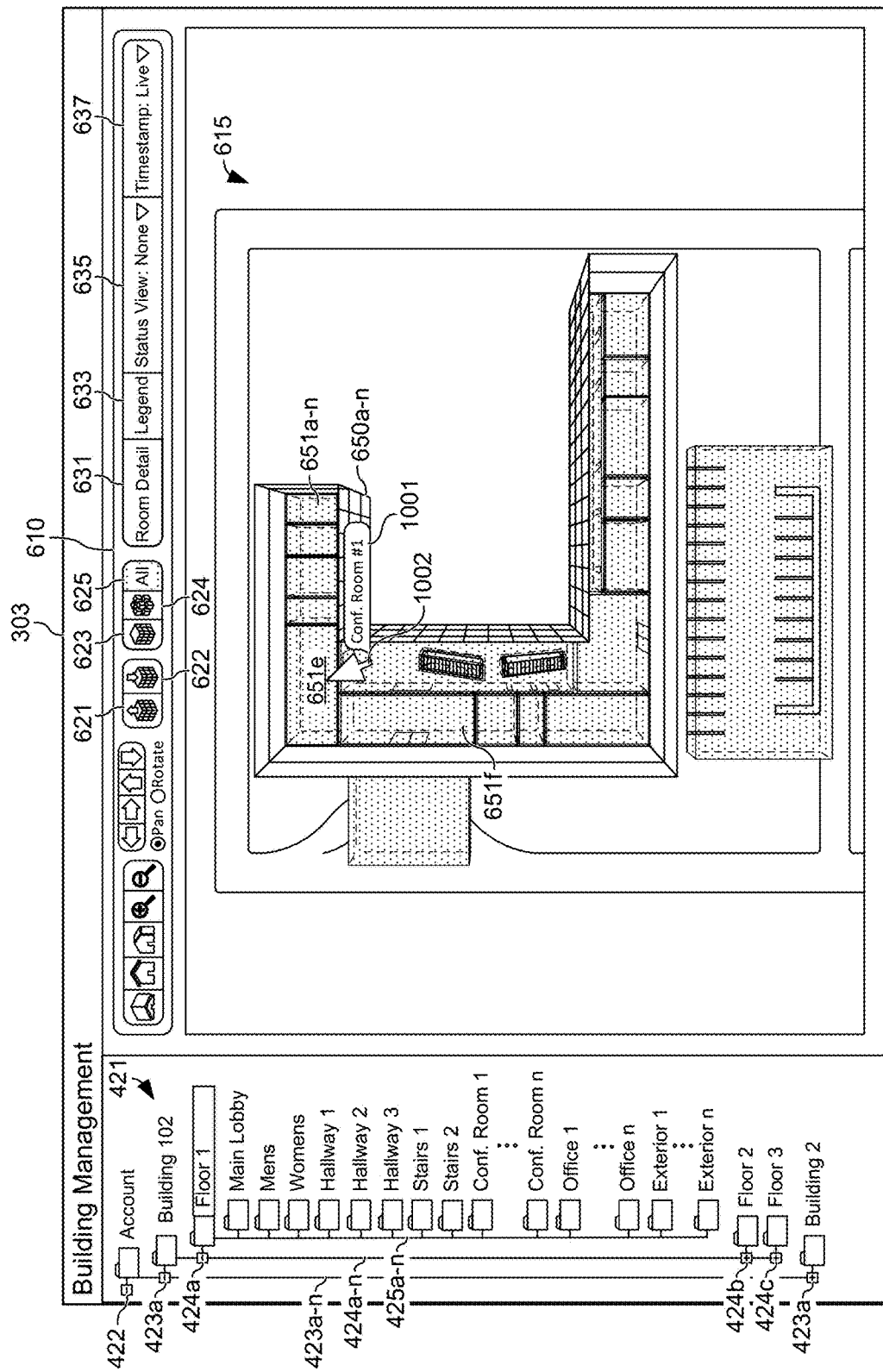
Figure 11:
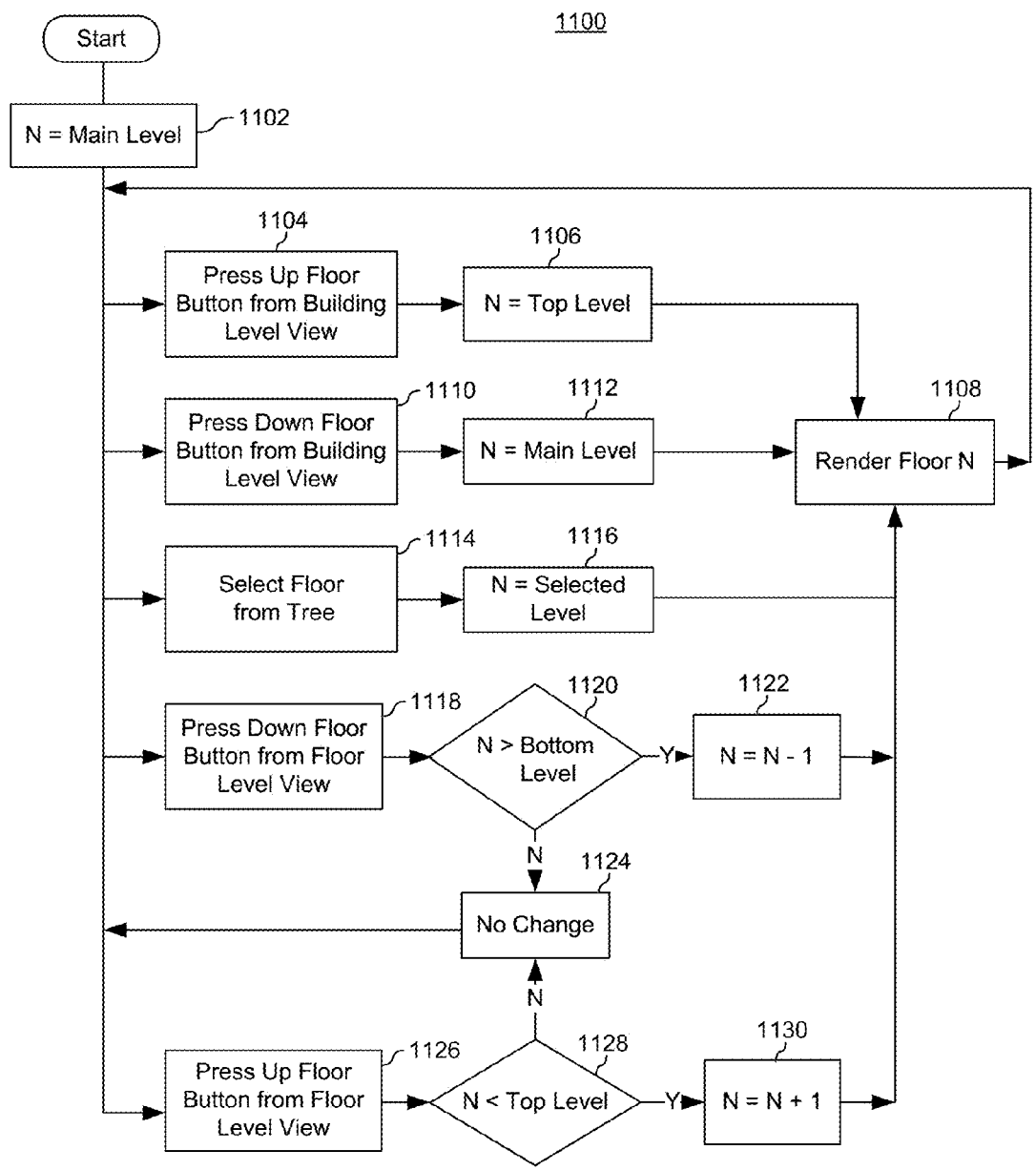
Figure 12:
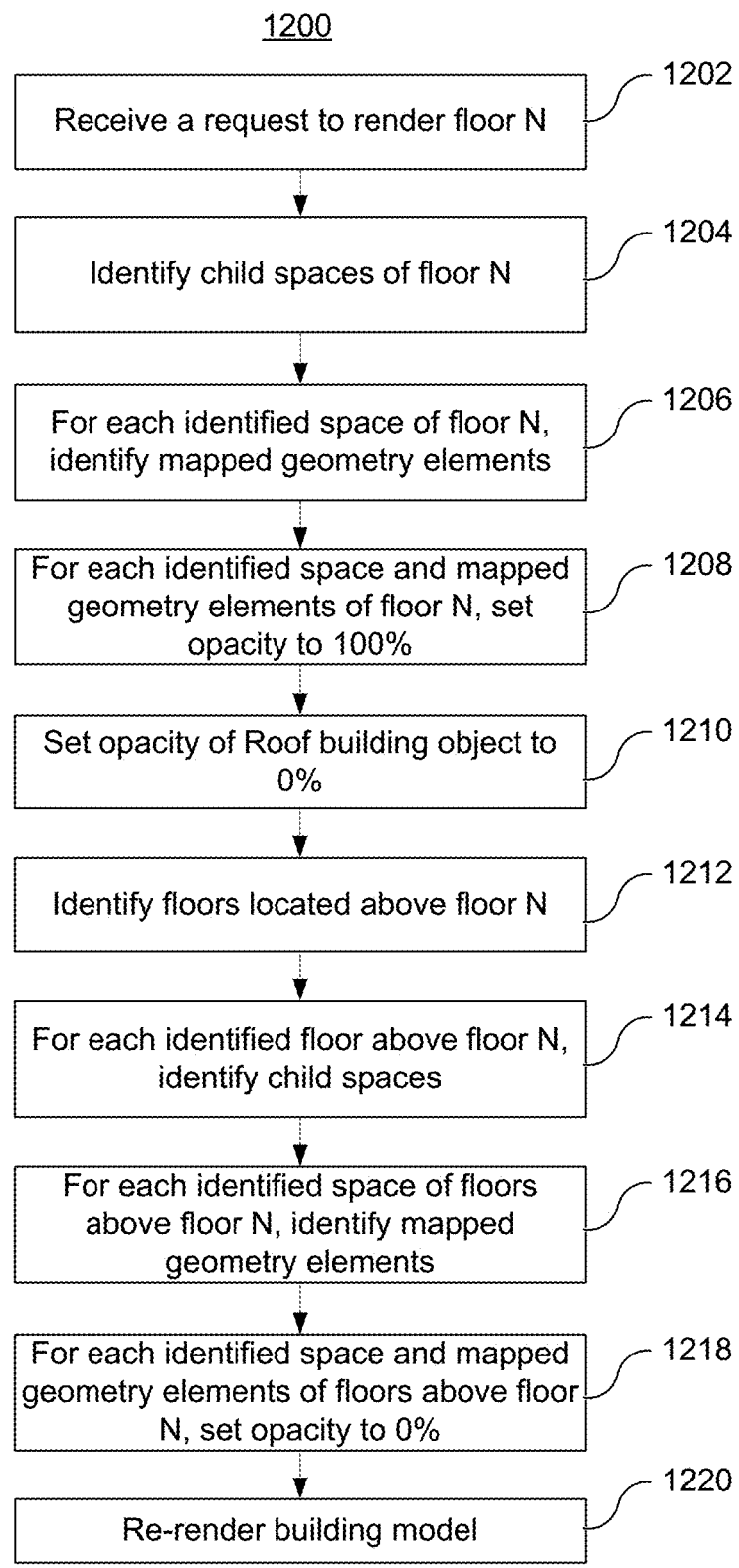
Figure 13:
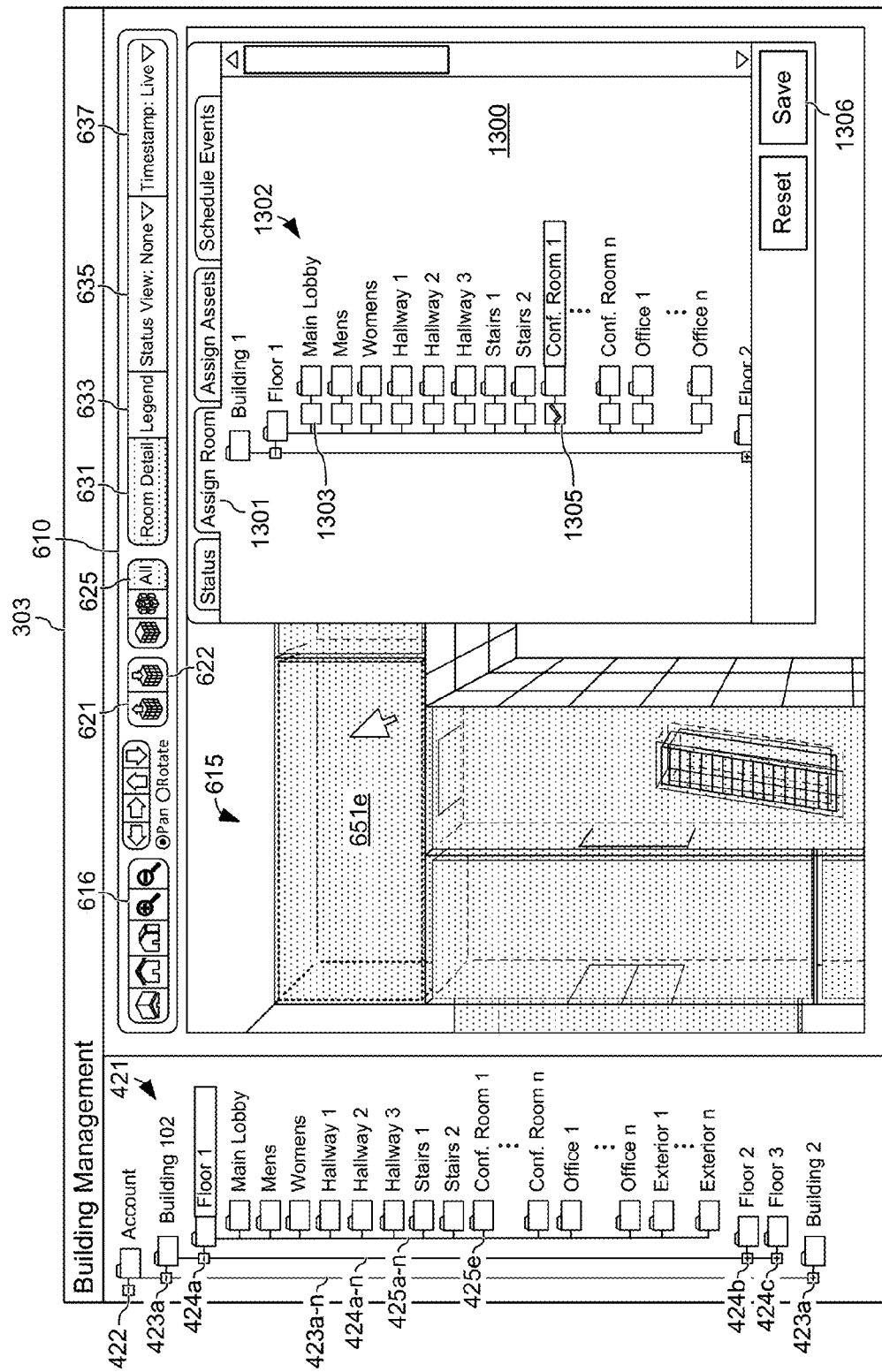
Figure 14:
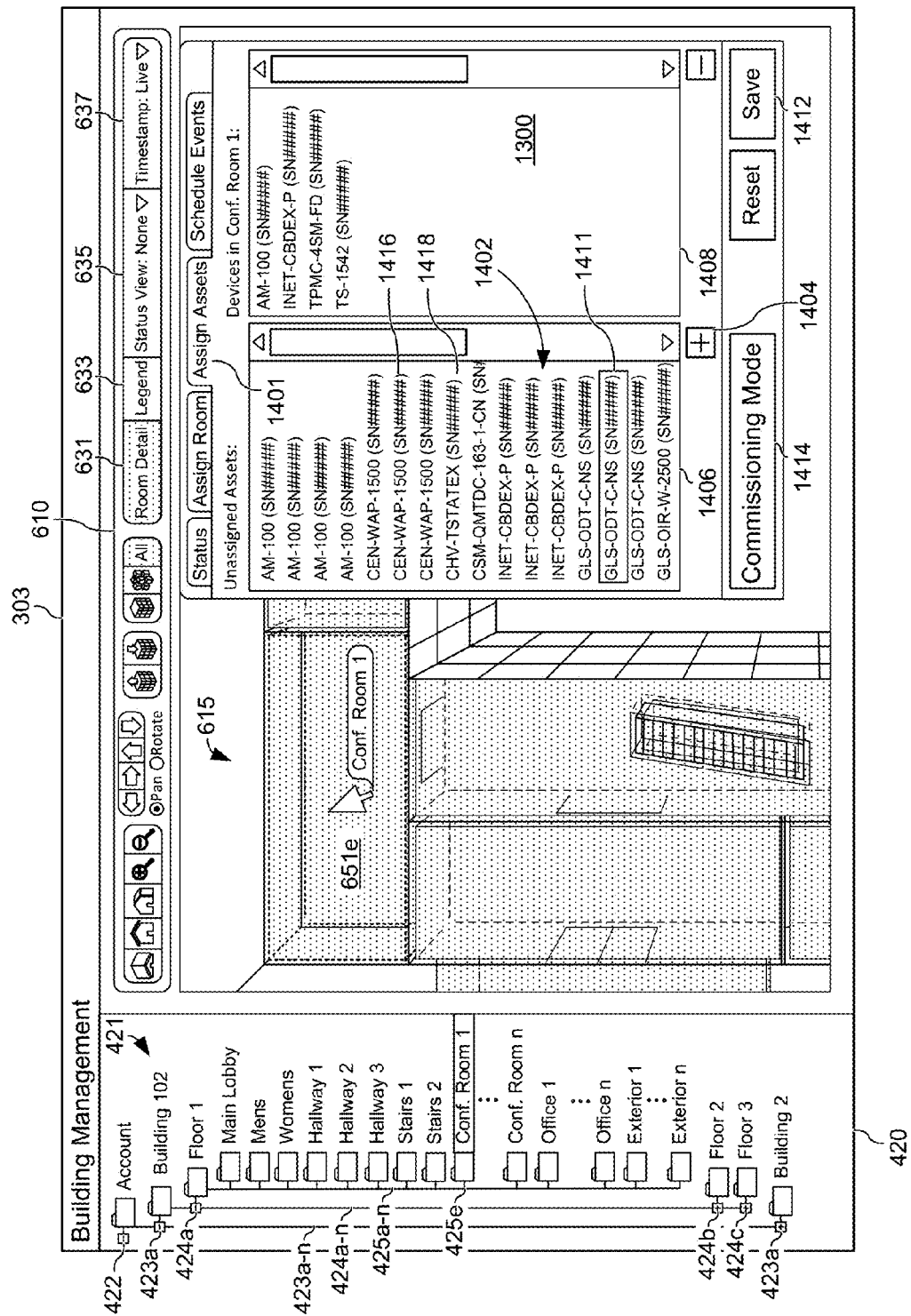
Figure 15:
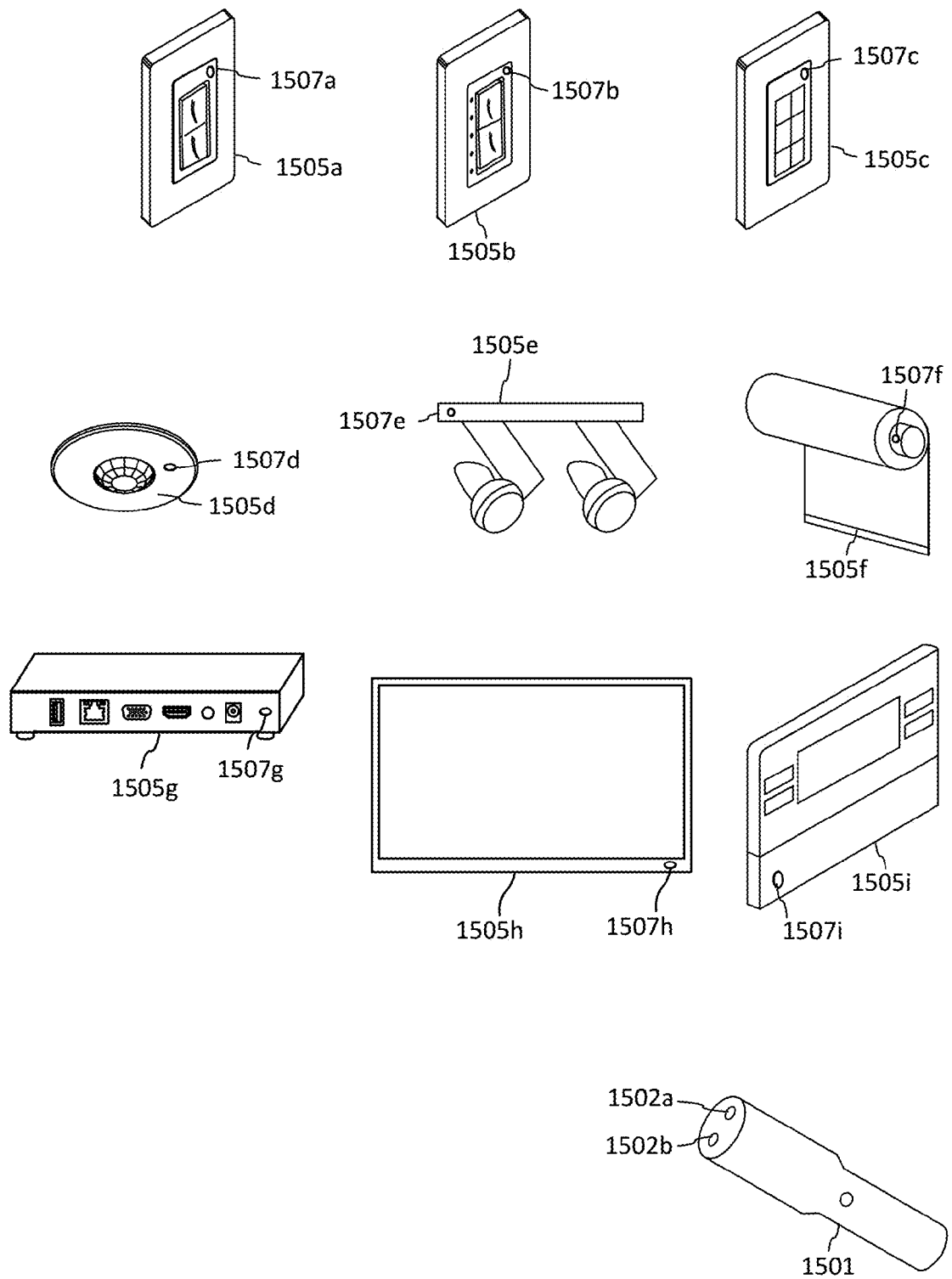
Figure 16:
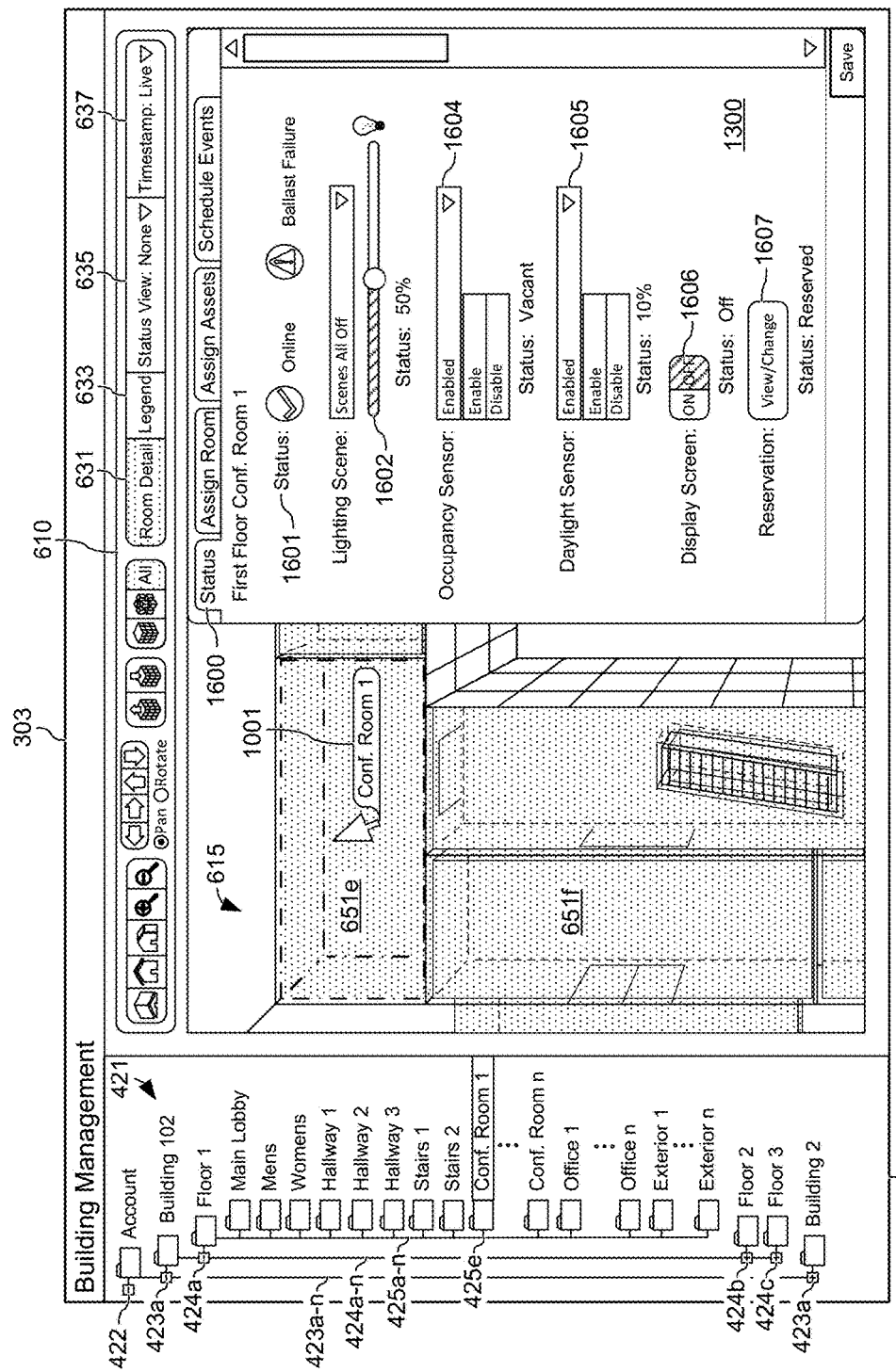
Figure 17:
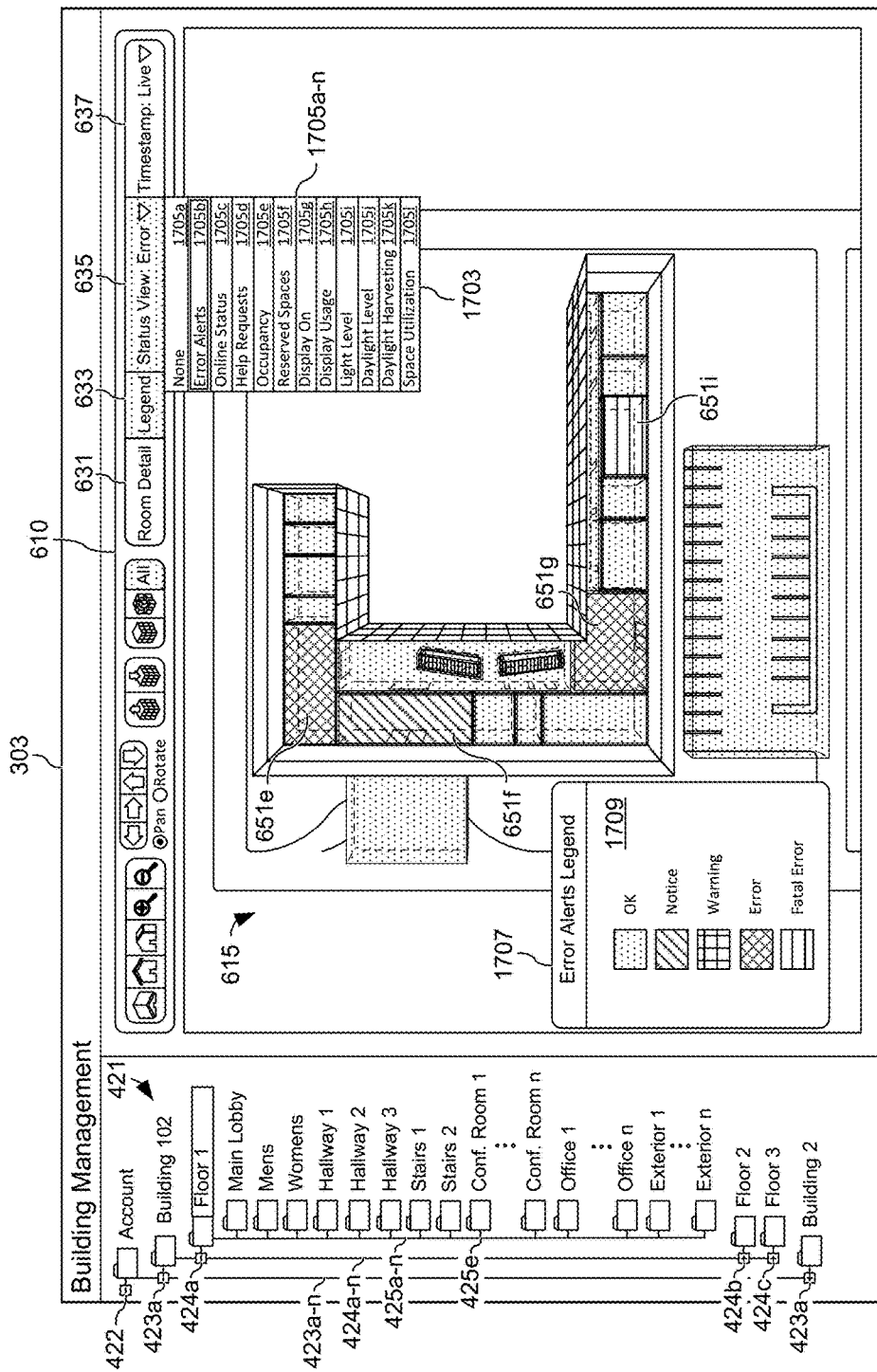
Figure 18:
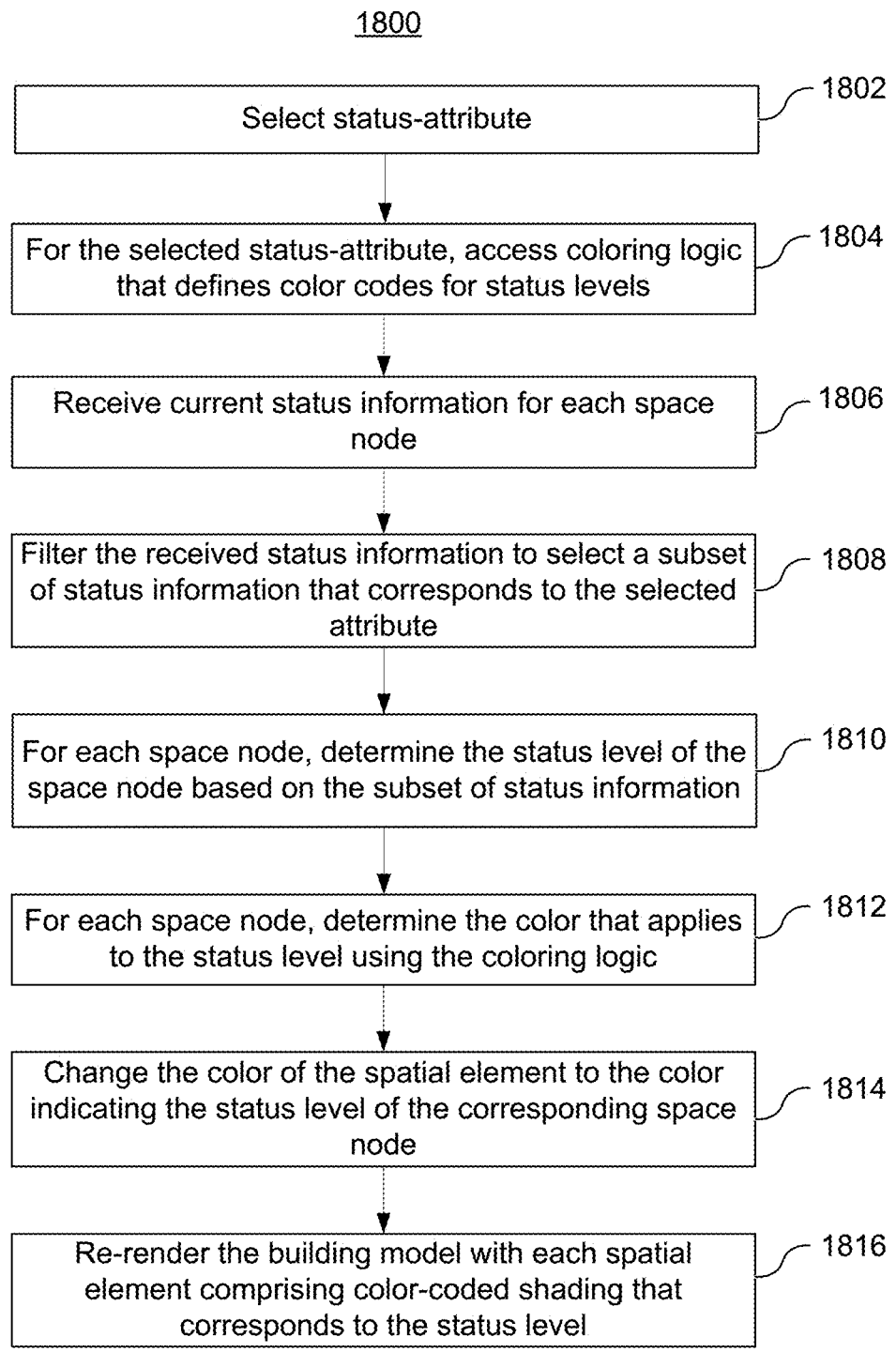
Figure 19:
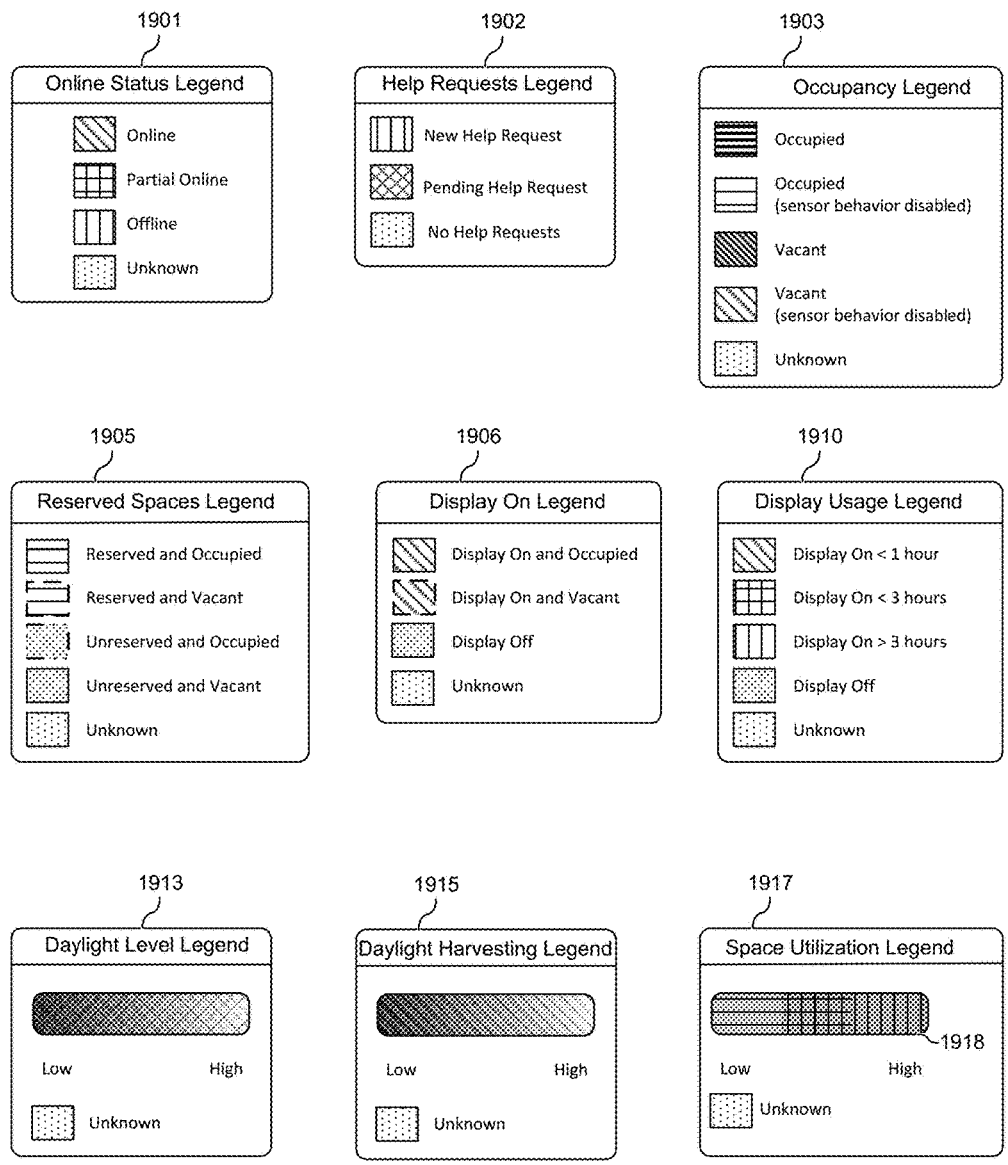
Figure 20:
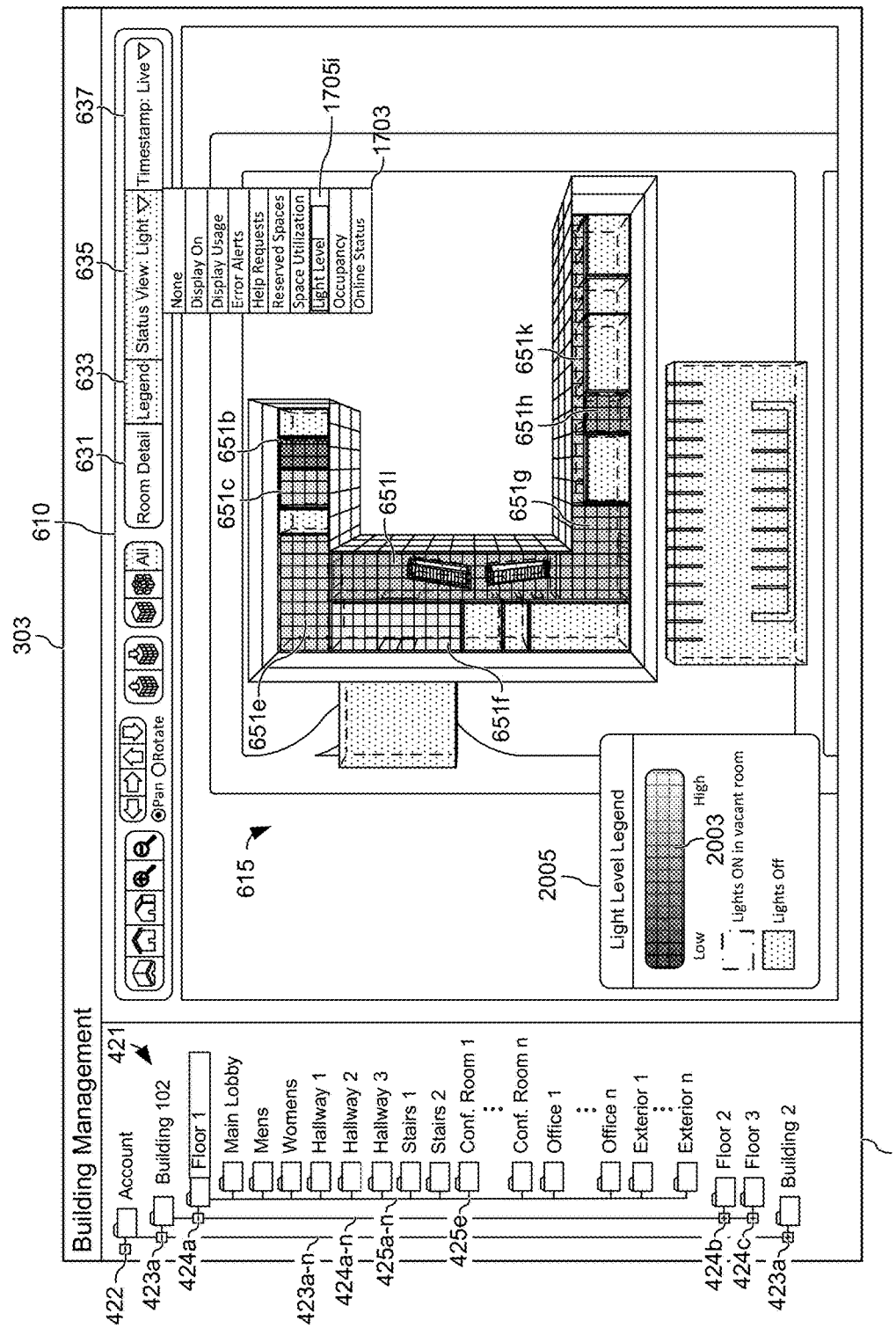
Figure 21:
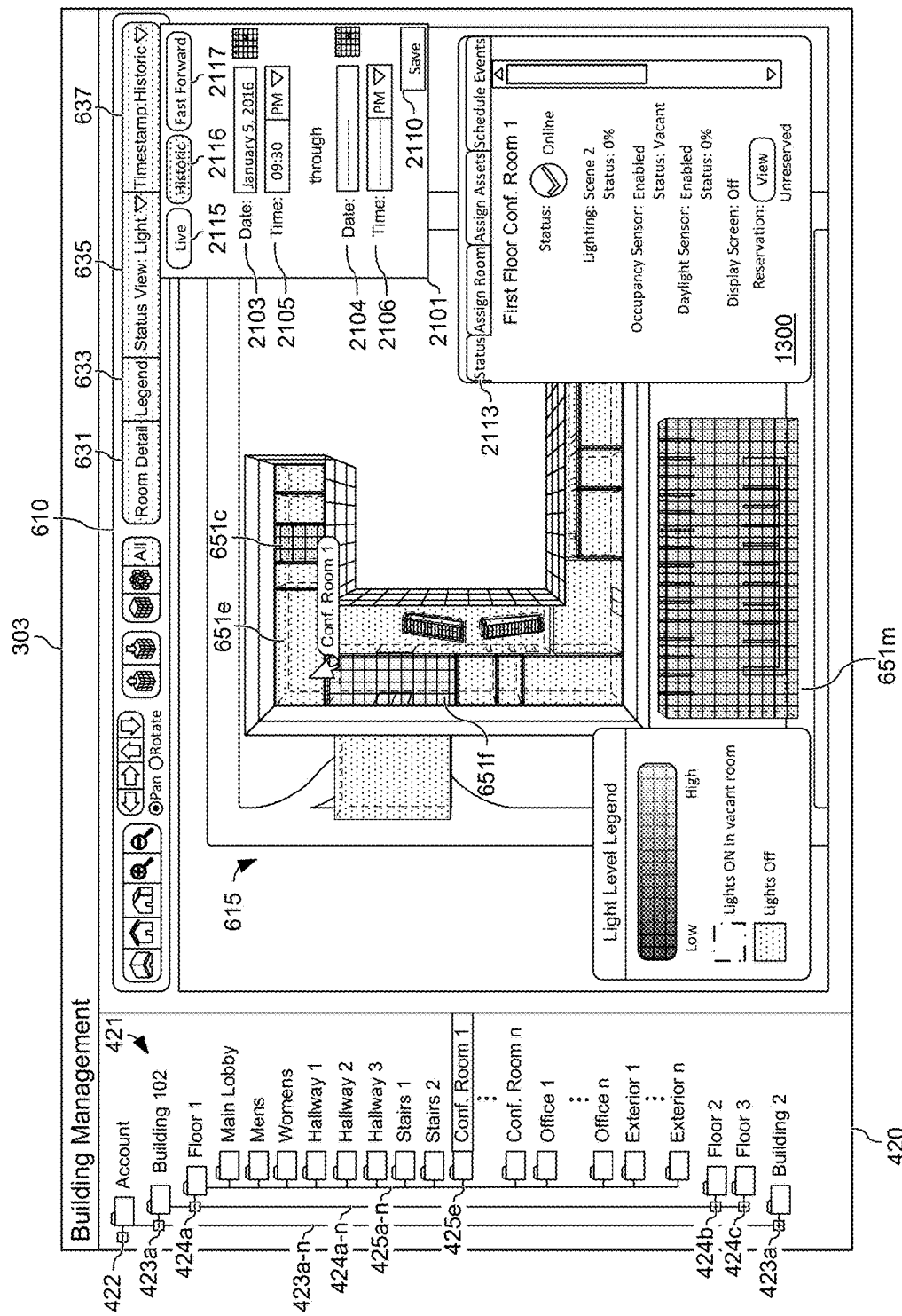
Figure 22:
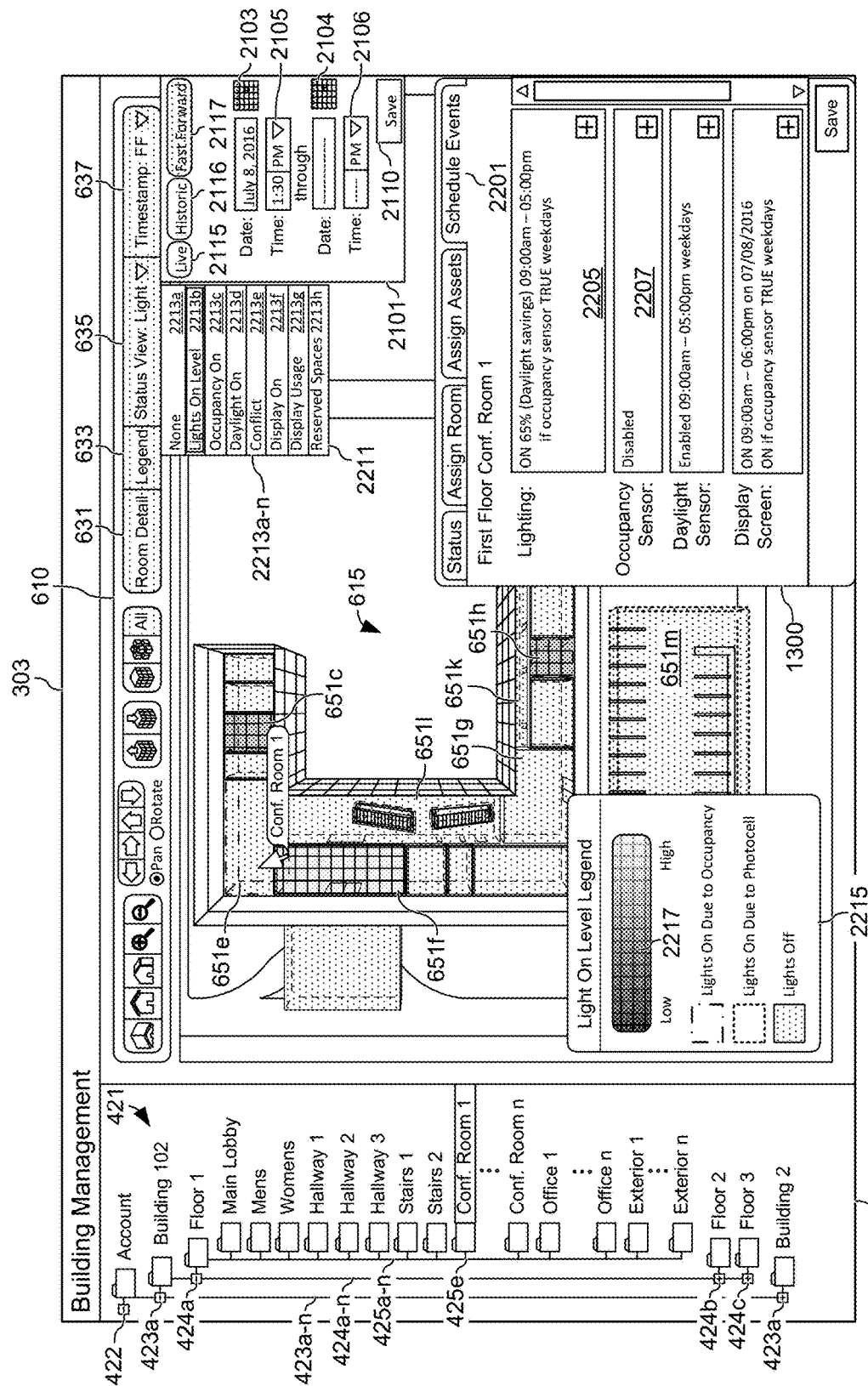
Figure 23:
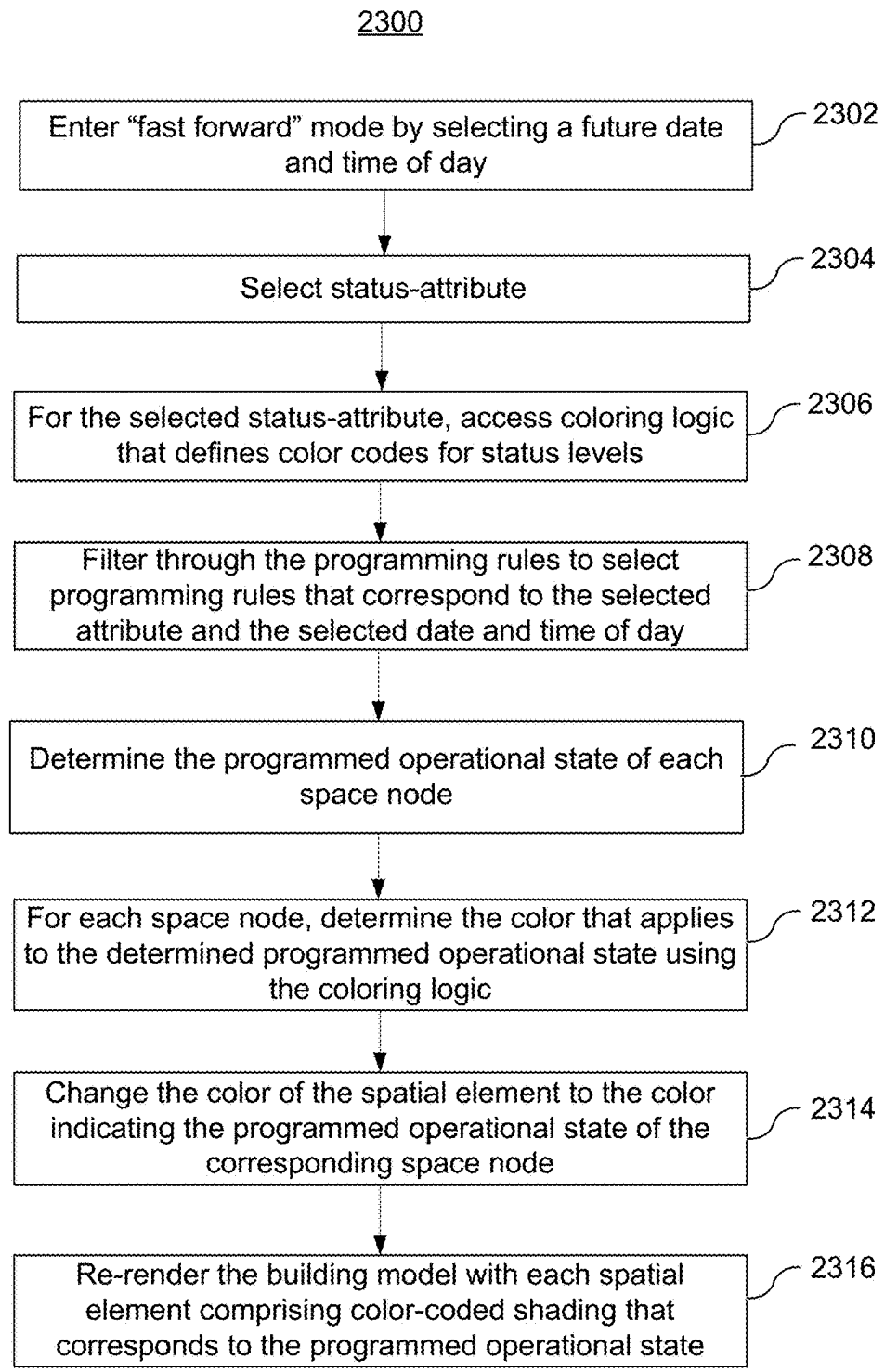
Figure 24:
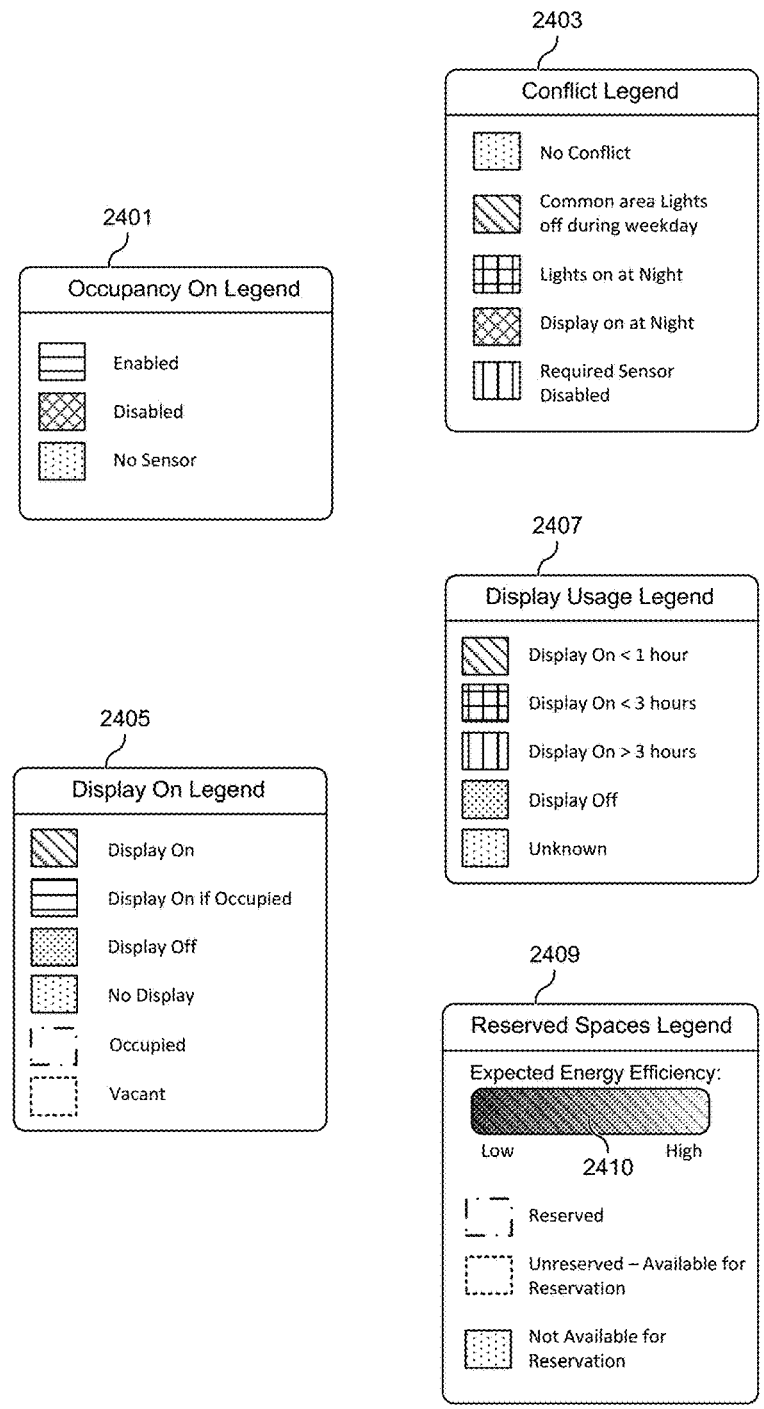
Figure 25:
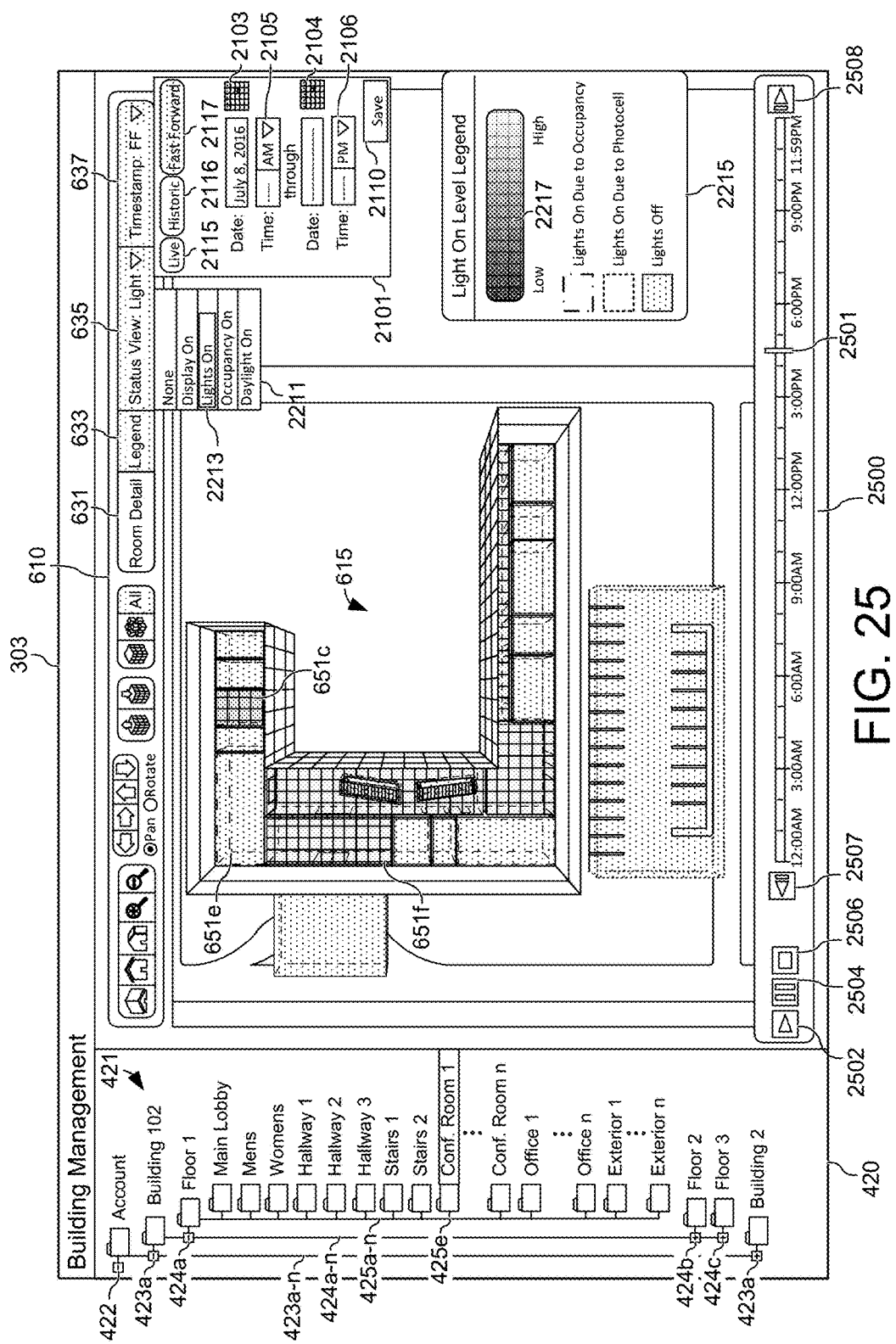

FIG. 1 illustrates a block diagram depicting a building management system according to an embodiment;

FIG. 2 illustrates a flowchart showing a process for on-demand rendering of a three-dimensional (3D) building management system visualization via a web-browser on a user communication device according to an embodiment;

FIG. 3 illustrates a block diagram showing a signal flow between one or more user communication devices and a building management server for rendering the 3D building management system visualization according to an embodiment;

FIG. 4 illustrates a schematic diagram depicting a "Setup" page of a building management application according to an embodiment;

FIG. 5 illustrates a schematic diagram of the "Setup" page depicting a "Select/Deselect Building Objects" window according to an embodiment;

FIG. 6 illustrates a schematic diagram depicting a "Building Management" page of the building management application showing a perspective view of a 3D building model according to an embodiment;

FIG. 7 illustrates a schematic diagram of the "Building Management" page showing a plan view of the top floor of the 3D building model according to an embodiment;

FIG. 8 illustrates a schematic diagram of the "Building Management" page showing a plan view of geometry elements of a first floor of the 3D building model according to an embodiment;

FIG. 9 illustrates a schematic diagram of the "Building Management" page showing a plan view of spatial elements of the first floor of the 3D building model according to an embodiment;

FIG. 10 illustrates a schematic diagram of the "Building Management" page showing a plan view of geometry elements and spatial elements of the first floor of the 3D building model according to an embodiment;

FIG. 11 illustrates a flowchart showing the process for determining which floor of the 3D building model to render according to an embodiment;

FIG. 12 illustrates a flowchart showing the process for rendering a floor of the 3D building model according to an embodiment;

FIG. 13 illustrates a schematic diagram of the "Building Management" page depicting an "Assign Room" tab of the "Room Detail" window according to an embodiment;

FIG. 14 illustrates a schematic diagram of the "Building Management" page depicting an "Assign Assets" tab of the "Room Detail" window according to an embodiment;

FIG. 15 illustrates a plurality of electronic devices equipped with commissioning means for automatically identifying the electronic devices by the building management server according to an embodiment;

FIG. 16 illustrates a schematic diagram of the "Building Management" page depicting a "Status" tab of the "Room Detail" window according to an embodiment;

FIG. 17 illustrates a schematic diagram of the "Building Management" page depicting a live "Error Alerts" status-attribute view according to an embodiment;

FIG. 18 illustrates a flowchart showing the process for displaying the live status-attribute views according to an embodiment;

FIG. 19 illustrates examples of color legends for other types of live status-attribute views according to an embodiment;

FIG. 20 illustrates a schematic diagram of the "Building Management" page depicting a live "Light Level" status-attribute view according to an embodiment;

FIG. 21 illustrates a schematic diagram of the "Building Management" page depicting a historic "Light Level" status-attribute view according to an embodiment;

FIG. 22 illustrates a schematic diagram of the "Building Management" page depicting a "Schedule Events" tab of the "Room Detail" window as well as a fast forward "Lights On" status-attribute view according to an embodiment;

FIG. 23 illustrates a flowchart showing the process for displaying the fast forward status-attribute views according to an embodiment;

FIG. 24 illustrates examples of color legends of other types of fast forward status-attribute views according to an embodiment; and FIG. 25 illustrates a schematic diagram of the "Building Management" page depicting an animation of the fast forward "Lights On" status-attribute view according to an embodiment.

DETAILED DESCRIPTION OF THE INVENTION

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
- 100 Building Management System
- 101a-n User Communication Devices
- 102 Building
- 103 Control System Processors
- 104 Ethernet Switch
- 105 Electronic Devices
- 106 Database
- 108 Communication Network
- 110 Building Management System Server
- 111 Central Processing Unit
- 112 Building Management Application
- 113 Main Memory
- 114 Nonvolatile Storage
- 115 Software Engines
- 116 Data Storage Areas
- 118 Network Interface
- 121 Lighting Devices
- 122 AV Devices
- 123 Appliances
- 124 HVAC Devices
- 125 Control Devices
- 126 Shading Devices
- 127 Sensors
- 128 Security Devices
- 129 Local Area Network
- 131 Control Engine
- 132 3D Building Visualization Engine
- 133 User Interface Engine
- 134 Building Monitoring Engine
- 135 Commissioning Engine
- 136 Account Engine
- 200 Flowchart Showing a Process for On-Demand Rendering of a 3D Building Management System Visualization via a Web-Browser on a User Communication Device
- 202-224 Steps of Flowchart 200
- 300 Block Diagram Showing a Signal Flow between One or More User Communication Devices and a Building Management Server for Rendering the 3D Building Management System Visualization
- 301a Web-Browser
- 301b Web-Browser
- 302 "Setup" Page
- 303 "Building Management" Page
- 304 WebGL Viewer
- 305a IFC File
- 305b Copied IFC File
- 311 IFC Uploader
- 312 Upload Command
- 313 Conversion Trigger
- 314 Conversion Command
- 315 JSON File
- 316 Extraction Command
- 318 Transfer Command
- 320 IFC Importer
- 321 Conversion Manager
- 323 IFC Converter
- 325 Data Extractor
- 331 Data Service Manager
- 334 Geometry Data File
- 335 Spatial Data File
- 336 Data Transfer
- 337 Retrieve Request
- 338 Query
- 339 Data Stream
- 404 Building Name Fillable Field
- 406 Address Fillable Field
- 408 "Configure Building Node Tree" Button
- 412 "Upload 3D Model" Button
- 414 "Upload File" Window
- 416 "Browse" Button
- 418 "Upload" Button
- 420 Building Tree Section
- 421 Tree Data Structure
- 422 Account Node
- 423a-n Building Nodes
- 424a-n Floor Nodes
- 425a-n Space Nodes
- 430 "Configure Tree" Window
- 431 Add Icon Button
- 432 Delete Icon Button
- 435 Fillable Fields
- 500 "Select/Deselect Building Objects" Window
- 502 Recommenced Selected Building Objects
- 504 Optional Unselected Building Objects
- 506 "Reset" Button
- 508 "Continue" Button
- 601 3D Visualization Section
- 610 Menu Bar
- 611 Plan View Icon Button
- 612 Front View Icon Button
- 613 Perspective View Icon Button
- 615 3D Building Model
- 616 Zoom-In Icon Button
- 617 Zoom-Out Icon Button
- 618 "Pan" Radio Button
- 619 "Rotate" Radio Button
- 620 Left, Right, Up, and Down Arrow Icon Buttons
- 621 Up Floor Icon Button
- 622 Down Floor Icon Button
- 623 "Structure" Button
- 624 "Spaces" Button
- 625 "All" Button 631 "Room Detail" Button
633 "Legend" Button
635 "Status View" Button
637 "Timestamp" Button
650a-n Geometry Elements
651a-n Spatial Elements or Spaces
1001 Floating Popup Window
1002 Cursor
1100 Flowchart Showing the Process for Determining Which Floor of the 3D Building Model to Render
1102-1130 Steps of Flowchart 1100
1200 Flowchart Showing the Process for Rendering a Floor of the 3D Building Model
1202-1220 Steps of Flowchart 1200
1300 "Room Detail" Window
1301 "Assign Room" Tab
1302 Selectable Tree Structure
1303 Selectable Node Fields
1305 Selectable Node Field
1306 "Save" Button
1401 "Assign Assets" Tab
1402 List of Discovered Electronic Devices
1404 Add Icon Button
1406 "Unassigned Assets" Section
1408 "Devices In [Space Node Name]" Section
1411 Occupancy Sensor
1412 "Save" Button
1414 "Commissioning Mode" Button
1416 Motorized Shade Device
1418 Thermostat
1501 Sensor Blaster
1502a Flash Light Sensor Trigger
1502b Infrared (IR) Blaster
1505a-i Electronic Devices
1505a Light Switch
1505b Light Dimmer
1505c Keypad
1505d Occupancy Sensor
1505e Lighting Device
1505f Motorized Shade Device
1505g Content Control Device
1505h Display Screen
1505i Thermostat
1507a-h Sensors
1507a-e Light Sensors
1507f-h Infrared (IR) Sensors
1507i Commissioning Mode Button
1600 "Status" Tab
1601 Room Status Information
1602 Lights Control Field
1604 Occupancy Sensor Drop-Down Menu
1605 Daylight Sensor Drop-Down Menu
1606 Display Control Field
1607 Reservation "View/Change" Button
1703 Status-Attribute Drop-Down Menu
1705a-n Status-Attribute Views
1705a "None" Status-Attribute View
1705b "Error Alerts" Status-Attribute View
1705c "Online Status" Status-Attribute View
1705d "Help Requests" Status-Attribute View
1705e "Occupancy" Status-Attribute View
1705f "Reserved Spaces" Status-Attribute View
1705g "Display On" Status-Attribute View
1705h "Display Usage" Status-Attribute View
1705i "Light Level" Status-Attribute View
1705j "Daylight Level" Status-Attribute View
1705k "Daylight Harvesting" Status-Attribute View
1705l "Space Utilization" Status-Attribute View
1707 Color Legend Window
1709 Error Alerts Legend
1800 Flowchart Showing the Process for Displaying the Live Status-Attribute View
1802-1816 Steps of Flowchart 1800
1901 "Online Status Legend"
1902 "Help Requests Legend"
1903 "Occupancy Legend"
1905 "Reserved Spaces Legend"
1906 "Display On Legend"
1910 "Display Usage Legend"
1913 "Daylight Level Legend"
1915 "Daylight Harvesting Legend"
1917 "Space Utilization Legend"
1918 Space Utilization Color Gradient
2003 Light Level Color Gradient
2005 "Light Level Legend"
2101 Timestamp Drop-Down Window
2103 Date Input Field
2104 Through Date Input Field
2105 Time Input Field
2106 Through Time Input Field
2110 "Save" Button
2113 "Status" Tab
2115 "Live" View Button
2116 "Historic" View Button
2117 "Fast Forward" View Button
2201 "Scheduled Events" Tab
2205 Lighting Programming Field
2207 Occupancy Sensor Programming Field
2211 Fast Forward Status Attribute Drop-Down Menu
2213a-n Fast Forward Status-Attribute Views
2213a Fast Forward "None" Status-Attribute View
2213b Fast Forward "Lights On Level" Status-Attribute View
2213c Fast Forward "Occupancy On" Status-Attribute View
2213D Fast Forward "Daylight On" Status-Attribute View
2213e Fast Forward "Conflict" Status-Attribute View
2213f Fast Forward "Display On" Status-Attribute View
2213g Fast Forward "Display Usage" Status-Attribute View
2213h Fast Forward "Reserved Spaces" Status-Attribute View
2215 "Lights On Level Legend"
2217 Light Level Color Gradient
2300 Flowchart Showing the Process for Displaying the "Fast Forward" Status-Attribute Views
2302-2316 Steps of Flowchart 2300
2401 "Occupancy Sensor Legend"
2403 "Conflict Legend"
2405 "Display On Legend"
2407 "Display Usage Legend"
2409 "Reserved Spaces Legend"
2500 Animation Window
2501 Time Slider
2502 Play Icon Button
2504 Pause Icon Button
2506 Stop Icon Button
2507 Previous Button
2508 Next Button

LIST OF ACRONYMS USED IN THE SPECIFICATION IN ALPHABETICAL ORDER

The following is a list of the acronyms used in the specification in alphabetical order.

3D Three-Dimensional
AJAX Asynchronous JavaScript and XML
ASIC Application Specific Integrated Circuits
API Application Programming Interface
AV Audiovisual
BAS Building Automation Systems
BIM Building Information Model
BMS Building Management Systems
BSON Binary JavaScript Object Notation
CAN Campus Area Network
COM Communication Port
CPU Central Processing Unit
EDGE Enhanced Data Rates for GSM Evolution
EMS Energy Management Systems
GUID Globally Unique Identifier
HTML Hypertext Markup Language
HVAC Heating, Ventilation and Air Conditioning
ID Identification Number
IFC Industry Foundation Classes
I/O Input/Output
IP Internet Protocol
JPG/JPEG Joint Photographic Experts Group
IR Infrared
IRDA Infrared Data Association
JSON JavaScript Object Notation
LAN Local Area Network
LED Light Emitting Diode
MAN Metropolitan Area Network
MEP Mechanical, Electrical, and Plumbing
NIC Network Interface Card
PAN Personal Area Network
PNG Portable Network Graphics
PoE Power over Ethernet
PSTN Public Switched Telephone Network
RAM Random Access Memory
RISC Reduced Instruction Set
ROM Read-Only Memory
STEP Standard for the Exchange of Product
SVG Scalable Vector Graphics
URL Uniform Resource Locator
USB Universal Serial Bus
VRML Virtual Reality Modeling Language
WAN Wide Area Network
WebGL Web Graphics Library
XML Extensible Markup Language

MODE(S) FOR CARRYING OUT THE INVENTION

For 40 years Crestron Electronics, Inc., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein can be manufactured by Crestron Electronics, Inc., located in Rockleigh, N.J., and have been marketed under the trademark name of Fusion InSite™.

The different aspects of the embodiments described herein pertain to the context of building monitoring and automation, building automation systems (BAS), building management systems (BMS), and energy management systems (EMS) (collectively referred herein as "building management system"), but is not limited thereto, except as may be set forth expressly in the appended claims. The embodiments of the building management system can be used in small, mid, or large scale residential or commercial installations. While the embodiments are described herein as being implemented for commercial building management, they are not limited to such an implementation. The present embodiments may be employed in other type of venues or facilities, including in residential, retail, or non-profit structures or venues. Additionally, while the building management system described herein as managing and controlling an entire building, it may be scaled up to manage an entire campus of buildings or scaled down to manage a floor or a section of a floor, such as a department, within a building. The building management system of the present embodiments can monitor and control numerous electronic devices, including one or more of heating, ventilation and air conditioning (HVAC), lighting, shading, security, appliances, door locks, and audiovisual (AV) equipment, among others.

The present embodiments provide systems, methods, and modes for rendering a three-dimensional (3D) building management system visualization for commissioning, monitoring, and control of a building management system. The utilization of a three-dimensional view can provide facility managers with interactive, real-time 360-degree three-dimensional visualization of an entire corporate campus making it easy to visualize the physical buildings. They can then "drill down" to view each building on the campus, each floor in the building, each space on the floor, and the technology within each space. Thus, the present embodiments provide users with intuitive and easily comprehensible navigation, monitoring, and control experience of a building management system. Viewing status in the three-dimensional building visualization will not only show status of individual spaces, such as rooms, but users will be able to easily determine if neighboring spaces or rooms are showing the same or similar status. The three-dimensional building visualization further allows users to quickly and easily perform other tasks, such as commissioning, event scheduling, and control of the building management system as will be later described. Moreover, the present embodiments deliver enterprise management via cloud computing, without the responsibilities of managing proprietary equipment, servers, or software on the corporate network. As such, building managers can check the status of and control devices in the room, such as occupancy or daylight sensors, turn lights on or off, view lighting levels and set room scenes, and perform other functions anytime and from anywhere.

FIG. 1 illustrates a block diagram depicting a building management system 100 for managing and controlling one or more buildings, such as building 102, according to an embodiment. It should be noted that the exemplary embodiment of system 100 illustrated in FIG. 1 may be varied in one or more aspects without departing from the spirit and scope of the teachings disclosed herein. Building management system 100 may comprise one or more user communication devices 101*a-n*, a building management system server 110, a database 106, a communication network 108, and various devices installed in the building 102 such as control system processors 103 and electronic devices 105. The building management system server 110 may comprise or be associated with a building management application 112 configured for providing a web-based user interface on the user communication devices 101*a-n* with which the user can interact with the building management system 100. By leveraging remote access to the control system processors 103 and/or the controllable electronic devices 105 via building management system server 110, a user may monitor and control the devices 105 and/or environment settings in a building 102 using any user communication device 101a-n from anywhere in the world without any need for a local copy of any special software. The building management application 112 provides a user interface on the user communication device 101a-n in communication with the server 110 allowing a user to setup and commission the building management system 100 as well as to monitor and control the various electronic devices 105 within the building 102.

User communication devices 101a-n may access the services provided by the building management system server 110 using a web-browser, such as Internet Explorer, Microsoft Edge, Firefox, Google Chrome, Opera, Safari, or the like. While the embodiments are described herein as accessing server 110 via a web-browser, the present embodiments are not limited to such an implementation. According to other embodiments, the user communication devices 101a-n may comprise a proprietary native mobile app, or any other similar software application, configured to access server 110 via the communication network 108. User communication devices 101a-n may be any computers known in the art, including, but not limited to a desktop computer, a laptop, a portable electronic device, a mobile computer, a smartphone, a tablet, a personal digital assistant, or any other computer configured for communicating with a remove server, such as server 110, via a communication network through a web-browser or other similar application. Each user communication device 101a-n may comprise a central processing unit (CPU), a user interface (e.g., display, keyboard, mouse, or the like), one of numerous forms of storage (e.g., solid-state memory (RAM, ROM, and the like), magnetic memory, such as disc drives, tape storage, and the like, and/or optical memory, such as DVD), and a network interface, as is known in the art. Using the network interface, each user communication device 101a-n can communicate with server 110 via the communication network 108.

Communication network 108 can incorporate one or more of the Internet, a wide area network (WAN), a local area network (LAN), a personal area network (PAN), a wireless network, a campus area network (CAN), a metropolitan area network (MAN), or the like. Communication network 108 may include a public switched telephone network (PSTN), a cable telephony network, an Internet Protocol (IP) telephony network, a wireless network, a hybrid Cable/PSTN network, a hybrid IP/PSTN network, a hybrid wireless/PSTN network or any other suitable communication network or combination of communication networks. In addition, other network embodiments can be deployed with many variations in the number and type of devices, communication networks, communication protocols, system topologies, and myriad other details without departing from the spirit and scope of the present embodiments. Communication network 108 may include one or more gateway devices to provide with an entrance to communication network 108, which may include software and/or hardware components to manage traffic entering and exiting communication network 108 and conversion between the communication protocols used by various communication devices.

The building management system may further comprise one or more control system processors 103 in communication with the building management server 110 via the Ethernet switch 104 and communication network 108. Control system processors 103 may be connected to various electronic devices 105 throughout building 102 via a wireline or wireless local area network 129. The control system processor 103 is used for, among other things, controlling and monitoring various devices and environmental conditions throughout a structure. The control system processor 103 may be a Crestron 3-Series Control system available from Crestron Electronics, Inc. of Rockleigh, N.J. The Crestron 3-Series Control system provides a complete integrated audiovisual (AV) or automation solution. The control system processors 103 may control one or more of the following electronic devices: lighting devices 121, including but not limited to lamps, ballasts, light emitting diode (LED) drivers; HVAC devices 124 including but not limited to thermostats, air conditioning units, heating units, filtration systems, fans, humidifiers; shading devices 126 including but not limited to motorized window treatments, dimmable windows; sensors 127, including but not limited to occupancy sensors, proximity sensors, sound sensors, microphones, temperature sensors; AV devices 122, including but not limited to content sources, content sinks, video recorders, cameras, VCR, DVD/DVR, CD player, audio receivers, audio system devices, speakers, telephones, video phones, projectors, projector screens, touch panels, cable television box, television such as plasma, liquid crystal display, light-emitting diode flat panel, and cathode ray tube television; security devices 128 including but not limited to security cameras, monitors and door locks; appliances 123 including but not limited to refrigerators, ovens, blenders, microwaves; control devices 125 including but not limited to switches, relays, current limiting devices; industrial devices including but not limited to motors, pumps, chillers, and air compressors. Other types of electronic devices 105 are contemplated depending on building implementation.

One or more network interfaces may provide connectivity between the control system processors 103 and electronic devices 105, and among the electronic devices 105 via the local area network 129. The network interface may represent, for example, one or more network interface cards (NIC) or a network controller. In certain embodiments, the network interface may include a PAN interface. The PAN interface may provide capabilities to network with, for example, a Bluetooth® network, an IEEE 802.15.4 (e.g. Zigbee network), or an ultra-wideband network. As should be appreciated, the networks accessed by the PAN interface may, but do not necessarily, represent low power, low bandwidth, or close range wireless connections. The PAN interface may permit one electronic device 103/105 to connect to another local electronic device 103/105 via an ad-hoc or peer-to-peer connection.

The network interface may also include a LAN interface. The LAN interface may represent an interface to a wired Ethernet-based network but may also represent an interface to a wireless LAN, such as an 802.11x wireless network. Additionally, in many cases, a connection between two electronic devices 103/105 via the LAN interface may involve communication through a network router or other intermediary device. Ethernet connectivity enables integration with IP-controllable devices and allows the processors to be part of a larger managed control network. Whether residing on a sensitive corporate LAN, a home network, or accessing the Internet through a cable modem, the control processors 103 may provide secure, reliable interconnectivity with IP-enabled devices, such as touch screens, computers, mobile devices, video displays, Blu-ray Disc® players, media servers, security systems, lighting, HVAC, and other equipment—both locally and globally. For some embodiments, the network interfaces may include the capability to connect directly to a WAN via a WAN interface. The WAN interface may permit connection to a cellular data network, such as the EDGE network or other 3G network.

The control system processors 103 and electronic devices 105 may also include one or more wired input/output (I/O) interface for a wired connection between one electronic device and another electronic device. One or more wired interfaces may represent a serial port, for example a communication (COM) port or a universal serial bus (USB) port. Additionally, the wired I/O interface may represent, for example, a Cresnet® port. Cresnet® connectivity provides a network wiring solution for Crestron keypads, lighting controls, thermostats, and other devices that don't require the higher speed of Ethernet. The Cresnet® bus offers wiring and configuration, carrying bidirectional communication and 24 VDC power to each device over a simple 4-conductor cable.

One or more infrared (IR) interfaces may enable the control system processors 103 and electronic devices 105 to receive and/or transmit signals with infrared light. The IR interface may comply with the Infrared Data Association (IrDA) specification for data transmission. Alternatively, the IR interface may function exclusively to receive control signals or to output control signals. The IR interface may provide a direct connection with one or more devices such as a centralized AV sources, video displays, and other devices. One or more programmable relay ports may enable the control system processors 103 and/or electronic devices 105, such as control devices 125, to control window shades, projection screens, lifts, power controllers, and other contact-closure actuated equipment. One or more "Versiport" I/O ports may enable the integration of occupancy sensors, power sensors, door switches, or anything device that provides a dry contact closure, low-voltage logic, or 0-10 Volt DC signal.

According to an alternative embodiment, building management system 100 may operate without the utilization of control system processors 103. The various electronic devices 105 dispersed throughout the building 102 may operate as a network of devices in communication with the building management system server 110 over communication network 108. According to some aspects of the embodiments, each controllable electronic device 105 may comprise a power over Ethernet (PoE) interface for receiving electric power as well as for sending and receiving signals over an Internet Protocol (IP) based network.

Building management system server 110 may be a dedicated, private server, employing standard security protocols. Server 110 may be always active and accessible to any user communication device 101a-n from any location via a unique URL and host name. Server 110 may be incorporated into a conventional standalone server, although in other embodiments, the function of server 110 may be distributed across multiple computing systems and architectures. Multiple, redundant servers may be provided for additional backup and security. For example, server 110 may include separate web, app, or email servers.

Server 110 may comprise one or more network interfaces 118 to provide connectivity with, among other things, user communication devices 101a-n, one or more databases, such as database 106, control system processors 103 and/or electronic devices 105. The network interface 118 may represent, for example, one or more network interface cards (NIC) or a network controller. According to an embodiment, the network interface 118 includes the capability to connect directly to a wide area network (WAN). The network interface 118 may permit a connection to a cellular data network, such as the Enhanced Data rates for GSM Evolution (EDGE) network or other 3G network.

Server 110 may include a central processing unit (CPU) 111 configured for providing processing capability to execute an operating system, run various applications, and/or provide processing for one or more of the techniques described herein. For example, the CPU 111 may represent one or more microprocessors, and the microprocessors may be "general purpose" microprocessors, a combination of general and special purpose microprocessors, or application specific integrated circuits (ASICs). Additionally or alternatively, the CPU 111 may include one or more reduced instruction set (RISC) processors, video processors, or related chip sets.

Server 110 may further include any one of numerous forms of storage, including main memory 113 and nonvolatile storage 114. Main memory 113 may be communicably coupled to the CPU 111 and may store data and executable code. The main memory 113 may represent volatile memory such as random access memory (RAM), but may also include nonvolatile memory, such as read-only memory (ROM) or Flash memory. In buffering or caching data related to operations of the CPU 111, the main memory 113 may store data associated with various engines and modules running on the server 110. The nonvolatile storage 114 may represent any suitable nonvolatile storage medium, such as a hard disk drive or nonvolatile memory, such as Flash memory. Being well-suited to long-term storage, the nonvolatile storage 114 may store data files such as media (e.g., music and video files), software (e.g., for implementing functions on the server 110), and building model data files, among other types of data.

Nonvolatile storage 114 may further include a building management application 112 operable to enable the rendering of a 3D building management system visualization, providing commissioning, maintenance, and control of the building management system, as well as perform other operations discussed below. Building management application 112 may be part of the Crestron Fusion® enterprise management platform available from Crestron Electronics, Inc. of Rockleigh, N.J. Crestron Fusion® enterprise management platform enables organizations to monitor and manage AV equipment, BMS, room scheduling, lighting, shades, climate, and energy consumption from a single platform. Building management application 112 may comprise a plurality of software engines 115. Software engines 115 process information received from user communication devices 101-n, database 106, control system processors 103, and/or electronic devices 105. Depending upon implementation, various aspects of teachings of the present embodiments may be implemented in a single building management application, a plurality of applications, a single software engine, in a plurality of software engines, in one or more hardwired components or in a combination of hardwired and software systems. In addition to one or more software engines 115, nonvolatile storage 114 also includes one or more data storage areas 116. A data storage area 116 is operably associated with the main memory 113 and CPU 111. Data storage area 116 of non-volatile storage may be leveraged to maintain data pertinent to the building management application 112 for rendering of the three-dimensional building visualization, providing commissioning, maintenance, and control of the building management system. Data storage areas 116, or portions thereof, may also be utilized to store myriad other data.

The building management application 112 may be run on the server 110 and may comprise a web application—a client-server software application which runs in a web-browser of a client computer, such as one or more user communication devices 101a-n. In another embodiment, building management application 112 may comprise a proprietary native mobile app in communication with building management server 110. The number and types of applications, software engines, and data storage areas may be varied and, as such, the specific arrangement discussed herein is presented primarily for descriptive purposes.

Software engines 115 of the building management application 112 may comprise a 3D building visualization engine 132. The 3D building visualization engine 132 may be configured for processing building model data, such as by importing, converting, and parsing building model data, as will be described below. The processed building model data may be stored on server 110 or database 106. It should be understood that server 110 and/or database 106 harboring the building model data may be a single unit or a plurality of servers/databases. The database 106 can be co-located with the server 110, or it can be located remotely in various different systems and locations. Database 106 may include any one of numerous forms of storage devices and storage media, such as solid-state memory (RAM, ROM, and the like), magnetic memory, such as disc drives, tape storage, and the like, and/or optical memory, such as DVD. The 3D building visualization engine 132 is further configured for accessing the processed building model data on the database 106 and rendering a 3D building management system visualization via a web-browser or the like on a user communication device 101a-n.

Software engines 115 of the building management application 112 may further comprise a commissioning engine 135. Commissioning engine 135 may be configured for defining associations between the electronic devices 105 and the 3D building model, as well for associating electronic devices 105 in groups, assigning controllable devices to control points, creating zones, associating groups of devices in those zone, as will be later described.

According to the aspects of the present embodiments, control system processors 103 and/or electronic devices 105 communicate with the server 110 to receive various control commands. To that end, software engines 115 of server 110 may comprise a control engine 131 configured to send at least one command to control the electronic devices 105. Control commands may comprise on-demand commands generated from user communication devices 101a-n. For example, the at least one command may include a command to power on/off or dim a lighting device, control a touch panel, raise/lower the shades, power on/off or adjust the temperature of an HVAC system, enable/disable a security system, power on/off a sensor, power on/off a local computer, or the like. Depending upon implementation, other control commands are contemplated by the present embodiments. In other embodiments, control engine 131 is configured for allowing a user to preprogram setting presents, scenes, building rules, and schedule of event. For example, a scheduled event may generate control commands to turn lights off in the building 102 during the end of business hours.

Additionally, control system processors 103 may transmit status information of the various electronic devices 105 of building 102. Server 110 can comprise a building monitoring engine 134 configured for monitoring the operation of the building 102 and providing this information on a user communication device 101a-n. Building monitoring engine 134 may be employed to provide real-time or live status information of resources of the building, such as environmental resources and conference room devices. As such, status information may be transmitted to the building monitoring engine 134 on-demand. Additionally, status information may be collected and stored on the database 106. Building monitoring engine 134 may be configured to recall historic status information stored in the database 106. As discussed below, status information may be visualized as part of the three-dimensional building visualization via a web-browser on the user communication device 101a-n.

In addition, software engines 115 may comprise an account engine 136. Server 110 may be utilized to provide building management services to a plurality of buildings. One or more buildings, such as building 102, may be associated with an account. Account engine 136 may be configured to create such accounts and correlate data relevant to a particular building, such as building 102, in these accounts, including a building model data of a building 102, system status information of a building 102, as well as other data related to building 102. Account engine 136 may request a variety of data from a user during a registration process. For example, requests for data may include the building's address, list of users who are permitted to access the building management system of building 102, as well as their names and passwords for registration purposes. Account engine 136 may be further configured for providing user authentication to allow access to a particular account and building management services. The account engine 136 may check the access of a user to building management services of a particular building by maintaining a database listing access permissions for resources and users as identified by user IDs and passwords.

The software engines 115 of the building management application 112 may also include a user interface engine 133. The user interface engine 133 may be leveraged in association with one or more included software engines and data available in data storage areas to enable visual layout and presentation structure of the building management services provided by server 110, such as visualization of the 3D building model, electronic devices 105, and status of electronic devices 105. User interface engine 133 may be configured to present the visual layout on user communication devices 101a-n via one or more webpages. FIGS. 4-10, 13-14, 16-17, 19-22, and 24-25, discussed below, include embodiments of various webpages whose presentation and layout may be provided by the user interface engine 133.

FIG. 2 illustrates a flowchart 200 showing the process for on-demand rendering of the 3D building management system visualization of building 102 via a web-browser on a user communication device 101a-n according to an embodiment. Process 200 can be performed by the various software engines 115 of the building management application 112 shown in FIG. 1, which may be run on the server 110 and/or in a web-browser of one or more user communication devices 101a-n as a client-server software application.

In step 202, the building management application 112 may receive a location of a building model data file of building 102 to upload to the building management system server 110. The building model data file may be stored on a user communication device 101a, or may be obtained from another source, such as a remote server or database, or a DVD. The building model data file may comprise a Building Information Model (BIM) data file. Building information modeling is an intelligent model-based process that provides insight to plan, design, construct, and manage buildings and infrastructure. Building information modeling involves the generation and management of digital representations of physical and functional characteristics of places. A BIM data file is a digital representation of a building, such as building 102, in software based on object information combining graphical and non-graphical properties. In other words, BIM is a digital representation of both physical and functional characteristics of a building or other facility. Conveniently, BIM data files may be exchanged or networked to support decision-making about a place. BIM exchange format definitions are used by various disciplines involved within the life cycle phases of a building, including architecture, building service, structural engineering, procurement, construction planning, facility management, project management, client requirement management, and building authority for permits and approval.

The BIM data file may be an Industry Foundation Classes (IFC) data file, as either a STEP (Standard for the Exchange of Product model data) physical file (*.ifc) or a compressed file (*.ifczip). The IFC file comprises industry standard information defined in the BIM modeling. IFC represents an open international standard for BIM data that is exchanged and shared among software applications used by the various participants in a building construction or facility management project. As such, IFC provides a standard file format to represent a building without requiring a user to own a copy of proprietary software. In another embodiment, the building model data file may comprise a Virtual Reality Modeling Language (VRML) data file (*.wrl), other STEP based models that define geometry, topology, and configuration management data, such as, AP 203 that is related to solid models for mechanical parts and assemblies (*.stp), AP 214 that includes core data for automotive mechanical design processes (*.stp), and AP 218 that related to ship structures (*.stp), as well as other similar file formats currently known or later discovered.

The IFC file may be provided by a building architect or manager of building 102 and may be generated using Revit® building design software from Autodesk®. In another embodiment, the building model data file may be generated from AutoCAD® software also provided from Autodesk®. The IFC file provides a detailed representation of building 102 for three-dimensional modeling. The IFC file typically comprises building objects comprising a plurality of geometry elements defining geometrical representations or geometrical formulas of various physical building objects, such as walls, floors, ceilings, doors, windows, pipes, etc. The IFC file further links alphanumeric information (such as properties, quantities, classification, etc.) to the building objects and maintains the relationships among the building objects. More specifically, the IFC file may include BIM exchange format definitions for the building structure, physical components, spatial components, analysis items, processes, resources, controls, actors, and context definition.

In step 204, the building management application 112 may be used to select and/or deselect building objects. As described above, a building model data file, such as an IFC file, may be very complex, containing a very large data set. The IFC file may include minute details about various objects and elements present in the building, including structural and non-structural objects. The building model data file may comprise basic structural building objects and their interrelationships that are essential to represent a 3D representation of a building properly. These may include structural building objects that represent a basic outer structure of the building and a basic inner structure of the building, such as walls, roofs, floors, ceilings, as well as related functional objects, such as contextual objects and spaces.

The building model data file may further comprise structural building objects that are unnecessary for building management purposes, such objects hidden within walls or ceilings, as for example beams. Additionally, the building model data file may comprise non-structural building objects. These may include other physical or virtual components of the building, such as mechanical, electrical, and plumbing (MEP) objects, which may include heating, ventilation and air conditioning (HVAC) objects (e.g., ducts, boilers, burners, AC units, compressors, fans, filters, pipes, tanks, tubes, valves, etc.), plumbing, rain gutter systems, fire protection systems, electric generators and motors, electrical wires, telecommunication wires, fire alarm systems, signalization, etc. Many of these objects may be irrelevant to the services provided by the building management system server 110, or objects a user, such as a building manager, does not wish to monitor or control. The inclusion of immense amount of non-structural objects on a 3D building visualization is also very confusing and does not provide an effective representation of the building status.

Accordingly, the building management application 112 may display to a user via a web-browser a list of building objects, including structural and non-structural, the user may select or deselect. In another embodiment, the building management application 112 may be configured to automatically select bare minimum objects that are required to render a 3D model of a building properly, including structural building objects that represent a basic outer structure of the building and the inner structure of the building. An exemplary list of bare minimum IFC objects that may be required to render a 3D model of a building properly may include: IfcProject, IfcSite, IfcBuilding, IfcBuildingStorey, IfcSpace (Rooms), IfcBuildingElementProxy, IfcColumn, IfcMember, IfcPlate, IfcRailing, IfcRoof, IfcSlab, IfcStairFlight, IfcWall, and IfcWallStandardCase, as defined in the IFC specifications developed by buildingSMART International Limited. It should be understood that this list is merely exemplary. For example, some users may not wish to include the ifcSite object, which defines the area of land on which the building is constructed.

In step 206, the building management application 112 uploads the building model data file comprising selected building objects. Consequently, a copy of the building model data file comprising selected building objects is created on the server 110. The copied building model data file may be temporarily stored on the server 110 for further processing.

In step 208, the building management application 112 may assign a node identification number (ID) to the copied building model data file of building 102. The node ID may be assigned by the server 110 to building 102 to associate various information and data files related to building 102, such as building address and building model data. Node ID may comprise a globally unique identifier (GUID) generated by the server 110.

In step 210, the building management application 112 may convert the building model data file into a web-browser recognizable format. Where the building model data file is in an IFC format, the building management application 112 may comprise an IFC converter that receives the IFC file copy and converts it into a "web friendly" representation of IFC data. For example, the converter may convert the IFC file copy into a format for Web Graphics Library (WebGL) rendering. The IFC converter may be provided by IFC Tools Project by APSTEX. Particularly, the IFC converter may convert the IFC file copy to a JavaScript Object Notation (JSON) file. JSON is a data exchange format, making it a simple solution to import 3D models in WebGL. It defines JavaScript objects that describe a model in a textual format. In another embodiment, the building model data file may be converted to other formats, such as Extensible Markup Language (XML), Binary JSON (BSON), Scalable Vector Graphics (SVG), Joint Photographic Experts Group (JPG/JPEG), Portable Network Graphics (PNG), or other similar file format currently known or later discovered.

Next, in step 212, the building management application 112 parses the converted building model data file into a geometry data file and spatial data file. In other words, the building management application 112 scans the converted building model data file, identifies geometry data and spatial data, and separates the spatial data from the geometry data of the converted building model data file. Separating the spatial data from geometry data allows for the building management system 100 to reference and recall this data individually to enable proper space management as will be later described. The copied and converted building model data file comprises a combination of geometry data and spatial data in a single file. Geometry data comprises geometry elements defining geometrical representation of physical building objects and their relationships. In other words, the geometry data represents the physical structure of the building, such as its shape and volume, and specifies how to render it. For example, referring to FIG. 5, geometry elements include IfcBuildingElementProxy, IfcColumn, IfcMember, IfcPlate, IfcRailing, IfcRoof, IfcSlab, IfcStairFlight, IfcWall, and IfcWallStandardCase. FIG. 8 illustrates a geometrical representation of building 102, and specifically geometry elements 650a-n of a 3D building model 615 according to an embodiment.

Spatial data defines non-physical representation of logical areas, regions, or spaces located within a building and how they are organized. Spatial data may comprise a plurality of spatial elements representing spaces of a building. For example, referring to FIG. 5, spatial building objects may include IfcBuilding, IfcBuildingStorey, IfcProject, IfcSite, and IfcSpace (Rooms). A spatial element represents an area or volume bounded actually or virtually. For example, a spatial element may represent a room, a hallway, a staircase, or the like, within a building. Spaces may have physical boundaries defined by building elements, such as walls, doors, and windows. However, spaces may be defined with virtual boundaries, such as subdividing work spaces in an open floor office layout, or subdividing living spaces in a studio apartment. FIG. 9 illustrates spatial elements 651a-n of a 3D building model 615 according to an embodiment.

Two or more spatial elements within a building may be grouped into spatial structures organized in a hierarchical tree. A spatial structure can span over several connected spatial elements. For example, a spatial structure, such as IfcBuildingStorey, may comprise a floor of a building (i.e., level, story, or storey) comprising a group of horizontal aggregation of spatial elements such as rooms and hallways that are vertically bound. The hierarchical order of spatial structures of a building from high to low may comprise: campus, building, floor, and space. Building floors can be organized hierarchically from the bottom floor to the top floor of the building. Spatial data further comprises an identifier and name of the spatial elements and structures. Spatial elements are mapped to the physical building elements. As such, each building element within a space is mapped to a spatial element of the space. A spatial element may contain a plurality of building elements within its boundaries.

In step 214, the geometry data file and the spatial data file may be stored on the database 106 in separate database fields identified using the node ID of building 102.

In step 216, each spatial element in the spatial data file is associated with a space node. Each building node ID may include a list of spaces or space nodes, such as rooms located within the associated buildings, organized in a tree topology, with the building as the root, floors as children, and individual spaces as sub-children. Each spatial element is mapped to a space node. The space nodes identify the spaces located within the building 102 and may further identify the types of spaces, i.e., what the spaces are being used for. For example, the space nodes may identify the lobby, hallways, conference rooms, office spaces, bathrooms, etc., in a commercial building 102, or the kitchen, living room, bedroom, bathrooms, etc., in a residential building. The identification of the space nodes may be changed by the user at any time when the utilization of the space changes. This tree topology may be stored in database 106.

In step 218, each space node is associated with one or more electronic devices 105 installed within the building 102. This can be accomplished by first performing a discovery process by discovering all the electronic devices 105 connected to the local area network 129 within the building 102. The server 110 may communicate to the control system processors 103 to discover electronic devices 105 connected to the local area network 129. In another embodiment, server 110 can communicate directly with electronic devices 105 via networks 108 and 129 if for example these devices are in direct communication with the server 110 without the use of control system processors 103. The discovery process may provide a list of electronic devices 105. Each electronic device 105 may be identified by a unique ID, such as the device's serial number, as well as a model number, device name, device type, or the like. Each such electronic device 105 is associated with a space node. For example, all electronic devices 105 located within a conference room are associated with the conference room space node. This can be accomplished by manual association by the user or with the assistance of the building model visualization as will be further described below. This association allows for monitoring and controlling the building 102 space by space. This association may be stored in database 106.

In step 220, the building management application 112 can selectively recall the geometry data file and spatial data file from the database 106 using the node ID of building 102 to render a 3D building visualization of building 102 via a web-browser on a user communication device 101a-n. The web-browser on a user communication device may comprise a WebGL (Web Graphics Library) viewer configured for rendering the building model of building 102 using the geometry data file and the spatial data file. WebGL is a JavaScript application programming interface (API) integrated into the web standards of most modern web-browsers. It enables any compatible web-browser to render 3D computer graphics as part of the web page canvas without the use of any third-party software or plug-ins. Using the JSON geometry data file and spatial data file, it can render the 3D model of building 102 onto an HTML5 canvas element.

In step 222, the spatial elements or a space may be rendered with status visualization of electronic devices 105 or environmental conditions by selectively recalling various status information using the space nodes. Particularly, status information may be reported to the building management server 110 either directly by the electronic devices 105 within building 102 or via control system processors 103.

Reported status information may comprise live data or real-time state of an electronic device 105 or environmental conditions of a space. Additionally, status information of electronic devices 105 or environmental conditions of a space may be collected and archived in database 106. As such, status information may comprise historic state of an electronic device 105 or an environmental condition. Such status information is correlated with the space node using the association of each electronic device with a space node. Status information comprising the live or historic state of electronic devices 105 of each space node may be visualized by modifying the appearance of the spatial element associated with the space node. Status visualization may be rendered by modifying the properties of a spatial element, for example by modifying the color, pattern, pattern color, transparency, or the like of the spatial element's fill, volume, face, outline, shadow, or the like, or modifying the spatial element's outline thickness, outline pattern, or the like, and any combinations thereof.

For example, the user may select to view current occupancy of building 102. Each occupancy sensor in building 105 may report its occupancy status. Each occupancy status is correlated with a space node. The building management application 112 may recall real-time status information for each space node to determine the occupancy status of the space node. Using the occupancy status of a space node, an associated spatial element in the 3D building model may be visualized by modifying the fill color of the spatial element, for example to blue for occupied and green for vacant.

According to an embodiment, during the real-time or "live" status view of a space node, the building management application 112 may substantially continually query electronic devices 105 for live status information of a space node and substantially continually re-render the spatial elements of the 3D building model with the latest status information. In another embodiment, the building management application 112 may stagger status refresh to lessen the burden on browser resources when rendering room specific information. Real-time response rate may burden the system and browser. Thus, instead of continuously querying for status information and refreshing the rendering of the 3D building model, the building management application 112 may periodically query for status information, for example every fifteen seconds. As such, the building model 615 may be refreshed only periodically, preventing overburdening of the browser.

In another embodiment, the building management application 112 can implement status caching during the real-time or "live" status view of a space node. For each displayed real-time status information of a space node, the building management application 112 can query electronic devices 105 associated with the space node for the latest status information. Before sending the latest status information to the browser, the building management application 112 can compare the latest status information to the immediately preceding retrieved status information. The building management application 112 can then determine whether the latest status information has changed from the immediately preceding status information retrieval. The building management application 112 can send any changed status information to the browser and re-render the 3D building model only if the status information has been changed. No re-rendering of the 3D building model occurs if the currently displayed status information has not been changed. The building management application 112 can then store the latest status information to be compared to the subsequently received status information. This limits the amount of data sent to the browser, lessening the burden on the browser.

In step 224, spaces may be controlled within the building 102 by selectively transmitting control commands to electronic devices associated with the space nodes. For example, a user may select a spatial element or a space on the 3D building model and indicate to turn lights off in that space. The building management application 112 can identify the space node associated with the spatial element, and the electronic devices 105, such as lighting switches, associated with the space node. The building management application 112 can therefore send a command to the control system processors 103 within the building 102 to change the state of the identified light switches to an off position.

The above disclosed method is not meant to limit the aspects of the embodiments, or to suggest that the aspects of the embodiments should be implemented following the aforementioned method. The purpose of the aforementioned method is to facilitate the understanding of one or more aspects of the embodiments and to provide the reader with one or many possible implementations of the processed discussed herein. It should be understood by one of ordinary skill in the art that the steps of the aforementioned method may be performed in a different order and that some steps may be eliminated or substituted. For example, steps 210 and 212 may occur in a reverse order, and step 218 may occur before step 202.

FIG. 3 illustrates a block diagram 300 showing a signal flow between one or more user communication devices 101a-n and the server 110 for rendering the 3D building management system visualization on-demand via a web-browser on a user communication device 101a-n according to an embodiment. Various modules are shown run on the server 110 and the browsers of the user communication devices 101a and 101b for carrying out the rendering the 3D building management system visualization. These modules may be part of one or more engines of the building management application 112 discussed above, such as the 3D building visualization rendering engine 132 and the user interface engine 133, and may leverage data available in data storage areas. The various modules may include software, hardware, and/or firmware components for performing various functions.

User communication device 101a may be used to begin the setup of the 3D visualization of the building management system for building 102. A user may use a web-browser 301a of a user communication device 101a to load and access a "Setup" page 302. The "Setup" page 302 may be accessed using a uniform resource locator (URL) link. Before accessing the "Setup" page 302, a user may create an account, or login into an existing account using a username and password. Each account may be associated with one or more buildings, such as building 102. After creating or logging into an account, the user may begin setting up the 3D visualization of building 102. At this stage, the server 110 may generate a node ID for building 102. The "Setup" page 302 may comprise an IFC uploader 311 configured to provide a user interface for uploading a building model data file, such as an IFC file 305a, to the server 110.

FIG. 4 illustrates a schematic diagram depicting the "Setup" page 302 of the building management application 112 according to an embodiment. The "Setup" page 302 may comprise fillable fields into which the user can enter various information related to building 102, such as the building name 404 and address 406, or the like. The "Setup" page 302 may further comprise an "Upload 3D Model" button 412, which upon pressing may show an "Upload File" popup or floating window 414. The user may use the "Browse" button 416 to locate and select the desired building model data file, such as an IFC file 305a, to upload to server 110. The IFC file 305a may be stored on the user communication device 101a. Selection of a desired IFC file 305a directs the IFC uploader 311 to the location of the building model data file on the user communication device 101a. After selecting the desired IFC file 305a, the user may press the "Upload" button 418 to begin the uploading process.

After selecting the IFC file 305a, the IFC uploader 311 may be further configured to display a list of building objects the user may wish to include or exclude in the IFC file to upload to the server 110. FIG. 5 illustrates a schematic diagram of the "Setup" page 302 depicting a "Select/Deselect Building Objects" popup or floating window 500 configured for allowing the user to select or deselect building objects according to an embodiment. As discussed above, the IFC file may comprise various structural building objects as well as non-structural building objects, such as pipes, ducts, electric wiring, or the like. The IFC uploader 311 may be configured to scan the IFC file 305a, extract a list of building objects from the IFC file 305a, and list them to the user with an option to select or deselect as is shown in FIG. 5. The building objects may be listed alphabetically. The user can use the object list to select or deselect any objects the user wishes to include or exclude in the building model.

According to an embodiment, as a default, the IFC uploader 311 may automatically identify and select recommended structural building objects and their interrelationships that can be used to represent a 3D representation of building 102 properly, such as walls, floors, ceilings, as well as functional objects. The IFC uploader 311 may automatically deselect unnecessary building objects, such as pipes, ducts, electric wiring, or the like. As such, the IFC uploader reduces the amount of data in the IFC file to the bare minimum information required to represent the building 102 as a 3D model. The IFC uploader 311 may present a list of recommenced selected building objects 502. The list of recommenced selected building objects 502 may include, for example, IfcProject, IfcSite, IfcBuilding, IfcBuildingStorey, IfcSpace (Rooms), IfcBuildingElementProxy, IfcColumn, IfcMember, IfcPlate, IfcRailing, IfcRoof, IfcSlab, IfcStairFlight, IfcWall, and IfcWallStandardCase. The IFC uploaded 311 may also present a list of optional unselected building objects 504 for review and further selection/deselection by the user. The user may select to exclude any recommended building elements or include any of the optional building objects as desired. To reset the selection to the default selection, the user may press the "Reset" button 506. In another embodiment, the IFC uploader 311 may present to the user a list containing only the optional building object to select for inclusion. The IFC uploader 311 may restrict deselection of the recommended building objects to prevent system errors. After selecting the desired objects to include in the IFC file 305a, the user may press the continue button 508 to upload the IFC file 305a with the selected building objects.

Referring back to FIG. 3, the IFC uploader 311 may next issue an upload command 312 to upload the IFC file 305a comprising the selected building objects to the server 110. While the IFC uploader 311 uploads the file, the "Setup" page 302 may display status information to the user, such as "importing . . . ," "converting . . . ", "done". Meanwhile, the IFC uploader 311 takes the IFC file 305a comprising the selected building objects from the user's web-browser 301a and sends it to the server side 110. As a result, a copy 305b of the IFC file is created on the server. The copied IFC file 305b, however, only contains the selected building objects. The copied IFC file 305b may be temporarily stored on the server 110 for further processing. The node ID of building 102 may be assigned by the server 110 to the copied IFC file 305b.

The IFC uploader 311 also triggers a conversion trigger 313. The server 110 may comprise an IFC importer 320 configured for transforming the IFC file into a format capable of being rendered on-demand via a web-browser. The IFC importer 320 may comprise a conversion manager 321, an IFC converter 323, and a data extractor 325. The conversion manager 321 is configured for managing the conversion process. The conversion manager 321 receives the conversion trigger 313 indicating that a new IFC file is being uploaded to the server 110. The conversion manager 321 monitors whether or not the IFC file was copied to the server 110. Particularly, the conversion manager 321 continually monitors the server directory to check whether the IFC file copy 305b exists. Once the conversion manager 321 finds an IFC file copy 305b on the server directory it issues a conversion command 314 to the IFC converter 323. The conversion command 314 may comprise a command for triggering a conversion of the IFC file copy 305b as well as location parameters identifying the location of the IFC file copy 305b on the server 110.

The IFC converter 323 receives the IFC file copy 305b and converts it into web-browser recognizable format, i.e., a "web friendly" representation of IFC data. The IFC converter 323 may comprise a Java based converter. For example, the IFC converter 323 may convert the IFC file copy 305b into a format for WebGL rendering. The IFC converter 323 may convert the IFC file copy 305b to JSON file 315. The conversion manager 321 monitors whether or not the IFC converter 323 has finished converting the IFC file copy 305b. Particularly, the conversion manager 321 continually monitors the server directory to check whether the JSON file 315 exists in the server directory. Once the conversion manager 321 finds the JSON file 315 on the server directory it issues an extraction command 316 to the data extractor 325. The extraction command 316 may comprise a command for triggering the parsing of the JSON file 315 as well as location parameters identifying the location of the JSON file 315 on the server 110.

The data extractor 325 receives the JSON file 315 and parses the JSON file 315 to separate the spatial data from the geometry data. As discussed above, the converted building model data file 315 comprises geometry data and spatial data of building 102 in a single file. Geometry data comprises geometry elements defining the geometrical representation of physical building elements and their relationships. Spatial data defines a non-physical representation of a logical area, region, or space located within a building. After the IFC file copy 305b has been converted to the JSON file 315, the JSON file 315 is fed to the data extractor 325. The data extractor 325 parses the JSON file 315 to separate the spatial data from the geometry data. Separating the spatial date from geometry data allows for the building management application 112 to reference and recall this data individually to enable proper space management as will be later described. Data extractor 325 generates a geometry data file 334 and a spatial data file 335. The conversion manager 321 monitors whether or not the data extractor 325 has finished parsing the JSON file 315. Particularly, the conversion manager 321 continually monitors the server directory to check whether the geometry data file 334 and the spatial data file 335 exist in the server directory. Once the conversion manager 321 finds the geometry data file 334 and the spatial data file 335 it issues a transfer command 318. The transfer command 318 may comprise a command for triggering data transfer 336 of the geometry data file 334 and the spatial data file 335 from server 110 to the database 106 for storage, along with the node ID of building 102.

The geometry data file 334 and a spatial data file 335 are stored on the database 106 in separate database fields identified using the node ID of building 102. The geometry data file 334 and spatial data file 335 may be recalled from database 106 using the node ID of building 102 for on-demand rendering on a user communication device, such as user communication device 101b.

After the 3D model has been loaded to the system server 110, a user can at any time and from any location access and interact with the 3D visualization of building 102 within a web-browser, all without any third-party software or browser plug-ins. To view the 3D visualization of building 102, a user can load a "Building Management" page 303 via web-browser 301b on user communication device 101b. The building management application 112 may comprise a data service manager 331 that communicates with the browser 301b to facilitate the data that is transmitted from the server 110 to the web-browser 301b. The web-browser 301b can communicate with the server 110 via Asynchronous JavaScript and XML (AJAX) calls. AJAX is a set of web development techniques used on the client-side to create asynchronous web applications. With AJAX, web applications can send data to and retrieve from a server asynchronously (in the background) without interfering with the display and behavior of the existing page.

After logging into an account associated with node ID of building 102, the web-browser 301b can communicate with the data service manager 331 of the server 110 to present to the user via the "Building Management" page 303 a list of building names associated with the logged-in account for selection. As discussed above, each building may be identified by a node ID. After the user selects a building, a retrieve request 337 comprising the building's node ID is made to the data service manager 331 to retrieve building model data of the selected building. The user may select a building, such as building 102, for management. The data service manager 331, upon receiving the retrieve request 337 containing the node ID, sends a query 338 to the database 106 with the node ID requesting the database 106 to transmit building model data related to the node ID. The database 106 transmits a data stream 339 comprising the geometry data file 334 and spatial data file 335 associated with the node ID to the web-browser 301b. The web-browser 301b may comprise a WebGL viewer 304 configured for rendering the building model of building 102 using the geometry data file 334 and a spatial data file 335.

The building management application 112 of the present embodiments further allows users to use the 3D visualization of the building 102 to navigate, monitor, and control building 102 and its individual rooms and floors. While 3D BIM models are designed to convey information about the physical space of a building, the building management application 112 provides a 3D visualization of the building 102 to convey information about the building's status.

FIG. 6 illustrates a schematic diagram depicting a "Building Management" page 303 of the building management application 112 showing a perspective view of a 3D building model 615 of building 102, according to an embodiment. The "Building Management" page 303 may be accessed using a URL. Upon opening the "Building Management" page 303 via a browser on any user communication device 101a-n a user may be presented with this screen. "Building Management" page 303 may include a 3D visualization section 601 configured for rendering a 3D building model 615 of building 102 as described above.

"Building Management" page 303 may further include a menu bar 610 comprising various selectable buttons. The menu bar 610 may comprise a plan view icon button 611, a front view icon button 612, and a perspective view icon button 613. Selecting the plan view icon button 611 may display the plan view of the building model 615 and center the 3D building model 615 within the 3D visualization section 601 (see, e.g., FIG. 7). Selecting the front view icon button 612 may display the front view of the building model 615 and center the 3D building model 615 within the 3D visualization section 601. Selecting the perspective view icon button 613 may display the perspective view of the building model 615 and center the 3D building model 615 within the 3D visualization section 601, as shown in FIG. 6.

The building management application 112 further allows for free form zooming, panning, and orbiting. The menu bar 610 may comprise a zoom-in icon button 616 and zoom-out icon button 617 configured for allowing a user to zoom in or out of building model 615. The menu bar 610 may further include a "Pan" radio button 618, a "Rotate" radio button 619, and left, right, up, and down arrow icon buttons 620. When the "Pan" radio button 618 is selected, pressing the arrow buttons 620 allows a user to pan the building model 615 (i.e., horizontally scroll along the building model 615). The user can navigate about the building model 615 by a click-and-drag motion using the mouse cursor. In other words, clicking and dragging the cursor in particular direction on the 3D visualization section 601 will move the building model 615 in the same directly. From any panned position, the user can return to a centered view by clicking any of the plan view, front view, or perspective view icon buttons 611, 612, and 613. When the "Rotate" radio button 619 is selected, pressing the arrow buttons 620 allows a user to axially rotate the building model 615.

Next, the menu bar 610 may include a "Structure" button 623, "Spaces" button 624, and "All" button 625. As discussed above, the geometry data file 334 and spatial data file 335 may be recalled from database 106 individually. FIG. 8 illustrates a schematic diagram of the "Building Management" page 303 showing a plan view of a geometrical representation of the first floor of the 3D building model 615 according to an embodiment. When the "Structure" button 623 is pressed, the geometrical representation of building objects or the geometry elements 650a-n are visible, including walls, floors, doors, etc. The geometry elements 650a-n are rendered using the geometry data file 334. FIG. 9 illustrates a schematic diagram of the "Building Management" page 303 showing a plan view of the spatial elements of the first floor of the 3D building model 615 according to an embodiment. When the "Spaces" button 624 is pressed, spatial elements or spaces 651a-n of the building model 615 are visible. Spatial elements 651a-n are rendered using the spatial data file 335. FIG. 10 illustrates a schematic diagram of the "Building Management" page 303 showing a plan view of geometry elements 650a-n and spatial elements 651a-n of the first floor of the 3D building model 615 according to an embodiment. When the "All" button 625 is pressed, both the geometry elements 650a-n and spaces 651a-n of the building 102 are visible.

Geometry elements 650a-n and spatial elements 651a-n can be selectively viewed or "removed" from view by changing their opacity levels. For example, in FIG. 8 the opacity of all spaces 651a-n is set to 0% and the opacity of the geometry elements 650*a-n* associated with the first floor is set to 100%. If the user then clicks on the "Spaces" button 624, the view of the building model 615 is changed to FIG. 9 by changing the opacity of all geometry elements 650*a-n* to 0%, changing the opacity of the spaces 651*a-n* associated with the first floor to 100%, and re-rendering the building model 615. In FIG. 10, the opacity of the geometry elements 650*a-n* and spaces 651*a-n* associated with the first floor are set to 100%. This selective representation of geometry elements 650*a-n* and spaces 651*a-n* may be effectively used to represent the status of the individual spaces of the building as is further described below.

The building model 615 can be viewed at the building level, floor level, or individual spaces. FIG. 6 illustrates the building model 615 at the building level. The menu bar 610 may comprise an up floor icon button 621 and a down floor icon button 622. Selecting the up floor icon button 621 from the building level shown in FIG. 6 may display the plan view of the top floor of the building 102. Referring to FIG. 7, there is shown a schematic diagram of the "Building Management" page 303 showing a plan view of the top floor of the 3D building model 615 according to an embodiment. The top floor of building 102 is displayed by removing the roof, and any structural elements above the top floor, including the ceiling of the top floor, as will be later described in greater detail. Accordingly, the individual spaces, such as rooms and hallways, can be viewed at the floor level. Following selection of the down floor icon button 622 will remove the top floor and display the floor immediately below the top floor. The user can keep pressing the down floor icon button 622 until reaching the first floor of the building (i.e., the bottommost floor) as shown in FIG. 8. Similarly, selecting the down floor icon button 622 from the building level (FIG. 6) may display the plan view of the first floor of the building 102 as shown in FIG. 8. The first floor of building 102 is displayed by removing the roof, the floors above first floor, and any structural elements above the first floor, including the ceiling of the first floor, such that the spaces at the first floor can be clearly viewed. While FIG. 8 shows building model 615 with the outer building walls intact, for tall building, portions of the outer building walls above the floor that is in real-time view can also be removed for clarity.

In order to correctly render the requested floor of the building model using the up floor and down floor icon buttons 621 and 622, the building management application 112 keeps a count of the floors. FIG. 11 illustrates a flowchart 1100 showing the process for determining which floor of the 3D building model 615 to render according to an embodiment. As a default, in step 1102, the counter N may be set to the value corresponding to the main level, such as the ground or street level of the building. For example, the main level can correspond to the value of 1. In another embodiment, another default value may be chosen, such as a value representing the topmost level or the bottommost level, such as a basement or a level below the ground. For example, the default value may be a negative value representing a level below the ground.

The building management application 112 may receive various inputs from the user identifying which floor the user wishes to view next. For example, in step 1104, a user may press the up floor icon button 621 when the building model 615 is being rendered at the building level view as shown in FIG. 6. In step 1106, the counter N may be set to the value corresponding to the top level. For example, if the building has three stories, the counter N can be set to 3. Then in step 1108, the building management application 112 will render the top floor of the building as indicated by the counter. In this scenario, the third floor of the building model 615 will be visible, as shown in FIG. 7.

In step 1110, the user may return to the building level view shown in FIG. 6 and press the down floor icon button 622. In step 1112, the counter N may be set to the main level or the first floor level (e.g., N=1). In another embodiment, the counter N may be set to the bottommost level. Then in step 1108, the building management application 112 will render the main level of the building model 615 as indicated by the counter N. For example, as shown in FIG. 7, the building management application 112 may render the first floor.

In step 1118, while viewing the first floor, the user may then press the down floor icon button 622. In step 1120, it is checked whether the counter is greater than the value identifying the bottom level. For example, the bottommost level of a building may be its ground floor and the value identifying the bottom level may be 1. If the counter is greater than the bottom level value, then the counter is decremented by 1 in step 1122. If the counter is not greater than the bottom level value, then no change occurs to the rendered building model in step 1124. In the present example, because the first floor is being rendered (i.e., the bottommost level), the counter is not greater than the bottom level value 1, and the building model 615 remains the same as there are no floors below the first floor. If a building would have contained a level below the ground level, then that level would be shown. If for an instance the second floor is first being rendered, then the counter would be greater than the bottom level value 1, and in step 1122 the counter will be decremented to 1. Accordingly, in step 1108 the building management application 112 will render the first floor of the building 102.

Then, in step 1126, while viewing the first floor view, the user may then press the up floor icon button 621. In step 1128, it is checked whether the counter is less than the top level of the building. In this scenario, it is checked whether the counter N is less than 3. If the counter is less than the top level (i.e., 3), then the counter is incremented by 1 in step 1130. If the counter is not less than the top level (i.e., 3), then no change occurs to the rendered building model in step 1124. In the present example, because the first floor is being rendered, the counter 1 is less than the top level (i.e., 3). The counter is incremented to 2 in step 1130, and in step 1108 the second floor is being rendered.

A floor may also be selected from the tree data structure 421 (e.g., FIG. 7) by pressing on the node of desired floor, such as floor node 424*c* for "Floor 3", as will be described in further detail below. Pressing on the node of the desired floor will set the counter N to the selected level. For example, if floor node 424*c* for "Floor 3" was pressed, counter N will be set to 3, and in step 1108 the third floor will be rendered as shown in FIG. 7.

The building management application 112 changes the visibility of floors by reviewing the hierarchical organization of the building. The building management application 112 keeps count of the floor that the user is viewing as discussed above to determine which floor the user wishes to view next. The building management application 112 isolates the floors and identifies child spaces associated with each floor. As discussed above, floors, such as IfcBuildingStorey, are spatial structures comprising a group of horizontal aggregation of spatial elements such as rooms and hallways that are vertically bound. Each spatial element is mapped to the physical building elements. Upon a selection of a floor view, the building management application 112 iterates through each identified spatial element to identify mapped geometry elements and sets the opacity of the spatial elements and mapped geometry elements to 0% or 100% based on the floor count. For better plan view of the individual floors in the 3D model, it is preferred that the mapped geometry elements of each space nodes include the floor, but not the ceiling.

FIG. 12 illustrates a flowchart 1200 showing the process for rendering a floor of the 3D building model of building 102 according to an embodiment. In step 1202, the building management application 112 receives a request to render floor N. In step 1204, child spaces mapped to floor N are identified. In step 1206, for each identified space of floor N, the building management application 112 identifies mapped geometry elements of building elements. In step 1208, for each identified space and mapped geometry elements of floor N, the opacity is set to 100%. If the user chooses to see only the structure of floor N by pressing "Structure" button 623, then the opacity of the identified geometry elements of floor N is set to 100% and the opacity of spatial elements is set to 0%. Similarly, if the user chooses to see only the spaces of floor N by pressing the "Spaces" button 624, then the opacity of the identified geometry elements of floor N is set to 0% and the opacity of spatial elements is set to 100%.

In step 1210, the opacity of the roof building object, such as IfcRoof, is set to 0%. IfcRoof is a description of the total roof that acts as a container entity which aggregates all components of the roof.

In step 1212, the building management application 112 identifies the floors located above floor N. If a user wants to view the first floor of building 102, then in step 1212 the building management application 112 will identify the second and the third floors. In step 1214, the building management application 112 will identify the child spaces mapped to each of the identified floor above floor N, such as rooms, hallways, staircase, etc. Next, in step 1216 for each identified space of floors above floor N, the building management application 112 identifies mapped geometry elements. In step 1218, the opacity of each identified space (i.e., spatial element) and mapped geometry elements corresponding to floors above floor N are set to 0%. Finally, in step 1220, the building management application 112 re-renders the building model 615.

Referring to FIG. 6, the "Building Management" page 303 may further include a building tree section 420 within the same browser window as the 3D visualization section 601. The building tree section 420 is configured for displaying a hierarchical tree data structure 421. The tree data structure 421 may include an account node 422 as the root node comprising one or more building nodes 423a-n of buildings associated with the account. For example, building node 423a may be associated with building 102. Each building node, such as building node 423a, may include a list of space nodes 425a-n, such as spaces or rooms, located within the associated building. The space nodes 425a-n may be organized in a tree topology, with the building node 423a as the root, floors nodes 424a-n as children, and individual space nodes 425a-n as sub-children. Exterior space nodes may be organized under the ground floor (e.g., "Floor 1"), or under a separate node. The tree topology may further contain department nodes (not shown) that organize space nodes on each floor by departments.

Referring to FIG. 4, the tree data structure 421 may be created and modified using the "Configure Building Node Tree" button 408 on the "Setup" page 302. Pressing the "Configure Building Node Tree" button 408 bring up a "Configure Tree" popup or floating window 430. Using window 430, the user may add a node to building node 423a for building 102 by pressing the add icon button 431. For example, to add a floor node 424a-n under building node 423a of building 102, the user may select the building node 423a within window 430 and then press the add icon button 431. To add a space node 425a-n under a floor node 424a-n, such as a room on the first floor, the user may select floor node 424a for "Floor 1" within window 430 and press the add icon button 431. The user may delete a node, such as a room, by pressing the delete icon button 432. The user may enter or change the names of any of the nodes using fillable fields 435.

In another embodiment, upon adding a node, the building management application 112 may automatically prepopulate the fillable field 435 with a default node name. A first added child node under a building node 423a-n may be prepopulated with "Floor 1" and any subsequently added child nodes under the building node 423a-n may be assigned a name with an incremented count of the floors. A first added child node under a floor node 424a-n may be prepopulated with "Room 1" and any subsequently added child nodes under the floor node 424a-n may be assigned a name with an incremented count of the rooms. The user may change the default name in the fillable fields 435. The user may return to the "Setup" page 302 of building 102 at any time to reconfigure the tree data structure 421 and the names of the nodes, for example due to construction or change of room utilization. The tree data structure 421 may be created before or after the upload process of the 3D building model.

After the 3D model has been loaded to the server 110 and the various electronic devices 105 have been installed in building 102, the 3D visualization of building 102 may be used in the commissioning process undertaken by programmers and building managers. By utilizing the interactive 3D visualization of building 102, the commissioning process is made more time and cost effective and provides an effective means for testing and troubleshooting the building management system. The 3D visualization provides a visual aid for creating zones, associating electronic devices 105 to those zones, associating a plurality of electronic devices 105 together in groups, and assigning controllable devices to control points and sensors.

Particularly, after creating the tree data structure 421 and uploading the 3D model 615 of building 102, the user next associates each spatial element in the spatial data file with a space node. The menu bar 610 (FIG. 6), may comprise a "Room Detail" button 631 that upon pressing pulls up a room detail popup or floating window configured for configuring, monitoring, and controlling individual spaces. FIG. 13 illustrates a schematic diagram of the "Building Management" page 303 depicting an "Assign Room" tab 1301 of the "Room Detail" popup or floating window 1300, according to an embodiment. The "Assign Room" tab 1301 displays a selectable tree structure 1302. Selectable tree structure 1302 is similar to tree data structure 421, but it only comprises the tree structure for the building node 423a of building 102, which is being rendered by the building management application 112. Building tree structure 1302 comprises a plurality of selectable node fields 1303, such as check boxes, each associated with a space node.

To associate or assign the spatial elements to the space nodes, the user may first navigate to the desired spatial element on the 3D building model 615. For example, a user may wish to assign spatial element 651e to the "Conf. Room 1" space node 425e. The user may easily navigate to view the spatial element 651e by pressing the down floor icon button 622 to arrive at the first floor and zoom in to the spatial element 651e using the zoom-in icon button 616. The user can then click on to select a desired spatial element on the 3D building model 615 and then click to add a check in the selectable node field associated with a space node in the building tree structure 1302. For example, the user can click on spatial element 651e and check the selectable field 1305 associated with "Conf. Room 1" space node 425e in the building tree structure 1302. The user can then click on the "Save" button 1306 to save the change. In response, the building management application 112 makes an association between the selected spatial element 651e and the selected space node 425e and saves the association in database 106. The user can then move onto assigning the next spatial element to a space node. The user can continue associating spaces on the 3D model 615 with the space nodes in the building tree structure 1302 until all spaces nodes have been assigned.

According to one embodiment, the 3D building visualization feature may be added to an already existing building management system with already existing tree data structure 421. Each space node within the tree data structure 421, such as "Conf. Room 1" space node 425e, may be already associated with one or more electronic device 105 installed in building 102. These associations may be stored in the database 106 (FIG. 1). For example, space node 425e may be associated with a lighting control device, a display device, a presentation capturing device, and an occupancy sensor. As such, after completing the "Assign Room" stage, the user can begin monitoring and controlling electronic devices 105 and environmental settings of building 102.

In another embodiment, the space nodes 425a-n may be still unassigned to electronic devices 105. In such a case, the user proceeds to the step of associating each space node 425a-n with one or more electronic devices 105 installed in building 102. FIG. 14 illustrates a schematic diagram of the "Building Management" page 303 depicting an "Assign Assets" tab 1401 of the "Room Detail" popup or floating window 1300, according to an embodiment. The "Assign Assets" tab 1401 may initially display a "Discover" button (not shown) configured for initiating a discovery or search mode. During the discovery mode, the server 110 communicate with the control system processors 103 to discover the electronic devices 105 installed in building 102, and specifically electronic devices 105 connected to the local area network 129 within the building 102 (FIG. 1). In another embodiment, server 110 may directly query the local area network 129 to discover electronic devices 105 connected to the local area network 129 within the building 102. The discovery process may provide a list of discovered electronic devices 105.

Referring to FIG. 14, after the discovery process is complete, the "Assign Assets" tab 1401 may display a list 1402 of discovered electronic devices 105 in building 102. Each electronic device 105 may be identified by a unique ID, such as the device's serial number, as well as a model number, device name, device type, or the like. Electronic devices 105 that are still unassigned to space nodes 425a-n may be listed in the "Unassigned Assets" section 1406.

According to one embodiment, to associate a space node 425a-n with an electronic device 105, the user may click on to select a spatial element 651a-n on the 3D building model 615. For example, as shown in FIG. 14, the user can click on spatial element 651e. Since spatial element 651e is associated with "Conf. Room 1" space node 425e, that space node may also be selected by being outlined or highlighted in the building tree section 420. Additionally, after selecting a spatial element on the 3D building model 615, a "Devices in [space node name]" section 1408 may be displayed for the selected space node 425e. The [space node name] text field may be prepopulated with the name of the selected space node. In this example, after selecting spatial element 651e on the 3D building model 615 associated with "Conf. Room 1" space node 425e, a "Devices in Conf. Room 1" section 1408 is displayed.

Section 1408 lists any electronic devices 105 in building 102 that are already associated with space node 425e. If no electronic devices 105 have been associated, that section 1408 would be blank. Next, the user can scrawl through the unassigned electronic devices in list 1402 to find electronic devices located in a physical space within building 102 that corresponds to the space node 425e. The user can identify such devices based on the devices' serial number. The user may read the a label printed with the serial number on a device located in conference room 1 within building 102 and search for that device in list 1402. For example, the device in the physical space may be an occupancy sensor GLS-ODT-C-NS 1411, available from Crestron Electronics, Inc. of Rockleigh, N.J. After finding the occupancy sensor 1411 in the list 1402, the user can click on that device 1411 and press the add icon button 1404 to add the device to the section 1408 under "Devices in Conf. Room 1". The user can then click on the "Save" button 1412 to associate electronic device 1411 with space node 425e. That association is saved in database 106.

After identifying all the devices located within conference room 1, as discussed above, the user may select a different spatial element 651a-n within building model 615 to associate electronic devices 105 to a space node of that spatial element. Because the 3D model 615 is a visual representation of building 102, it significantly assists programmers and building managers to identify correct rooms within the building.

According to another embodiment, as shown in FIG. 15, the electronic devices 105 may be equipped with commissioning means configured for enabling the building management server 110 to automatically identify the electronic devices 105. For example, one or more electronic devices 1505a-i can comprise light switch 1505a, a light dimmer 1505b, a keypad 1505c for controlling various types of loads (e.g., lights, shades, audio), an occupancy sensor 1505d, a lighting device 1505e, a motorized shade device 1505f, a content control device 1505g, a display screen 1505h, and a thermostat 1505i, as some examples. According to one embodiment, one or more of the electronic devices 1505a-i may comprise sensors 1507a-h. For example, light switch 1505a, a light dimmer 1505b, a keypad 1505c, occupancy sensor 1505d, and lighting device 1505e may comprise light sensors 1507a-e, which are already utilized in many such or similar devices for proximity detection and light harvesting purposes to effectively cut energy costs. Each light sensor 1507a-e can comprise a photosensor configured for detecting visible light and measuring light intensity.

In another example, the motorized shade device 1505f, the content control device 1505g, and the display screen 1505h may comprise infrared (IR) sensors or receivers 1507f-h, which are also commonly utilized by many electronic devices such as audiovisual equipment and other remote controlled equipment. Sensors 1507a-h may comprise other types of sensors, such as ultraviolet (UV) energy sensors, ultrasonic sensors, sound sensors, microphones, ambient temperature sensors, or the like.

To trigger the sensors, a sensor blaster 1501 may comprise one or more sensor triggers 1502a-b. For example, one sensor trigger 1502a may comprise a flash light configured for triggering light sensors. Another sensor trigger 1502b may comprise an infrared (IR) blaster configured for triggering IR sensors. Other triggers are contemplating, for example, to trigger respective ultraviolet (UV) energy sensors, ultrasonic sensors, sound sensors, microphones, ambient temperature sensors, or the like.

In commissioning an electronic device, i.e., to associate an electronic device to a space node, the programmer may enter a physical room or space within building 102, such as the conference room 1. The user may load the building management application 112 on a portable user communication device 101a-n, such as a laptop computer, and select to render 3D building model 615 of building 102. Using the 3D building model 615 the user may quickly and intuitively visually locate the room the user has entered into by navigating to the view of the room in the 3D building model 615—e.g., the user may navigate to the plan and zoomed in view of conference room 1 as shown in FIG. 14.

The user can then select the desired spatial element 651e and open the "Assign Assets" tab 1401 in the "Room Detail" window to load the discovered electronic devices list 1402. The "Assign Assets" tab 1401 may further comprise a "Commissioning Mode" button 1414 configured for setting the building management system 100 in a commissioning mode. In the commissioning mode, the server 110 may instruct the control system processors 103 to "listen" for or detect sensor triggers. Where the building management system 100 does not comprise control system processors 103, then the server 110 "listens" for sensor triggers.

Using the sensor blaster 1501, the user may trigger a sensor of an electronic device installed within conference room 1. For example, the user may bring the flashlight 1502a in direct proximity to the light sensor 1507d of the occupancy sensor 1505d and activate the flashlight 1502a to flash the light sensor 1507d. In response, the light sensor 1507d will record a trigger or a spike in its measured light intensity and report its output, either directly or indirectly, to the building management application 112 on server 110. In an embodiment, to reduce false triggers, the building management application 112 may only act upon sensor triggers that exceed a predetermined threshold value.

The building management application 112 may use the received light sensor trigger to visually indicate to the user which device from the list of discovered devices 1402 reported a sensor trigger. The building management application 112 may scrawl through the list of discovered devices 1402 to bring the triggered device into view of the user interface and highlight, blink, outline, or similarly identify the triggered device. For example, the building management application 112 may outline occupancy sensor 1411 in list 1402. The user can then click on the spatial element on the 3D building model 615 associated with the room the user has entered (e.g., spatial element 651e) to associate the triggered device (e.g., occupancy sensor 1411) with that space. The association may be saved by clicking the "Save" button 1412.

In another embodiment, the user may direct the infrared blaster 1502b in direct proximity to an electronic device with an infrared sensor, such as motorized shade device 1505f containing infrared sensor 1507f. The infrared blaster 1502b can be actuated to send a control command to the infrared sensor 1507f. In response, the infrared sensor 1507f will record the control command and report that command, either directly or indirectly, to the building management application 112 on server 110. In another embodiment, the infrared sensor 1507f may operate the motorized shade device 1505f, and the detected operation of the motorized shade device 1505f may be indicated to the building management application 112. In response, the building management application 112 may visually indicate to the user which device from the list of discovered devices 1402 reported the control command or detected operation. For example, the building management application 112 may outline or blink the motorized shade device 1416 on list 1402. The user can then click on the spatial element on the 3D building model 615 associated with the room the user has entered (e.g., spatial element 651e) to associate the triggered device (e.g., motorized shade device 1416) with that space. The association may be saved by clicking the "Save" button 1412.

In yet another embodiment, one or more electronic devices 1505a-i may be entered into a commissioning mode by depressing one or more buttons. For example, thermostat 1505i may comprise a commissioning mode button 1507i. Upon pressing that button 1507i, while the building management system 100 is in a commissioning mode, the thermostat 1505i will report to the building management application 112 an indication that it has entered a commissioning mode. In another embodiment, instead of having a dedicated commissioning mode button, an electronic device may be entered into a commissioning mode by pressing other control buttons, a unique combination of other control buttons, or pressing a button for a predetermined period of time. In response, the building management application 112 may visually indicate to the user which device from the list of discovered devices 1402 has entered into a commissioning mode. For example, the building management application 112 may outline or blink the thermostat 1418 on list 1402. The user can then click on the spatial element on the 3D building model 615 associated with the room the user entered (e.g., spatial element 651e) to associate the triggered device (e.g., thermostat 1418) with that space. The association may be saved by clicking the "Save" button 1412.

After assigning electronic devices 105 to space nodes 425a-n and spatial elements 651a-n in the 3D building model 615, the user can begin to monitor and control the electronic devices 105 and environmental settings of building 102 using the 3D building visualization of the present embodiments. The user may navigate to any floor of 3D building model 615 to monitor individual spaces on the floor. Because the space nodes 425a-n have been linked to the spatial elements 651a-n in the 3D building model, the user may navigate to any desired space in the 3D building model using the tree data structure 421 displayed within the building tree section 420. The user may click on any floor node 424a-n, such as "Floor 1" floor node 424a, to navigate to a floor view as shown in FIG. 10. Selecting a room or space node 425a-n in the tree 421 may also cause the 3D building model 615 to navigate to the floor on which the associated spatial element is located. Because each space node 425a-n is associated with a floor node 424a-n, the building management application 112 can identify which floor to render. For example, the user may click on space node 425e to navigate to a plan view of the first floor.

Furthermore, selecting a room or space node 425e in the tree 421 may cause the associated spatial element 651e to be visually selected in the building model 615. According to an embodiment, the outline (i.e., border or skeleton) of the selected spatial element 651e may be highlighted in another color as shown in FIG. 16. For example, the default border color may be gray. Upon selecting a space node 425e in the tree 421, the outline of spatial element 651e may change to blue, and the weight or thickness of the outline may increase. It is contemplated that spatial elements 651a-n may be visually selected in other ways, for example, the face color or the fill color of the selected spatial element 651e may be changed. Additionally, the spatial element 651e in the building model 615 corresponding to the selected space node 425e may be centered and zoomed in within the 3D visualization section 601.

Referring back to FIG. 10, the user may also navigate to any floor and zoom-in on any space using the buttons on the menu bar 610. The user may also select a room by clicking directly on the 3D model 615. According to an embodiment, when the computer mouse cursor or pointer 1002 is hovered over a spatial element 651e, a small floating popup window 1001 containing the name of the targeted space node 425e may appear in proximity to the cursor 1002 to identify the space node 425e associated with the spatial element 651e. The window 1001 disappears when the cursor 1002 is no longer hovering over a spatial element. As such, it becomes simple to identify and locate nearby rooms. If a spatial element 651a-n is unassigned to a space node 425a-n, window 1001 may display the name of the spatial element from the IFC file.

The user may select an individual room in the 3D building model 615 by clicking or double clicking directly on a spatial element 651a-n. As discussed above, selecting a room may cause the outline of the selected spatial element 651a-n to be highlighted in another color as shown in FIG. 16. The user may then select another space, such as lobby 651f, by clicking or double clicking directly on that space. This causes the previously selected spatial element to be deselected, and thereby unhighlighted, and the subsequently selected spatial element to be selected and highlighted. Selecting a spatial element 651a-n directly in the 3D building model 615 may also select and highlight the associated space node 425a-n on tree data structure 421, as shown in FIG. 16.

When a spatial element 651s-n and thereby a space node 425a-n is selected by a user, status visualization of associated electronic devise 105 may be rendered by selectively recalling live or historic status information of electronic devices associated with the selected space node. As discussed above, status information may be reported to the building management server 110 either directly by the electronic devices 105 within building 102 or via control system processors 103. Status information of each electronic device 105 is correlated with the space node using the association of each electronic device with a space node.

Referring to FIG. 16, according to one embodiment, as a user hovers over a spatial element 651e, window 1001 may display some status information associated with the space node 425e. For example, the text of the space node name or the background in window 1001 may be colored to indicate whether the room is online or offline. The text may be colored red to indicate that the room is offline, and green to indicate that the room is online. A space is online when there is a two-way communication between the server 110 and the electronic devices 105 in the space, either direct or via the control system processors 103, such that the server 110 can receive status information and transmit control commands. A space is offline when no two-way communication exists, for example, when the power is out, a wire may be cut, the control system processors 103 are off, etc.

In another embodiment, when a spatial element 651e is selected, the visual selection of the room on the 3D building model 615 may indicate status information of the electronic devices 105 associated with the space node 425e. For example, the selected spatial element 651e may be highlighted in green color to indicate that the room is online, or in red to indicate that the room is offline.

In another embodiment, a user may view detailed room specific information for a selected space. FIG. 16 illustrates a schematic diagram of the "Building Management" page 303 depicting a "Status" tab 1600 of the "Room Detail" window 1300 according to an embodiment. A selection of a spatial element 651e, and thereby a space node 425e, may open the "Room Detail" window 1300 and display the "Status" tab 1600. The "Status" tab 1600 may display the room name as well as various status information of and control options for the selected space node 425e. Specifically, the "Status" tab 1600 may list room status 1601 that includes general status information of the space, such as conference room 1. Room status information 1601 may indicate whether the room is online or offline. The room status information 1601 may further report any error conditions, such as whether any specific device in the room is reporting an error. For example, a ballast failure may be reported. Room status information 1601 may further list any help requests. Users may indicate that they need help in the room by entering a help request using a touch panel located at the room. Help requests may be triggered in other ways, such as by a voice calling system.

The "Status" tab 1600 may further list the status information of various types of electronic devices 105 associated with the selected space node 425e. For example, the user may view whether the lights are on or off and the light intensity as reported by the light dimmers in conference room 1. The user may view whether the room is vacant or occupied as reported by an occupancy sensor. The user may further view the daylight level of the room as reported by a daylight sensor. The user may further view whether the sensors are enabled or disabled. The user may view whether the display screen is on or off. The user may further view whether the room is booked or reserved as reported by a room scheduling server, such as the Microsoft Outlook® calendar server.

Using the "Status" tab 1600 a user may further control individual electronic devices 105. For example, the user may use a lights control field 1602 in a form of a slide bar configured for allowing the user to turn lights on or off and to change light intensity. The user may further add, set, or delete lighting scenes. The user may enable or disable occupancy sensors using drop-down menu 1604. The user may also enable or disable daylight sensor using drop-down menu 1605. The user may use a display control field 1606 in a form of an on/off toggle configured for allowing the user to turn a display screen within conference room 1 on or off. The user may use a reservation "View/Change" button 1607 to view the room's schedule and to make any desired schedule changes. Upon pressing the "View/Change" button 1607, the building management application 112 can access and/or open a calendar utility application associated with a room scheduling server, such as the Microsoft Outlook® calendar utility.

For example, in a scenario where a building manager may want to modify settings of conference room 1 for an important gathering, using the 3D model 615 the building manager may quickly locate conference room 1, access controls of that room, and turn on lights and display screen and disable the occupancy sensor to prevent lights from turning off. Additionally, the user may resolve error alerts and help requests. After the user changes a control setting on the "Status" tab 1600, the building management application 112 refreshes and re-renders the 3D model 615 with the update status information in order to demonstrate responsive feedback.

"Status" tab 1600 may display status and control of other types of electronic devices that may be installed in a room, depending on room configuration. For example, the user may further view and change shades presents, add and remove documents for display on a display screen, change temperature levels, control AV devices, or view status information and change control setting for any of the electronic devices 105 described above.

In addition to viewing room specific information in a room-by-room view discussed above, the building management application 112 displays status of neighboring rooms in a coherent and simple visualization. The building management system 100 is constantly collecting vast amount of status information from various types of electronic devices 105. Trying to show all data of a building at once is unmanageable. Instead, the building management application 112 provides status-attribute views configured for displaying status levels of neighboring rooms based on status-attribute or type. Each status-attribute view provides a targeted view of status levels for monitoring spaces. Each status level of each status-attribute view is color coded. The building management application 112 displays status levels by shading each spatial element 651a-n with colors indicating its relative status level. Accordingly the status-attribute views provide a clear and simple representation of the building based on status-attribute type and current status level.

Referring to FIG. 17, there is shown a schematic diagram of the "Building Management" page 303 depicting a live "Error Alerts" status-attribute view according to an embodiment. The navigation bar 610 may comprise a "Status View" button 635 that upon pressing drops down a status-attribute drop-down menu 1703 for accessing menu items comprising a list of status-attribute views 1705a-n for selection by the user. As a default, the building management application 112 is configured to display live status-attribute views. The live status-attribute views 1705a-n display live or real-time status levels of neighboring rooms based on status-attribute or type. A particular status-attribute view is selected from a list of predefined status-attribute views that may include a "None" status-attribute view 1705a, an "Error Alerts" status-attribute view 1705b, an "Online Status" status-attribute view 1705c, a "Help Requests" status-attribute view 1705d, an "Occupancy" status-attribute view 1705e, a "Reserved Spaces" status-attribute view 1705f, a "Display On" status-attribute view 1705g, a "Display Usage" status-attribute view 1705h, a "Light Level" status-attribute view 1705i, a "Daylight Level" status-attribute view 1705j, a "Daylight Harvesting" status-attribute view 1705k, and a "Space Utilization" status-attribute view 17051. Status-attribute views 1705a-n may vary depending on implementation and types of installed electronic devices 105. As a default, the "None" status-attribute view 1705a may be selected and all spatial elements 651a-n are colored with a default color. For example, the default color may be grey.

The user can select any one of the status-attribute views 1705a-n for display. For example, the user may select to view the live "Error Alerts" status-attribute view 1705b from the status-attribute drop-down menu 1703. In response, the building management application 112 re-renders the 3D building model 615 and displays spaces that have any error alerts. Error alerts are displayed by shading each spatial element 651a-n that has an error alert with a color indicating the status level. A color legend window 1707 may be displayed to the user by selecting the "Legend" button 633. The color legend window 1707 may contain a color legend that identifies which status levels correspond to which color. For example, for the live "Error Alerts" status-attribute view 1705b, the color legend window 1707 may display error alerts legend 1709. The error alerts legend 1709 may organize alerts by severity. "No color" (i.e., the default color such as grey) may apply to zero alerts, green color may apply to "Notice" type of alerts, yellow color may apply to "Warning" type of alerts, orange color may apply to "Error" type of alerts, and red color may apply to "Fatal Error" type of alerts.

For example, as shown in FIG. 17, the building management application 112 may receive a notice error alert for space node corresponding to spatial element 651f and change the color of spatial element 651f to green. The building management application 112 may color spatial elements 651e and 651g orange upon receiving an error alert for the corresponding spatial nodes. The building management application 112 may further color spatial element 651i red upon receiving a fatal error alert for the corresponding spatial node. Spaces with no error alerts may be maintained at a default color, such as grey.

FIG. 18 illustrates a flowchart 1800 showing the process for displaying the live status-attribute views 1705a-n, as shown in FIG. 17, according to an embodiment. In step 1802, the status-attribute view is selected. As discussed above, the status-attribute view may be selected using the status-attribute drop-down menu 1703.

In step 1804, for the selected status-attribute, the building management application 112 accesses the coloring logic that defines color codes for status levels. For each status-attribute view, the building management application 112 maintains a coloring logic that color codes various status levels. For example, for error alerts, the coloring logic may comprise a table that organizes error alerts by severity, and the severity may be determined by error alert type. As shown in the error alerts legend 1709, "No color" may apply to zero alerts, green color may apply to "Notice" types of alerts, yellow color may apply to "Warning" types of alerts, orange color may apply to "Error" types of alerts, and red color may apply to "Fatal Error" types of alerts.

In step 1806, the building management application 112 receives live or real-time status information of building 102 for each space node 425a-n. As discussed above, status information may be reported to the server 110 directly by the electronic devices 105 or via the control system processors 103. For example, the building management application 112 may receive status information for space node 425e associated with spatial element 651e comprising an indication that a ballast has failed in a light fixture.

In step 1808, the building management application 112 filters the received status information to select a subset of status information that corresponds to the selected status-attribute view. For example, when the user selects the "Error Alerts" status-attribute view 1705b from the status-attribute drop-down menu 1703, the building management application 112 filters the status information and selects a subset of status information that corresponds only to error alerts. In the example shown in FIG. 17, the building management application 112 may filter the status information and identify that there are error alerts for space nodes corresponding to spatial elements 651e, 651f, 651g, and 651i.

In step 1810, for each space node, the building management application 112 determines the status level of the space node based on the subset of status information. For error alerts, the building management application 112 determines the severity of the error alert—i.e., whether the error alert is a notice, a warning, an error, or a fatal error. The building management application 112 may maintain a table that organizes the types of error alerts by severity. The severity may be predetermined by the user. For example, ballast failure in a light fixture may be listed in the table as an "error" type of alert.

In step 1812, for each space node, the building management application 112 determines the color that applies to the status level using the coloring logic. For example, for error alerts, the building management application 112 may maintain a table that correlates colors to the type of error alerts. The table may comprise the correlation shown in error alerts legend 1709. For ballast failure, an "error" type of alert, the building management application 112 would identify the orange color.

Then in step 1814, the building management application 112 changes the color of the spatial element to the color indicating the status level of the corresponding space node. The building management application 112 may modify the properties of the of the spatial element by applying the status level color to any portion of the spatial element, such as its fill or volume, one or more of its faces, shadow, its outline or border, or any combinations thereof. According to an embodiment, the building management application 112 may apply one color to the fill of the spatial element to indicate a first status-attribute and another color to the outline of the spatial element to indicate a second status-attribute. In the above example, the building management application 112 may color the fill of spatial element 651e with the color orange to indicate an "error" type of alert. Then in step 1816, the building management application 112 re-renders the building model 615 with each spatial element comprising color-coded shading that corresponds to the status level, as shown in FIG. 17. The user may visually identify the status level using the errors alerts legend 1709. The user may then click on any color-coded spatial element to open the "Status" tab 1600 (FIG. 16) to review the status information in greater detail. For example, clicking on spatial element 651e will display "Status" tab 1600 in the "Room Detail" window 1300 (FIG. 16) and reveal under the room status information 1601 that there is a ballast failure.

FIG. 19 illustrates examples of color legends for other types of live status-attribute views 1705a-n according to an embodiment. The color legends are not limited to the shown specific colors. Other colors may be used. Additionally, the building management application 112 may provide an option to the user to change the color legends of the status-attribute views 1705a-n to any other color as desired.

The "Online Status" status-attribute view 1705c may apply color to the spatial elements 651a-n based on an "Online Status Legend" 1901 to indicate the online status of a space. The building management application 112 may shade the fill of each spatial element 651a-n with the colors shown in "Online Status Legend" 1901 based on the online status of the room. A room with connected online status may be colored green. A room with a partial online status may be colored yellow. A partial online status may occur for example when there is only a one way communication between the server 110 and the electronic devices 105 and/or the control system processors 103. A room with a disconnected online status can be colored red. A room that has no device to reflect online status (i.e., "unknown") may be colored grey.

The "Help Requests" status-attribute view 1705d may apply color to the spatial elements 651a-n based on a "Help Requests Legend" 1902 to indicate status of help requests. The building management application 112 may shade the fill of each spatial element 651a-n with the colors shown in the "Help Requests Legend" 1902 based on the help request status of the room. A room with a new help request may be colored red. A room with a pending help request may be colored orange. A pending help request may be a request that was acted upon, but one which is not complete. A room with no help requests may be colored grey.

The "Occupancy" status-attribute view 1705e may apply color to the spatial elements 651a-n based on an "Occupancy Legend" 1903 to indicate the occupancy status of a room. The building management application 112 may shade the fill of each spatial element 651a-n with the colors shown in the "Occupancy Legend" 1903 based on the occupancy status of the room. The building management application 112 may receive occupancy status from occupancy sensors or from other devices installed in the room. For example, the building management application 112 may determine occupancy based on current user interaction with equipment installed in the room. A room that contains an occupancy sensor that is enabled which indicates that the room is occupied (i.e., occupancy status is TRUE) may be colored dark blue. A room with a disabled occupancy sensor (or no occupancy sensor), but which may be indicated as occupied by other means, such as a touch panel present in the room, may be colored light blue. A room that contains an occupancy sensor that is enabled which indicates that the room is unoccupied (i.e., occupancy status is FALSE) may be colored dark green. A room with a disabled occupancy sensor (or no occupancy sensor), but which may be indicated as vacant by other means may be colored light green. A room without an occupancy sensor and with no other indication whether the room is occupied or unoccupied may be colored grey.

The "Reserved Spaces" status-attribute view 1705f may apply color to the spatial elements 651a-n based on a "Reserved Spaces Legend" 1905 to indicate whether the room is reserved and occupied. The building management application 112 may shade the fill and outline of each spatial element with the colors shown in the "Reserved Spaces Legend" 1905 based on whether the room is reserved/unreserved and occupied/vacant. The "Reserved Spaces" status-attribute view displays information based on two types of attributes. One attribute is displayed using the fill color and another attribute is displayed using the border color. The building management application 112 may receive status information on whether the room is reserved or unreserved from a room scheduling server, such as the Outlook® calendar server. The building management application 112 may further receive occupancy status from occupancy sensors. A room that is reserved and occupied may be colored blue. A room that is reserved and vacant may be colored blue with red border. A room that is unreserved and occupied may be colored white with green border. A room that is unreserved and vacant may be colored white. A room with an unknown status may be colored grey. As such, a building manager can increase productivity by easily identify falsely reserved rooms and release the room for use by changing its reservation status (by clicking on a desired room and selecting the reservation "View/Change" button 1607 in the "Status" tab 1600 as shown in FIG. 16). Similarly, the building manager can easily identify rooms that are unreserved and occupied and change reservation status of the room to reserved (FIG. 16).

The "Display On" status-attribute view 1705g may apply color to the spatial elements 651a-n based on a "Display On Legend" 1906 to indicate whether a display is on and the room is occupied. The building management application 112 may shade the fill and outline of each spatial element 651a-n with the colors shown in the "Display On Legend" 1906 based on whether the room is occupied/vacant and whether a display in the room is on/off. The "Display On" status-attribute view 1705g displays information based on two types of attributes. The building management application 112 may receive status information on whether a display is on from the display screen devices. The building management application 112 may further receive occupancy status from occupancy sensors. A room with a display turned on and that is occupied may be colored green. A room with a display turned on and that is vacant may be colored green with red border. A room with a display turned off may be colored white. A room with an unknown status may be colored grey. As such, the building manager may easily identify rooms with unnecessarily turned on displays and turn off displays in vacant rooms to conserve energy.

The "ON" state of other electronic devices 105 may be monitored in similar fashion. For example, an "ON" state of display projectors may be provided in a similar fashion. Any spatial element 651a-n corresponding to a room with a turned on projector may be filled in a blue color. Any spatial element corresponding to a room where a projector is turned on but the room is indicated as vacant (for example, according to an occupancy sensor) may contain a fill colored in blue and border colored in red.

The "Display Usage" status-attribute view 1705h may apply color to the spatial elements 651a-n based on a "Display Usage Legend" 1910 to indicate the duration a display screen has been turned on. The building management application 112 may shade the fill of each spatial element 651a-n with the colors shown in the "Display Usage Legend" 1910 based on the duration a display screen has been tuned on. The building management application 112 may continuously monitor the display screens in building 102 and the duration of their usage. Once a display screen is turned on, the building management application 112 may begin a clock count to log the usage time for the display. When a user selects the "Display Usage" status-attribute view 1705h, the building management application 112 may query the log for the current clock count of each display. A room with a display that has been turned on less than an hour may be colored green. A room with a display that has been turned on between one hour and three hours may be colored yellow. A room with a display that has been turned on for more than three hours may be colored red. A room with a display turned off may be colored white. A room with an unknown status or which does not contain a display may be colored grey. Other and additional colors and duration limits may be used. As such, the building manager may easily identify rooms with displays that has been turned on for a prolonged periods of time. The duration usage of other electronic devices may be monitored in similar fashion.

FIG. 20 illustrates a schematic diagram of the "Building Management" page 303 depicting the live "Light Level" status-attribute view 1705i according to an embodiment. The "Light Level" status-attribute view 1705i applies color to spatial elements 651a-n to indicate in which rooms the lights are on and the level or intensity of the turned on lights. The building management application 112 may use a coloring logic comprising a light level color gradient 2003 as shown in "Light Level Legend" 2005 to indicate the light levels of neighboring rooms. The color gradient may comprise a gradient of a single hue or color with luminosity or brightness ranging from dark to bright. The gradient color may comprise the color yellow, although other colors may be utilized. The building management application 112 implements a coloring logic to render a shade of yellow, from dark to bright, dependent on the light level percentage in the room. According to an embodiment, a bright yellow color may indicate that the room's light level is high and a dark yellow color may indicate that the room's light level is low. Accordingly, a room with lights at light level of 50% would appear in a darker yellow than a room with all lights at a full light level. The building management application 112 may determine the light level of each room with turned on lights by looking at the total power density of lighting in a room. The building management application 112 may then use the light level to determine the color luminosity from the light level color gradient 2003. The building management application 112 may then shade the fill of each spatial element 651a-n that corresponds to a space node 425a-n with turned on lights with the selected color luminosity to indicate the light level in the room. For example, a room that corresponds to spatial element 651b may have low light level and therefore be colored with a dark yellow color. Spatial element 651l may have a medium light level and be colored with a yellow color of medium luminosity. Spatial element 651f may have a high light level and be colored with a bright yellow color.

The "Light Level" status-attribute view 1705i may further display occupancy status of the room by changing the outline or border color of an associated spatial element 651a-n, for example to red. Any spatial element, such as spatial elements 651e and 651h, associated with a room where lights are turned on but the room is indicated as vacant (for example, according to an occupancy sensor) may contain fill colored in a shade of yellow and border colored in red. The user may click on any such room, e.g. conference room 651e, to bring up the "Status" tab 1600 shown in FIG. 16 and turn off lights in vacant rooms, reducing energy consumption.

For each spatial element 651a-n the building management application 112 may illustrate the level of the turned on lights as follows. The building management application 112 may use light messages to acquire the state of each lighting load in a room associated with a space node 425a-n. Light level or intensity may change in a room depending on the number of loads in the room, the wattages of the loads, and on the amount the load has been dimmed. For each lighting load in the room, the building management application 112 may receive a light message comprising a power value of the load in watts as well as its light level value. The light level value is indicated as an analog value within range 0-65535, from being totally off to totally on. The load's light level value is converted to a percentage value between 0% and 100% (i.e., by dividing the received light level value by 65535 and then multiplying by 100 such that a light level value of 0 is 0%, and light level value of 65535 is 100%). The building management application 112 then determines the average light level in the room or space by calculating the weighted light level average using the following formula:

$$\text{Room Light Level Average } (\%) = \frac{[(W_1 * L_1) + (W_2 * L_2) + \ldots (W_n * L_n)]}{(W_1 + W_2 + \ldots W_n)}$$

where
  W is the power value of each load
  L is the light level percentage value of each load The coloring logic may comprise a light level color gradient 2003. Each position on the light level color gradient 2003 corresponds to a particular color and percentage value. According to one embodiment, the light level color gradient 2003 may comprise a single color, such as the color yellow, that ranges according to luminosity or brightness from dark to light. Generally, a true color luminosity gradient comprises a range from 0% luminosity (dark) to 100% luminosity (light). At 0% luminosity, the color will generally appear totally black and at 100% luminosity the color will generally appear totally white. According to an embodiment, the light level color gradient 2003 comprises a rescaled version of the true color luminosity gradient. The light level color gradient 2003 may comprise a minimum luminosity in the range of about 5% to about 35% of the true luminosity and a maximum luminosity in the range of about 60% to about 95% of the true luminosity. According to another embodiment, instead of a luminosity gradient, the light level color gradient 2003 may comprise a single color scaled according to saturation levels. In another embodiment, the light level color gradient 2003 may comprise more than one color. For example, the light level color gradient 2003 may comprise a two color gradient ranging from yellow to brown to illustrate light levels.

The building management application 112 then applies the determined room light level percentage value to the light level color gradient 2003 to identify the particular color that equals to that percentage value. The building management application 112 applies the determined color to the corresponding spatial element.

Operational levels of other devices may be implemented in a similar manner. For example, the building management application 112 may comprise a "Daylight Level" status-attribute view 1705*j* that applies color to spatial elements 651*a-n* based on a color gradient shown in the "Daylight Level Legend" 1913 in FIG. 19. The "Daylight Level" status-attribute view may display daylight levels of each space by using a gradient of orange color that ranges according to luminosity or brightness from dark to light as shown in Daylight Level Legend 1913. Rooms where the daylight level is greater than 0% may be colored a particular luminosity of the orange color that shows intensity of natural daylight in a room. Other colors may be used to indicate daylight levels, such as the light blue color. The building management application 112 may receive light levels of a room from open-loop photocell sensors installed in the room. If the room contains more than one sensor, the building management application 112 may use the received values to calculate the weighted light level average. Rooms with closed loop sensors or rooms with no sensors may be colored using the default color grey.

In addition, the "Daylight Harvesting" status-attribute view 1705*k* may apply color to spatial elements 651*a-n* based on a color gradient shown in the "Daylight Harvesting Legend" 1915 in FIG. 19. The "Daylight Harvesting" status-attribute view 1705*k* may display daylight harvesting levels of each space by using a gradient of green or cyan color that ranges according to luminosity or brightness from dark to light as shown in the "Daylight Harvesting Legend" 1915. Rooms where daylight harvesting is greater than 0% may be colored a particular luminosity of the cyan color that shows how much energy is saved due to daylight harvesting. The daylight harvesting value may be calculated using light levels received from open-loop photocell sensors installed in the rooms. If the room contains more than one sensor, the building management application 112 may use the received values to calculate the weighted light level average. Rooms with closed loop sensors or rooms with no sensors may be colored using the default color grey.

The "Space Utilization" status-attribute view 17051 may apply color to spatial elements 651*a-n* based on a space utilization color gradient 1918 shown in the "Space Utilization Legend" 1917 in FIG. 19. The "Space Utilization" status-attribute view may display space utilization levels of each space by using a two color gradient 1918 that ranges from blue (low) to red (high) to illustrate the length of time the space was utilized. According to an embodiment, the "Space Utilization" status-attribute view 17051 may apply only to spaces that are classified as meeting rooms—i.e., rooms which are not assigned to a particular user, but can be utilized for gathering and collaboration purposes by any user. As such, a building manager can monitor whether one meeting room is utilized more than another meeting room. Such meeting rooms can comprise conference rooms, huddle rooms, classrooms, auditoriums, banquet halls, a short-term workspace, day office, or the like. However, the "Space Utilization" status-attribute view 17051 may apply to other types of rooms as well.

The building management application 112 may maintain a count of the minutes each meeting room is utilized—i.e., "use-minutes". The building management application 112 may gather the use-minutes count via occupancy sensors installed in the meeting rooms. The building management application 112 may further gather utilization minutes count from a room scheduling server to determine for how long a meeting room is reserved. The utilization minutes for each room may be stored in the database 106. For each meeting room, the building management application 112 determines the percentage a meeting room is utilized by comparing the utilization minutes count of the meeting room to the total utilization minutes count of the building as follows:

$$\text{Space 1 utilization } (\%) = \frac{R_1}{(R_1 + R_2 + \ldots R_n)}$$

where R is the use-minutes of a room.

According to an embodiment, the building management application 112 may display live "Space Utilization" status-attribute view 17051 for use-minutes data collected for rooms that are currently occupied. According to an embodiment, the building management application 112 may display live "Space Utilization" status-attribute view 17051 for use-minutes data collected during the current day (i.e., "today"). Other time period may be utilized. The building management application 112 applies the determined space utilization percentage value to the space utilization color gradient 1918 to identify the particular color that equals to that percentage value. The building management application 112 applies the determined color to the corresponding spatial element 651*a-n*.

The building management application 112 may further render a historic status view of building 102. FIG. 21 illustrates a schematic diagram of the "Building Management" page 303 depicting a historic "Light Level" status-attribute view 1705*i* according to an embodiment. Referring to FIG. 21, the menu bar 610 may comprise a "Timestamp" button 637 that upon pressing pulls down a timestamp drop-down window 2101. The timestamp drop-down window 2101 may comprise a "Live" view button 2115, a "Historic" view button 2116, a "Fast Forward" view button 2117, date and time of day input fields 2103, 2104, 2105, and 2106, and a "Save" button 2110. As a default, the "Live" view may be displayed by the "Building Management" page 303. During the "Live" view, the building management application 112 retrieves and renders live or real-time status information of electronic devices 105. For example, live status information was displayed to the user in FIGS. 16, 17, and 20. The user may return anytime to the "Live" view from another view by pressing the "Live" view button 2115. During the "Live" view the date and time input fields 2103-2106 may be inactive or not displayed. Selection of the "Historic" view button 2116 will cause the building management application 112 to enter into a historic view mode to display archived or historic status information. Selection of the "Fast Forward" view button 2217 will cause the building management application 112 to enter into a "fast forward" view mode as will be further described below. When the "Historic" view button 2116 or the "Fast Forward" view button 2117 are pressed, the date and time input fields 2103-2106 may be activated or displayed allowing the user to input a specific date or a date range.

The date input fields 2103 and 2104 may each comprise a fillable text field and/or a calendar for allowing the user to select a desired date. The time input fields 2105 and 2106 are configured for allowing the user to select a desired time of day. The user may select the "Historic" view button 2116 and use the date and time input fields 2103-2106 to view historical status information for any given date and time of day or to select a particular period of time. As discussed above, the building management server 110 may collect and archive status information in database 106. The archived status information is timestamped such that it can be recalled using the selected date and time.

When a user presses the "Historic" view button 2116, chooses a particular date and time of day from the past, and presses the "Save" button 2110, the building management application 112 accesses the database 106 to retrieve the historic status of the space nodes 425a-n during the chosen date and time of day. The user can view the historic status information room-by-room by clicking on a desired room on the 3D building model and selecting the "Room Detail" button 631. A selection of a spatial element 651e associated with "Conf. Room 1" space node 425e, may open the "Room Detail" window 1300 and display the "Status" tab 2113. The "Status" tab 2113 displays the status information associated with the selected space node 425e that corresponds to the selected date and time of day. For example, if the user selects to view the status information of conference room 651e from "Jan. 5, 2016" at "9:30 PM", the building management application 112 will retrieve status information from database 106 for that selected date and time. For example, on Jan. 5, 2016 at 9:30 PM, conference room 651e was online, its lighting was set to "Scene 2" but the lights were completely off, the occupancy sensor was enabled and indicating that the conference room is vacant, etc. Unlike the "Status" tab 1600 (FIG. 16) that displays live or real-time status information, "Status" tab 2113 displaying historic status information may not include control fields configured for changing the state of the space node, such as the lights control field 1602, occupancy sensor drop-down menu 1604, daylight sensor drop-down menu 1605, display control field 1606, and reservation "change" button 1607.

In addition, the user may view historic status-attribute views configured for displaying status levels of neighboring rooms during the selected historic date and time of day. The user may select the desired date and time using the timestamp drop-down window 2101 by pressing the "Timestamp" button 637. The user may then press the "Status View" button 635 to pull down the status-attribute drop-down menu 1703 and choose a desired status-attribute view from the menu items. The historic status view of building 102 may comprise the same status-attribute views 1705a-n as in the live or real-time view mode shown in FIGS. 17 and 19.

The building management application 112 may display the historic status-attribute view in the similar manner as shown and described with reference to FIG. 18. The only difference is that instead of retrieving current status information for each space node 425a-n in step 1806, the building management application 112 will retrieve historic status information associated with the selected date and time. For example, the user may choose to view light levels from Jan. 5, 2016 at 9:30 PM. As shown in FIG. 21, the building management application 112 will re-render the building model by changing the color of the spatial elements to the color indicating the status level of a corresponding space node as it was on Jan. 5, 2016 at 9:30 PM.

In another embodiment, instead of choosing a particular date, the user may use the through date input field 2104 and through time input field 2106 to input a time of day and/or a date range. Selectively filling in input fields 2103, 2105, 2105, 2106, the user can view historic status information throughout a day, portion of a day, a week, a month, a year, or some other time frame. For example, the user may use the date and time input fields 2103 and 2105 (while leaving input fields 2104 and 2106 blank) to see historical status information for a particular date and time of day as discussed above. The user may use the date input field 2103 (while leaving input fields 2105, 2104, and 2106 blank) to view historical status information for a particular day. The user may use the date input fields 2103 and 2104 (while leaving input fields 2105 and 2106 blank) to view a particular time period, such as a week, a month, or a year. The user may press the "Save" button 2110 to apply the desired time period selection.

When the user chooses to review historic information for a time period, such as a day, week, month, year, etc., the building management application 112 may calculate and display the average status of each space node occurring within the selected time period. For example, when the user wishes to see historic light levels for a particular day, for each space node the building management application 112 may retrieve recorded light levels for the selected day and calculate the average of the light levels for display. In another embodiment, the user may select to view the "Space Utilization" status-attribute view 17051 as shown in FIG. 19 for a particular week, month, year, or another time period. The building management application 112 may determine the use-minutes count of the various space nodes 425a-n for the selected time period.

In another embodiment, the building management application 112 may utilize machine learning to determine historic or past usage patterns and display predicted status information corresponding to the historic usage patterns on the 3D building model. The predicted status information may be given a "confidence level" indicator that is displayed to the user to indicate how likely the predicted pattern will occur. In yet another embodiment, the building management application 112 may display an animation of the historic state of the building during the selected time period similar to the one discussed below with reference to FIG. 25.

Building managers may view historic information to decide upon future operation of the building 102 and to schedule future events to enable a more efficient operation of the building. For example, the building manager may turn off lights and turn on motion sensors in a meeting room during a particular period of time that the conference room is usually unoccupied.

FIG. 22 illustrates a schematic diagram of the "Building Management" page 303 depicting a "Schedule Events" tab 2201 of the "Room Detail" window 1300 according to an embodiment. Using the "Scheduled Events" tab 2201, a building manager may program future scheduled events. The building manager may program and customize the operation of building 102 by setting presets, scenes, and building rules. For example, the user can specify what the lights are going to do, what the sensors are going to do (enable/disable), or what the HVAC will do during afternoon business hours. The user may click on a spatial element 651*e* on the 3D building model 615 and use the "Scheduled Events" tab 2201 to program specific scheduled events for the associated space node 425*e* for particular periods of time. Each space can be programmed to behave differently. For example, during business hours the lights in the building hallways and common areas may be turned on. The lights in large conference rooms may be scheduled to operate at 40% when the room is unoccupied and 100% when the room is occupied. Lights in small conference rooms and office spaces may be turned off and programmed to operate in response to occupancy sensors. Outdoor spaces may be programmed to be controlled by a photocell.

For example, the user may schedule events for space node 425*e* associated with spatial element 651*e* as shown in the "Schedule Events" tab 2201. The user may program lights using the lighting programming field 2205 to turn on or off during a certain time and program their light level intensity. The user may program an occupancy sensor within the room using the occupancy sensor programming field 2207 to enable or disable the operation of the occupancy sensor during a particular period of time. The user may also input logic indicating which electronic device should be affected by the output of the occupancy sensor. The user may input scheduled events for other types of electronic devices 105 in a similar manner. The "Scheduled Events" tab may comprise any number of programming fields corresponding to any number of electronic devices 105 or other environmental settings associated with a space node.

Typically, determining whether a building has been programmed correctly may be very confusing as a building may need vast amount of scheduled events. The building management application 112 of the present embodiments provides a "fast forward" view that enables the user anytime during or at the end of the scheduling process to view a simulation of the programmed operational state of the building 102 using the 3D building model 615. FIG. 22 illustrates a schematic diagram of the "Building Management" page 303 depicting a fast forward "Lights On" status-attribute view 2213*b* according to an embodiment. After programming a scheduled event for a particular time period, the user may select the "Fast Forward" view button 2117 and select the time period to cause the building management application 112 enter the "fast forward" view mode to display the programmed operation of the building 102. The "fast forward" view mode provides a simulation of the programmed operational state of the building 102 during a selected time of day according to the programmed parameters, such as programmed zones, scenes and rules established during programming. Accordingly, the programmer can see and visually perceive if the scheduled events were programmed correctly.

The building's programmed operational state during the simulation may be selected from one of numerous types of status-attribute views. The user may press the "Status View" button 635 to pull down a fast forward status-attribute drop-down menu 2211 for accessing menu items comprising a list of fast forward status-attribute views 2213*a-n* for selection by the user. Fast forward status-attribute drop-down menu 2211 may comprise the same menu items as the live or historic status-attribute views discussed above. According to another embodiment, the fast forward status-attribute drop-down menu 2211 may comprise different menu items for the "fast forward" view mode. For example, the status-attribute drop-down menu 2211 for the "fast forward" view mode may comprise predefined fast forward status-attribute views 2212*a-n* comprising a "None" status-attribute view 2213*a*, a "Lights On Level" status-attribute view 2213*b*, an "Occupancy On" status-attribute view 2213*c*, a "Daylight On" status-attribute view 2213D, a "Conflict" status-attribute view 2213*e*, a "Display On" status-attribute view 2213*f*, "Display Usage" status-attribute view 2213*g*, and a "Reserved Spaces" status-attribute view 2213*h*. Status-attribute views 2213*a-n* may vary depending on implementation and types of installed electronic devices 105. The user may select any one of these menu items to review the programmed operation of the building and identify any errors in programming. As a default, the "None" status-attribute view 2213*a* may be preselected and all spatial elements 651*a-n* are colored with a default color grey.

FIG. 23 illustrates a flowchart 2300 showing the process for displaying the fast forward status-attribute views 2213*a-n* as shown in FIG. 22 according to an embodiment. After programming one or more events, the user may cause the building management application 112 to enter a "fast forward" view mode in step 2302 by selecting the "Fast Forward" view button 2117 and a future date and/or time of day using the date and time input fields 2103 and 2105 in the timestamp drop-down window 2101. For example, a user wishing to view the building's operation during afternoon hours of a weekday may select 1:30 pm on Jul. 8, 2016. In another embodiment, the system may restrict programming of scheduled events to half hour increments, or some other time increment. Instead of choosing a particular time of day, the user may choose one such programming increment.

In step 2304, the user selects the fast forward status-attribute view 2213*a-n* for the "fast forward" view mode. For example, the user may select to view the fast forward "Lights On Level" status-attribute view 2213*b* from the status-attribute drop-down menu 2211.

In step 2306, for the selected status-attribute view, the building management application 112 accesses the coloring logic that defines color codes for status levels. As discussed above, for each status-attribute view, the building management application 112 maintains a coloring logic that color codes various status levels. For example, for the "Lights On Level" status-attribute view 2213*b*, the building management application 112 applies color to the spatial elements 651*a*-based on the "Lights On Legend" 2215 to indicate the programmed operational state of the lights in the building 102 during the selected time period. The building management application 112 may shade the fill of each spatial element 651*a-n* with the colors shown in the light level color gradient 2217 (similar to the light level color gradient 2003) based on the programmed light levels in the room. The light level color gradient 2217 may comprise the color yellow that ranges from dark yellow to bright yellow. The default color grey may apply to spaces where lights are programmed to be off. A bright yellow color may indicate that the room's light level is programmed to be high and a dark yellow color may indicate that the room's light level is programmed to be low. A blue border may apply to spaces where lights are programmed to turn on when the room is occupied. A green border may apply to spaces where lights are programmed to turn on in response to a daylight sensor or photocell output indicating that it is dark outside.

In step 2308, the building management application 112 filters through the programming rules to select programming rules that correspond to the selected attribute and the selected date and time of day. For example, for space node 425e, the building management application 112 selects programming rules that are entered in the lighting programming field 2205 that would apply when the time of day is 01:30 PM. In step 2310, using the selected programming rules, the building management application 112 determines the programmed operational state of each space node. In this case, the for space node 425e the building management application 112 would determine that during 01:30 pm, the lights would turn on if occupancy sensor senses occupancy.

In step 2312, the building management application 112 then determines the color that applies to the determined programmed operational state using the accessed coloring logic. For space node 425e, the color would remain the default grey color to indicate that the lights are programmed to be off, but the border color would be blue to indicate that the lights are programmed to turn on if the occupancy sensor senses occupancy. In step 2314, the building management application 112 then changes the color of the spatial element 651a-n to the color indicating the programmed operational state of the corresponding space node 425a-n. The building management application 112 may apply the programmed operational state color to any portion of the spatial element 651a-n, such as its fill or volume, one or more of its faces, its outline or border, or any combinations thereof. In this case, the fill color of spatial element 651e would remain the default grey color, but its border would be changed to blue. In addition, the building management application 112 shades the remainder spatial elements 651a-n following the same method. For example, spatial elements 651l, 651g, and 651k will remain the default color grey to indicate that the lights are not programmed to be on, the fill of spatial elements 651c, 651f, and 651h may be changed to a color yellow with luminosity indicating that the lights were programmed to be on at a specific light level, the border of spatial element 651h may be changed to blue to indicate that the light level will change in response to occupancy, and spatial element 651m will remain with grey fill color, but its border will be changed to green to indicate that the lights are programmed to turn on in response to an output from a photocell.

Then in step 2316, the building management application 112 re-renders the building model 615 with each spatial element 651a-n comprising color-coded shading that corresponds to the programmed operational state, as shown in FIG. 22.

The user may go through the visual simulation of the programmed events of the fast forward "Lights On Level" status-attribute view 2213b to determine whether the building 102 was programmed correctly. In the present example, the user will be able to evaluate whether the building 102 was programmed properly during the afternoon hours during a weekday or business day. Improperly dark rooms in the middle of the day, such as hallways, can be readily identified and their scheduling can be corrected. For example, the user can identify that the hallways lights in spaces 651l, 651g, and 651k are improperly turned off during afternoon hours. In response, the user can make proper corrections. The sensors between normal business hours can be turned off, while the hallway lights may be turned on. Small conference rooms scheduled with turned on lights, such as space 651c, may be rescheduled to turn off lights and activate occupancy sensors. The user can also readily recognize that the lights in the lobby 651f and outdoor 651m spaces were programmed properly.

FIG. 24 illustrates examples of color legends of other types of fast forward status-attribute views 2213a-n according to an embodiment. The color legends are not limited to the shown specific colors. Other colors may be used. Additionally, the building management application 112 may provide an option to the user to change the color legends of the fast forward status-attribute views 2213a-n to any other color as desired.

The fast forward "Occupancy On" status-attribute view 2213c may apply color to the spatial elements 651a-n based on an "Occupancy On Legend" 2401 to indicate the programmed operational state of an occupancy sensor in a space. A room programmed to have the occupancy sensor enabled during the selected time period may be colored blue. A room programmed to have the occupancy sensor displayed during the selected time period may be colored orange. A room that does not contain an occupancy sensor may be colored grey. Similar legend may be used for the fast forward "Daylight On" status-attribute view 2213D to indicate the programmed operational state of a daylight sensor in a space. Similar legends for other sensors may also be provided.

The fast forward "Conflict" status-attribute view 2213e may apply color to the spatial elements 651a-n based on a "Conflict Legend" 2403 to indicate any programming conflicts or errors. Accordingly, the fast forward "Conflict" status-attribute view 2213e provides a troubleshooting menu that indicates to the user which spaces may have programming issues, such as turned on lights at night. The fast forward "Conflict" status-attribute view 2213e may be associated with a logic that defines the types of programming issues. For example, spaces with no conflicts may be colored grey. Common area types of spaces, such as hallways, lobby, staircase, lunchrooms, etc., may be colored green to indicate that the lights are programmed to remain off during weekdays. Areas programmed to have lights turned on during night hours may be colored yellow. Areas programmed to have a display screen turned on during night hours may be colored orange. Areas that have been programmed with logic that require the operation of a sensor, which in turn is disabled, may be programmed red. Other types of troubleshooting menu items may be provided.

The fast forward "Display On" status-attribute view 2213f may apply color to the spatial elements 651a-n based on a "Display On Legend" 2405 to indicate the programmed operational state of a display installed in a space. A space with a display programmed to be turned on during a selected period of time may be colored green. A space with a display programmed to be turned on if the space is reported as occupied (e.g., by an occupancy sensor) may be colored blue. A space with a display not programmed to be on may be colored white. A space that does not contain a display may be colored grey.

The "Display Usage" status-attribute view 2213g may apply color to the spatial elements 651a-n based on a "Display Usage Legend" 2407 to indicate the duration a display screen is programmed to be turned on. The building management application 112 may shade the fill of each spatial element 651a-n with the colors shown in the "Display Usage Legend" 2407 based on the duration a display screen is programmed to be turned on. A room with a display screen that is programmed to be turned on less than an hour may be colored green. A room with a display screen that is programmed to be turned on between one hour and three hours may be colored yellow. A room with a display screen that is programmed to be turned on for more than three hours may be colored red. A room with a display screen not programmed to be turned on may be colored white. A room which does not contain a display may be colored grey. Other and additional colors and duration limits may be used. As such, the building manager may easily identify rooms with displays that has been programmed to be turned on for a prolonged periods of time and change the schedule of the display. The programmed duration usage of other electronic devices 105 may be evaluated in similar fashion.

In addition to showing a programmed operational state, the "fast forward" view may leverage and display relevant known information to assist the user to program spaces, such as predicted status information. For example, the fast forward "Display On" status-attribute view 2213*f* may display expected occupancy of the space during the selected period of time. The building management application 112 may implement machine learning to determine the expected occupancy based on past patterns. For example, the user may select to see the "Display On" status-attribute view 2213*f* during a particular date and time of day. The building management application 112 may evaluate the archived historic occupancy data for space node 425*e* associated with spatial element 651*e*, filter through the data to select occupancy data collected during the same month, day of week, and time of day, and determine a weighted average of occupancy. If a space is determined to be occupied more than 50% during that period of time, the building management application 112 may render that space using a blue border. If the space is determined to be generally vacant during that period of time, the building management application 112 may render that space using a green border. Accordingly, a user observing that a room is typically occupied may turn on the display during that period. The predicted status information, such as the expected occupancy, may be given a "confidence level" indicator that is displayed to the user by the building management application 112 to indicate how likely the predicted pattern will occur.

Other information may also be displayed in the fast forward status-attribute views 2213*a-n* to assist the user to correctly program a building. As discussed above, the building management application 112 may display various learned patterns, such as occupancy, as well as whether lights, or display are expected to be turned on, whether the room is expected to be reserved, etc. During the "fast forward" view, the building management application 112 may further display environmental information to assist user in scheduling events. The environmental information such as temperature, daylight, weather, or the like may be displayed based on time of year, time of day, longitude and latitude of the building, orientation of the building, sunlight angle, shadow effect of nearby building, or other geographic features, properties of the building (e.g., what type of glass used in the building windows), or a variety of other factors. The building management application 112 may forecast and display the building status in light of these factors to assist the user in adding appropriate programming. For example, knowing the sunlight angle the user can schedule motorized shades to be lowered or raised to conserve energy, and/or program the heating and cooling.

For example, the fast forward "Reserved Spaces" status-attribute view 2213*h* may apply color to the spatial elements 651*a-n* based on a "Reserved Spaces Legend" 2409 to indicate whether the room is scheduled to be reserved. The building management application 112 may receive information on whether the room is scheduled to be reserved or unreserved from a room scheduling server, such as the Outlook® calendar server. The border of a room that is scheduled to be reserved may be colored red. The border of a room that is unreserved, but is available for reservation, may be colored blue. The border of a room that is not available for reservation (such as a private office room) may remain the default color grey.

The fast forward "Reserved Spaces" status-attribute view 2213*h* may further display the predicted energy efficiency of each space by using a gradient of cyan color 2410 that ranges according to luminosity or brightness from dark to light. Rooms where energy efficiency is expected to be greater than 0% may be colored a particular luminosity of the cyan color that shows how much energy is expected to be saved. The expected energy efficiency value may be calculated via machine learning to identify past patterns by using historic information, such as daylight harvesting information, temperature level information, or the like, as well as expected environmental information, such as the expected temperature, daylight, weather, or the like, based on the selected time of year and time of day, as well as a variety of other factors. As such, a building manager can increase energy saving by identifying reserved rooms with expected low energy efficiency and rescheduling the meetings to rooms with expected high energy efficiency (by clicking on a desired room and selecting the reservation "View/Change" button 1607 in the "Status" tab 1600 as shown in FIG. 16).

In another embodiment, instead of choosing a particular future date and time of day, the user may choose a date range using the date and time input fields 2103-2105 in the timestamp drop-down window 2101. The user may choose to fast forward through an entire day, a week, a month, a year, or some other specific time frame. For the desired time period, the "fast forward" feature can provide an animation of the building 102 that will show the building operation throughout the chosen day, week, month, or a year. FIG. 25 illustrates a schematic diagram of the "Building Management" page 303 depicting an animation of the fast forward "Lights On Level" status-attribute view 2213*b* according to an embodiment.

For example, referring to FIG. 25, the user may select to view the programmed operational state of the lighting in building 102 throughout a weekday (e.g., Jul. 8, 2016). The building management application 112 may display an animation window 2500 comprising a play icon button 2502, a pause icon button 2504, a stop icon button 2506, a draggable time slider 2501, a previous button 2507, and a next button 2808. The user may press the play icon button 2502 to play the animation. Upon choosing the desired time period and the "Lights On Level" status-attribute view 2213*b*, the building management application 112 determines the programmed operational states of the lighting in building 102 according to the method shown in FIG. 23 for the entire desired time period. The building management application 112 will then identify the changes in the programmed operational states. The building management application 112 then animates the building model 615 by re-rendering the changes of the programmed operational states of the building model 615 as they would occur during the selected time period.

As discussed above, the building management application 112 renders programmed operational states by color coding the spatial elements 651*a-n*. According to an embodiment, the building management application 112 may start rendering the spatial elements 651*a-n* of the building model 615 with colors indicating the programmed operational states as they would occur at the beginning of the selected time period. As the animation proceeds playing through the selected time period, every time a programmed operational state of the building changes, the building model 615 is re-rendered by changing the colors of the spatial elements 651a-n that correspond to the changed programmed operational state. For example, referring to FIG. 25, the lights in room 651c may be programmed to turn on between 4:00 PM and 5:00 PM. The building model 615 will be animated by coloring the fill of the spatial element 615c in the default grey color as the slider 2501 travels from 12:00 AM through 3:59 PM, changing the color to yellow as the slider travels from 4:00 PM to 5:00 PM, and changing the color back to default grey as the slider travels from 5:01 PM to 11:59 PM. Accordingly the user may visually perceive whether the building was programmed correctly throughout the entire day. When the user notices an error, the user may click the pause icon button 2504 to review the programmed operational state in further detail. The user may click on any of the spatial elements 651a-n to open the "Schedule Events" tab 2201 in the "Room Detail" window 1300 (FIG. 22) to reprogram the scheduled events.

The user may further drag the draggable time slider 2501 to any desired position on the time slider to review the animated programmed operational state of the building during that time. In addition, the user may click on the previous button 2507 to review an animation of the programmed operational state throughout an immediately preceding time period. In the example shown in FIG. 25, pressing the previous button 2507 will display an animation for Jul. 7, 2016. Similarly, the user may click on the next button 2508 to review an animation of the programmed operational state throughout an immediately succeeding time period, for example Jul. 9, 2016.

INDUSTRIAL APPLICABILITY

To solve the aforementioned problems, the aspects of the embodiments are directed towards systems, methods, and modes for rendering three-dimensional building visualization for commissioning, monitoring, and control of a building management system. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

In addition, the above disclosed methods are not meant to limit the aspects of the embodiments, or to suggest that the aspects of the embodiments should be implemented following the aforementioned methods. The purpose of the aforementioned methods is to facilitate the understanding of one or more aspects of the embodiments and to provide the reader with one or many possible implementations of the processed discussed herein. It should be understood by one of ordinary skill in the art that the steps of the aforementioned methods may be performed in a different order and that some steps may be eliminated or substituted.

All United States patents and applications, foreign patents, and publications discussed above are hereby incorporated herein by reference in their entireties.

ALTERNATE EMBODIMENTS

Alternate embodiments may be devised without departing from the spirit or the scope of the different aspects of the embodiments.

What is claimed is:

1. A method for rendering a three-dimensional building management system visualization of a building, the method comprising:
    storing geometry elements and spatial elements, wherein the geometry elements define three-dimensional geometrical representation of a building's structure, wherein the spatial elements define three-dimensional representation of spaces in the building, wherein the geometry elements are mapped to spatial elements, wherein the spatial elements are associated with respective space nodes that identify the spaces located within the building, wherein the space nodes are associated with respective electronic devices installed within the spaces in the building;
    receiving a selection of a status-attribute view from a list of status-attribute views, wherein the list of status-attribute views comprises an electronic device on status-attribute view comprising logic including:
        a first object property configured for indicating that an electronic device is turned on,
        a second object property configured for indicating that an electronic device is off,
        a third object property configured for indicating that an electronic device in an occupied space is on, and
        a fourth object property configured for indicating that an electronic device in a vacant space is on;
    storing logic for each status-attribute view, wherein the logic defines one or more object properties each corresponding to a status level and configured for modifying an appearance of a spatial element;
    receiving status information of at least one electronic device;
    filtering the received status information to select a subset of status information that corresponds to the selected status-attribute view;
    determining status levels of respective space nodes based on the subset of status information;
    determining object properties that apply to the determined status levels using the logic;

applying the determined object properties to respective spatial elements associated with the space nodes; and
rendering a three dimensional building visualization of the building for the selected status-attribute view via a user interface.

2. The method of claim 1, wherein the one or more object properties comprise at least one of the spatial element's fill, volume, face, outline, shadow, color, pattern, pattern color, transparency, outline thickness, outline pattern, or any combinations thereof.

3. The method of claim 1, wherein a default object property is applied to spatial elements for which status information of associated nodes is unknown, unavailable, or inapplicable.

4. The method of claim 1, wherein the logic of at least one status-attribute view comprises a first object property that indicates a first status-attribute and a second object property that indicates a second status-attribute.

5. The method of claim 1, wherein the status information comprises real-time status information received from the at least one electronic device.

6. The method of claim 1, wherein the status information comprises historic status information received from a database.

7. The method of claim 6, wherein the user interface comprises a time input field configured for allowing a user to select a time, wherein the historic status information is timestamped such that it can be recalled using the selected time.

8. The method of claim 7, wherein the selected time comprises at least one of a particular date, a particular time, a date range, a time range, a time period, a day, a portion of a day, a week, a month, and a year.

9. The method of claim 7, wherein when the user chooses to review historic information for a time period, the status level is determined by determining average status levels of the space nodes occurring within the selected time period.

10. The method of claim 7, wherein when the user chooses to review historic information for a time period, the method further comprising:
displaying an animation of a historic state of the building that shows status levels of the space nodes throughout the selected time period.

11. The method of claim 1, where in the user interface comprises a legend configured for defining for the user the status levels indicated by the rendered object properties.

12. The method of claim 1, wherein the list of status-attribute views comprises an error alerts status-attribute view configured for indicating spaces with electronic devices reporting errors, wherein the error alerts status-attribute view comprises logic including a table that correlates colors to the type of error alerts and organizes error alerts by severity.

13. The method of claim 1, wherein the list of status-attribute views comprises an online status-attribute view configured for indicating online status of electronic devices.

14. The method of claim 1, wherein the list of status-attribute views comprises a help requests status-attribute view configured for indicating status of one or more help requests.

15. The method of claim 1, wherein the list of status-attribute views comprises an occupancy status-attribute view configured for indicating occupancy status of the spaces in the building, wherein the occupancy status-attribute view comprises logic including a first object property indicating that a space is occupied, and a second object property indicating that a space is vacant.

16. The method of claim 1, wherein the list of status-attribute views comprises a reserved spaces status-attribute view configured for indicating whether a space is reserved.

17. The method of claim 16, wherein the reserved spaces status-attribute view comprises logic including a first object property indicating that a space is reserved, and a second object property indicating that a space is vacant.

18. The method of claim 16, wherein the reserved spaces status-attribute view logic further comprises a third object property indicating that a space is unreserved and occupied, and a fourth object property indicating that a space is reserved and vacant.

19. The method of claim 1, wherein the list of status-attribute views comprises an electronic device usage status-attribute view comprising logic including object properties indicating a duration the electronic device has been turned on.

20. The method of claim 1, wherein the list of status-attribute views comprises a light level status-attribute view comprising logic including a light level color gradient indicating in which spaces lights are turned on and an intensity of the turned on lights.

21. The method of claim 20, wherein the status information comprises light level values of lighting loads associated with the space nodes, wherein the status level is determined for each space node by calculating a weighted light level average using the received light level values, wherein each position on the light level color gradient corresponds to a particular color and a percentage value, wherein the object property is determined by determining a color in the light level color gradient corresponding to the calculated weighted light level average.

22. The method of claim 20, wherein the light level color gradient comprises a gradient of a single hue or color with luminosity or brightness ranging from dark to bright to indicate a light level percentage in a space.

23. The method of claim 1, wherein the list of status-attribute views comprises a daylight level status-attribute view comprising logic including a color gradient configured for indicating a daylight level of a space.

24. The method of claim 1, wherein the list of status-attribute views comprises a daylight harvesting status-attribute view comprising logic including a color gradient configured for indicating how much energy is saved in a space due to daylight harvesting.

25. The method of claim 1, wherein the list of status-attribute views comprises a space utilization status-attribute view comprising logic including a color gradient configured for indicating a length of time a space is utilized.

26. The method of claim 25, wherein for each space node the status level is determined by:
storing count of minutes a plurality of spaces in the building are utilized;
determining a percentage a space is utilized by comparing a utilization minutes count of the space to a total utilization minutes count of the plurality of spaces in the building.

27. The method of claim 1, further comprising:
creating at least one programmed scheduled event for the at least one electronic device comprising programming rules;
receiving a selection of a fast forward view configured for providing a simulation of a programmed operational state of the building;
wherein the received status information comprises the programming rules;

wherein the determined status levels comprise programmed operational states of the space nodes.

28. The method of claim 27, wherein the list of status-attribute views comprises a conflict status-attribute view configured for indicating any conflicts or errors in the programming rules of a space.

29. The method of claim 27, wherein at least one object property in the fast forward view is configured for displaying expected occupancy of a space during a selected period of time based on occupancy pattern recognition.

30. The method of claim 27, wherein the user interface comprises a time input field configured for allowing a user to select a time period, wherein the method further comprising:
   displaying an animation of a programmed operational state of at least one space node throughout the selected time period.

31. The method of claim 30, wherein during the displayed animation the three dimensional building visualization is re-rendered when a programmed operational state of the building changes by changing the object properties of the respective spatial elements.

32. The method of claim 30, wherein the user interface comprises a draggable time slider configured for allowing the user to navigate to a programmed operational state of the building during a particular time within the selected time period.

33. The method of claim 30, wherein the user interface comprises a previous time period selection which upon being selected configured to display an animation of a programmed operational state of at least one space node throughout a time period immediately preceding the selected time period.

34. The method of claim 30, wherein the user interface comprises a next time period selection which upon being selected configured to display an animation of a programmed operational state of at least one space node throughout a time period immediately succeeding the selected time period.

35. The system of claim 1, wherein the database is configured for storing a geometry data file comprising the geometry elements and a separate spatial data file comprising the spatial elements; and wherein the at least one processor is configured for selectively recalling the geometry data file and the spatial data file from the database.

36. A method for rendering a three-dimensional building management system visualization of a building, the method comprising:
   storing geometry elements and spatial elements, wherein the geometry elements define three-dimensional geometrical representation of a building's structure, wherein the spatial elements define three-dimensional representation of spaces in the building, wherein the geometry elements are mapped to spatial elements, wherein the spatial elements are associated with respective space nodes that identify the spaces located within the building, wherein the space nodes are associated with respective electronic devices installed within the spaces in the building;
   receiving a selection of a status-attribute view from a list of status-attribute views, wherein the list of status-attribute views comprises a light level status-attribute view comprising logic including a light level color gradient indicating in which spaces lights are turned on and an intensity of the turned on lights, wherein each position on the light level color gradient corresponds to a particular color and a percentage value;
   storing logic for each status-attribute view, wherein the logic defines one or more object properties each corresponding to a status level and configured for modifying an appearance of a spatial element;
   receiving status information of at least one electronic device, wherein the status information comprises light level values of lighting loads associated with the space nodes;
   filtering the received status information to select a subset of status information that corresponds to the selected status-attribute view;
   determining status levels of respective space nodes based on the subset of status information, wherein for each space node at least one status level is determined by calculating a weighted light level average using the received light level values;
   determining object properties that apply to the determined status levels using the logic, wherein at least one object property is determined by determining a color in the light level color gradient corresponding to the calculated weighted light level average;
   applying the determined object properties to respective spatial elements associated with respective space nodes; and
   rendering a three dimensional building visualization of the building for the selected status-attribute view via a user interface.

37. A method for rendering a three-dimensional building management system visualization of a building, the method comprising:
   storing geometry elements and spatial elements, wherein the geometry elements define three-dimensional geometrical representation of a building's structure, wherein the spatial elements define three-dimensional representation of spaces in the building, wherein the geometry elements are mapped to spatial elements, wherein the spatial elements are associated with respective space nodes that identify the spaces located within the building, wherein the space nodes are associated with respective electronic devices installed within the spaces in the building;
   creating at least one programmed scheduled event for at least one electronic device comprising programming rules;
   receiving a selection of a fast forward view configured for providing a simulation of a programmed operational state of the building;
   receiving a selection of a status-attribute view from a list of status-attribute views;
   storing logic for each status-attribute view, wherein the logic defines one or more object properties each corresponding to a status levels and configured for modifying an appearance of a spatial element;
   receiving status information of at least one electronic device, wherein the received status information comprises the programming rules;
   filtering the received status information to select a subset of status information that corresponds to the selected status-attribute view;
   determining status levels of respective space nodes based on the subset of status information, wherein the determined status levels comprise programmed operational states of the space nodes;
   determining object properties that apply to the determined status levels using the logic;
   applying the determined object properties to respective spatial elements associated with the space nodes; and rendering a three dimensional building visualization of the building for the selected status-attribute view via a user interface.

38. A method for rendering a three-dimensional building management system visualization of a building, the method comprising:
storing geometry elements and spatial elements, wherein the geometry elements define three-dimensional geometrical representation of a building's structure, wherein the spatial elements define three-dimensional representation of spaces in the building, wherein the geometry elements are mapped to spatial elements, wherein the spatial elements are associated with respective space nodes that identify the spaces located within the building, wherein the space nodes are associated with respective electronic devices installed within the spaces in the building;
receiving a selection of a status-attribute view from a list of status-attribute views, wherein the list of status-attribute views comprises a space utilization status-attribute view comprising logic including a color gradient configured for indicating a length of time a space is utilized;
storing logic for each status-attribute view, wherein the logic defines one or more object properties each corresponding to a status levels and configured for modifying an appearance of a spatial element;
receiving status information of at least one electronic device;
filtering the received status information to select a subset of status information that corresponds to the selected status-attribute view;
determining status levels of respective space nodes based on the subset of status information, wherein for each space node at least one status level is determined by:
storing count of minutes a plurality of spaces in the building are utilized, and
determining a percentage a space is utilized by comparing a utilization minutes count of the space to a total utilization minutes count of the plurality of spaces in the building;
determining object properties that apply to the determined status level using the logic;
applying the determined object properties to respective spatial elements associated with the space nodes; and
rendering a three dimensional building visualization of the building for the selected status-attribute view via a user interface.

* * * * *